(12) United States Patent
Yoon et al.

(10) Patent No.: US 12,356,697 B2
(45) Date of Patent: Jul. 8, 2025

(54) INTEGRATED CIRCUIT DEVICE AND METHOD OF MANUFACTURING THE SAME

(71) Applicant: Samsung Electronics Co., Ltd., Suwon-si (KR)

(72) Inventors: Changseop Yoon, Suwon-si (KR); Jong Shik Yoon, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 875 days.

(21) Appl. No.: 17/466,439

(22) Filed: Sep. 3, 2021

(65) Prior Publication Data

US 2022/0238689 A1   Jul. 28, 2022

(30) Foreign Application Priority Data

Jan. 26, 2021  (KR) .................. 10-2021-0011034

(51) Int. Cl.
*H10D 64/66*   (2025.01)
*H01L 23/522*   (2006.01)
(Continued)

(52) U.S. Cl.
CPC ....... *H10D 64/679* (2025.01); *H10D 30/6735* (2025.01); *H10D 30/6757* (2025.01);
(Continued)

(58) Field of Classification Search
CPC ......... H01L 29/4991; H01L 29/823864; H01L 29/42392; H10D 64/679; H10D 30/6735; H10D 84/0184
See application file for complete search history.

(56) References Cited

U.S. PATENT DOCUMENTS 7,696,046 B2 *  4/2010  Kim .................. H01L 29/78696
                                        257/E29.264
8,129,777 B2 *  3/2012  Kim .................. H01L 29/78696
                                        257/327
(Continued)

FOREIGN PATENT DOCUMENTS

TW        201227934 A      7/2012
TW        201428976 A      7/2014
(Continued)

OTHER PUBLICATIONS

Taiwanese Office Action dated May 13, 2024 issued in Taiwanese Patent Application No. 111100244.

*Primary Examiner* — Vincent Wall
(74) *Attorney, Agent, or Firm* — Harness, Dickey & Pierce, P.L.C.

(57) ABSTRACT

An integrated circuit device includes a fin-type active area extending in a first horizontal direction on a substrate, a channel area on the fin-type active area, a gate line surrounding the channel area on the fin-type active area and extending in a second horizontal direction crossing the first horizontal direction, an insulating spacer structure covering gate sidewalls of the gate line and channel sidewalls of the channel area, wherein the insulating spacer structure includes an air spacer having a first portion facing the gate sidewalls in the first horizontal direction and a second portion facing the channel sidewalls in the second horizontal direction.

19 Claims, 56 Drawing Sheets

(51) Int. Cl.
  *H10D 30/67* (2025.01)
  *H10D 62/10* (2025.01)
  *H10D 84/01* (2025.01)
  *H10D 84/03* (2025.01)
  *H10D 84/85* (2025.01)
(52) U.S. Cl.
  CPC ....... *H10D 84/0184* (2025.01); *H10D 84/038* (2025.01); *H10D 84/85* (2025.01); *H01L 23/5226* (2013.01); *H10D 62/118* (2025.01)

(56) References Cited

U.S. PATENT DOCUMENTS

| | | | | |
|---|---|---|---|---|
| 8,183,627 | B2* | 5/2012 | Currie | H01L 21/84 |
| | | | | 257/329 |
| 8,455,939 | B2 | 6/2013 | Alsmeier et al. | |
| 8,836,016 | B2* | 9/2014 | Wu | H01L 21/76224 |
| | | | | 257/E29.267 |
| 8,878,309 | B1* | 11/2014 | Hong | H01L 21/823481 |
| | | | | 257/330 |
| 8,901,607 | B2 | 12/2014 | Wang et al. | |
| 8,952,452 | B2 | 2/2015 | Kang et al. | |
| 9,362,355 | B1* | 6/2016 | Cheng | H01L 29/4991 |
| 10,026,840 | B2* | 7/2018 | More | H01L 27/092 |
| 10,128,334 | B1 | 11/2018 | Bourjot et al. | |
| 10,276,691 | B2* | 4/2019 | Yeong | H01L 21/26526 |
| 10,388,770 | B1* | 8/2019 | Xie | H01L 29/41775 |
| 10,497,628 | B2* | 12/2019 | Chu | H01L 21/823878 |
| 10,510,762 | B2* | 12/2019 | Chiou | H01L 29/66795 |
| 10,522,642 | B2* | 12/2019 | Lee | H01L 29/66583 |
| 10,553,696 | B2 | 2/2020 | Ando et al. | |
| 10,580,692 | B1 | 3/2020 | Park et al. | |
| 10,608,083 | B2 | 3/2020 | Cheng et al. | |
| 10,608,096 | B2 | 3/2020 | Cheng et al. | |
| 10,679,906 | B2 | 6/2020 | Cheng et al. | |
| 10,700,180 | B2 | 6/2020 | Chen et al. | |
| 10,879,379 | B2* | 12/2020 | Chung | H01L 29/66439 |
| 11,094,800 | B2 | 8/2021 | Son et al. | |
| 11,876,114 | B2* | 1/2024 | Xie | H01L 29/0653 |
| 2004/0155269 | A1* | 8/2004 | Yelehanka | H01L 21/76897 |
| | | | | 257/E21.507 |
| 2009/0072276 | A1* | 3/2009 | Inaba | H01L 29/7843 |
| | | | | 257/E21.409 |
| 2011/0133167 | A1* | 6/2011 | Bangsaruntip | B82Y 40/00 |
| | | | | 257/E21.415 |
| 2014/0167120 | A1* | 6/2014 | Chi | H01L 27/0886 |
| | | | | 257/288 |
| 2015/0054089 | A1* | 2/2015 | Hong | H01L 27/0924 |
| | | | | 257/401 |
| 2015/0243544 | A1* | 8/2015 | Alptekin | H01L 21/7682 |
| | | | | 438/586 |
| 2019/0157444 | A1* | 5/2019 | Yang | H01L 29/6681 |
| 2019/0334008 | A1 | 10/2019 | Chen et al. | |
| 2020/0027959 | A1* | 1/2020 | Cheng | B82Y 10/00 |
| 2020/0091345 | A1 | 3/2020 | Chiu et al. | |
| 2020/0098756 | A1* | 3/2020 | Lilak | H01L 21/823807 |
| 2020/0161439 | A1 | 5/2020 | You et al. | |
| 2020/0219989 | A1* | 7/2020 | Cheng | H01L 29/6656 |
| 2022/0238689 | A1* | 7/2022 | Yoon | H01L 29/0649 |

FOREIGN PATENT DOCUMENTS

TW  202036904 A  10/2020
TW  202044358 A  12/2020

* cited by examiner (II) X1 – X1'

(I)

(II)

(II) Y71 – Y71'

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2021-0011034, filed on Jan. 26, 2021, in the Korean Intellectual Property Office, the disclosure of which is incorporated by reference herein in its entirety.

BACKGROUND

The present disclosure relates to integrated circuit devices and/or methods of manufacturing the same, and more particularly, to integrated circuit devices including a field-effect transistor and/or methods of manufacturing the same.

In recent years, as down-scaling of integrated circuit devices is rapidly progressing, it is necessary to secure not only a fast operation speed but also an operation accuracy in an integrated circuit device. Accordingly, there is a need to develop a technology for an integrated circuit device capable of improving reliability by reducing an unwanted parasitic capacitance by reducing an area occupied by conductive areas within a relatively small area.

SUMMARY

The present disclosure provides integrated circuit devices capable of improving reliability by reducing undesired parasitic capacitance in an integrated circuit device having a device area of a reduced area due to down-scaling.

The present disclosure also provides methods of manufacturing an integrated circuit device capable of improving reliability by reducing undesired parasitic capacitance in an integrated circuit device having a device area of a reduced area due to down-scaling.

According to an example embodiment of the inventive concepts, an integrated circuit device may include a fin-type active area extending in a first horizontal direction on a substrate, a channel area on the fin-type active area, a gate line surrounding the channel area on the fin-type active area and extending in a second horizontal direction crossing the first horizontal direction, and an insulating spacer structure covering gate sidewalls of the gate line and channel sidewalls of the channel area, wherein the insulating spacer structure includes an air spacer having a first portion facing the gate sidewalls in the first horizontal direction and a second portion facing the channel sidewalls in the second horizontal direction.

According to an example embodiment of the inventive concepts, an integrated circuit device may include A first fin-type active area extending in a first horizontal direction in a first area on a substrate, the first fin-type active area having a first fin upper surface, a first nanosheet stack including a plurality of first nanosheets, the plurality of first nanosheets facing the first fin upper surface, the plurality of first nanosheets being at positions spaced apart from the first fin upper surface, respectively, in a vertical direction, the plurality of first nanosheets having different vertical distances from the first fin upper surface, respectively, a first gate line surrounding the plurality of first nanosheets on the first fin-type active area and extending in a second horizontal direction crossing the first horizontal direction in the first area, and a first insulating spacer structure covering the first gate line and the first nanosheet stack, wherein the first insulating spacer structure includes a first air spacer having a first portion facing a gate sidewall of the first gate line in the first horizontal direction and a second portion facing a sidewall of the first nano sheet stack in the second horizontal direction.

According to an example embodiment of the inventive concepts, an integrated circuit device may include a plurality of circuit areas stacked to overlap each other in a vertical direction on a substrate, wherein each of the plurality of circuit areas includes a fin-type active area extending in a first horizontal direction and having a fin upper surface, a nanosheet stack including a plurality of nano sheets, the plurality of nano sheets facing the fin upper surface, the plurality of nanosheets being at positions spaced apart from the fin upper surface, respectively, in the vertical direction, a gate line surrounding the plurality of nanosheets on the fin-type active area and extending in a second horizontal direction crossing the first horizontal direction, an insulating spacer structure covering the gate line and the nanosheet stack, the insulating spacer structure comprising an air spacer having a first portion facing a gate sidewall of the gate line in the first horizontal direction and a second portion facing a sidewall of the nanosheet stack in the second horizontal direction.

According to an example embodiment of the inventive concepts, a method of manufacturing an integrated circuit device may include forming a fin-type active area on a substrate, forming a device isolation film covering sidewalls of the fin-type active area, forming a nanosheet stack including a plurality of nanosheets such that the plurality of nanosheets face a fin upper surface of the fin-type active area and are at positions spaced apart from the fin upper surface of the fin-type active area, forming a preliminary spacer structure on the nanosheet stack and the device isolation film such that the preliminary spacer structure has a closed loop shape defining a gate space, and includes an inner insulating liner, a sacrificial liner, and an outer insulating liner sequentially disposed from the gate space, forming a gate dielectric film covering a surface of each of the plurality of nanosheets in the gate space, forming a gate line in the gate space such that the gate line surrounds the plurality of nanosheets on the gate dielectric film, and selectively removing the sacrificial liner from the preliminary spacer structure to form an air spacer including a first portion exposing an upper surface of the nanosheet stack on the fin-type active area and a second portion exposing sidewalls of at least some of the nanosheets on the device isolation film.

According to an example embodiment of the inventive concepts, a method of manufacturing an integrated circuit device may include forming a fin-type active area extending in a first horizontal direction on a substrate, a stacked structure of a plurality of sacrificial semiconductor layers and a plurality of nanosheets alternately stacked one by one on a fin upper surface of the fin-type active area, forming a device isolation film covering sidewalls of the fin-type active area, forming a dummy gate pattern on the stacked structure and the device isolation film and extending in a second horizontal direction crossing the first horizontal direction, forming a preliminary spacer structure surrounding the dummy gate pattern in a closed loop shape to cover first sidewalls of the dummy gate pattern in the first horizontal direction and second sidewalls in the second horizontal direction of the dummy gate pattern, the preliminary spacer structure including an inner insulating liner, a sacrificial liner, and an outer insulating liner sequentially covering the first and second sidewalls of the dummy gate pattern, forming a source/drain region on the fin-type active area at a position spaced apart from the dummy gate pattern with the preliminary spacer structure therebetween, forming an inter-gate insulating film covering the source/drain region, forming a gate space by removing the dummy gate pattern and the plurality of sacrificial semiconductor layers, forming a gate dielectric film and a gate line, the gate dielectric film covering a surface of each of the plurality of nanosheets in the gate space, and the gate line covering the gate dielectric film in the gate space, forming a source/drain contact connected to the source/drain region by penetrating the inter-gate insulating film in a vertical direction and facing the gate line in the first horizontal direction, forming an air spacer including a first portion between the gate line and the source/drain contact and a second portion exposing the plurality of nanosheets on the device isolation film by selectively removing the sacrificial liner from the preliminary spacer structure, and forming an interlayer insulating film covering the gate line and the source/drain contact and defining a top level of the air spacer.

According to an example embodiment of the inventive concepts, a method of manufacturing an integrated circuit device may include forming a first circuit area on a substrate, and forming a second circuit area overlapping the first circuit area in a vertical direction on the first circuit area, wherein each of the forming of the first circuit area and the forming of the second circuit area comprises forming a fin-type active area on the substrate, forming a device isolation film covering sidewalls of the fin-type active area, forming a nanosheet stack including a plurality of nanosheets, the plurality of nanosheets facing a fin upper surface at positions spaced apart from the fin upper surface of the fin-type active area, respectively, forming a preliminary spacer structure on the nanosheet stack and the device isolation film such that the preliminary spacer structure has a closed loop shape defining a gate space, and includes an inner insulating liner, a sacrificial liner, and an outer insulating liner sequentially disposed from the gate space, forming a gate dielectric film covering a surface of each of the plurality of nanosheets in the gate space, forming a gate line in the gate space such that the gate line surrounds the plurality of nanosheets on the gate dielectric film, and selectively removing the sacrificial liner from the preliminary spacer structure to form an air spacer including a first portion exposing an upper surface of the nanosheet stack on the fin-type active area and a second portion exposing sidewalls of at least some of the nanosheets on the device isolation film.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
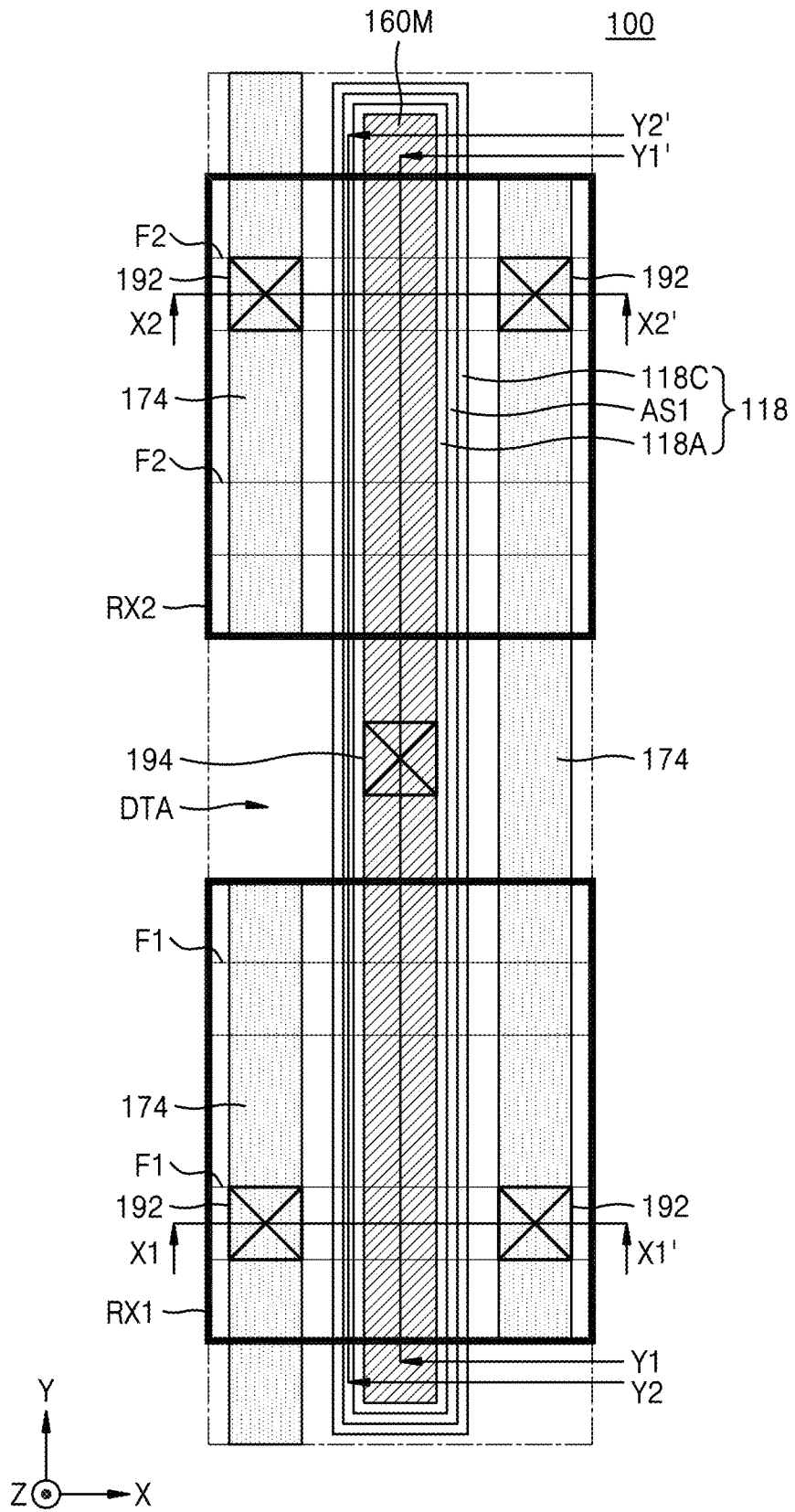
FIG. 1 is a plan layout diagram of some components of an integrated circuit device according to some example embodiments of the inventive concepts.

Hereinafter, some example embodiments of the inventive concepts will be described in detail with reference to the accompanying drawings. The same reference numerals are used for the same components in the drawings, and duplicate descriptions thereof are omitted.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2A:
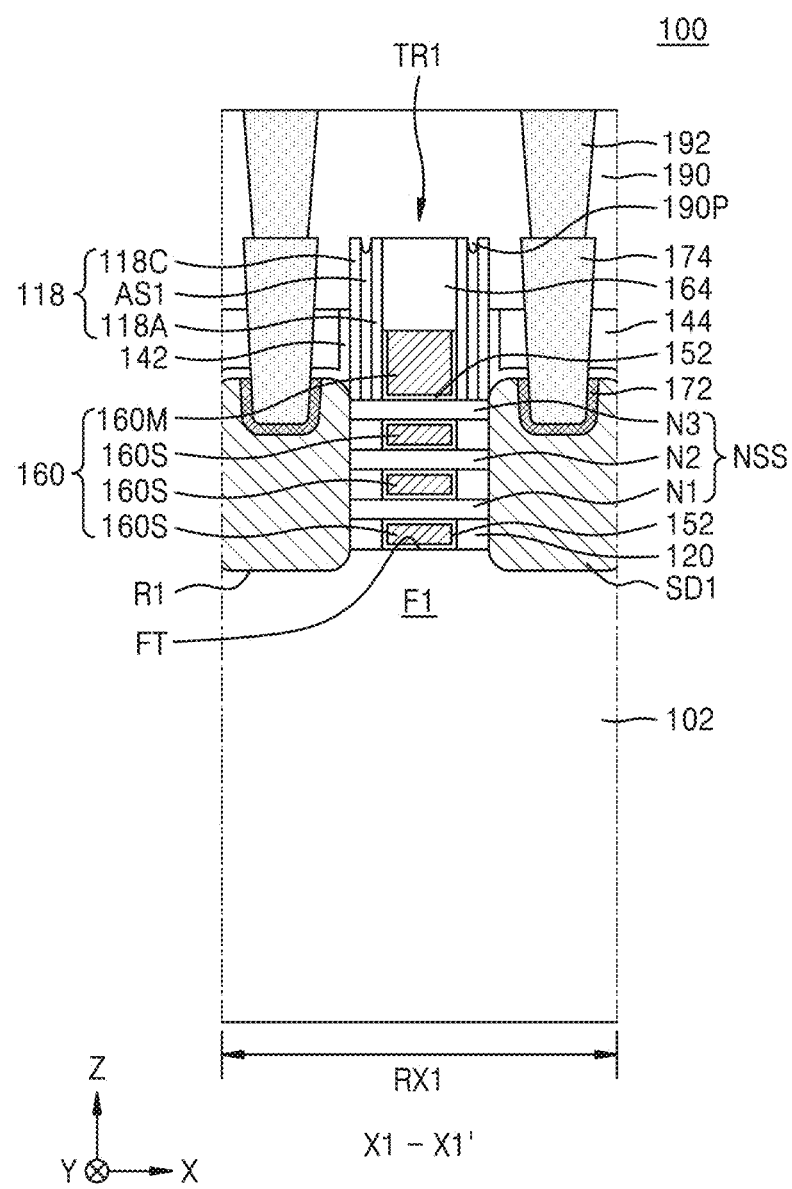
FIG. 2A is a cross-sectional view showing a partial configuration of a cross-section of the line X1-X1' of FIG. 1.
Figure 2B:
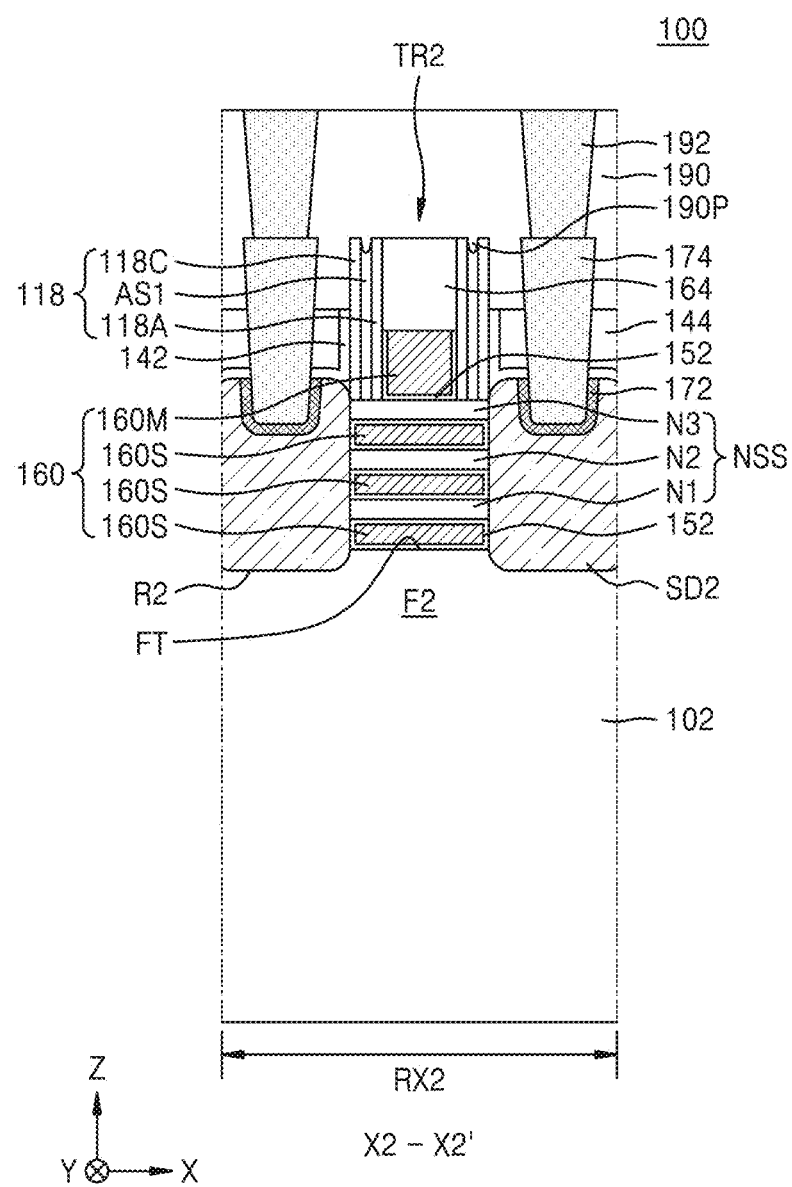
FIG. 2B is a cross-sectional view showing a partial configuration of a cross-sectional view taken along line X2-X2' of FIG. 1.
Figure 2C:
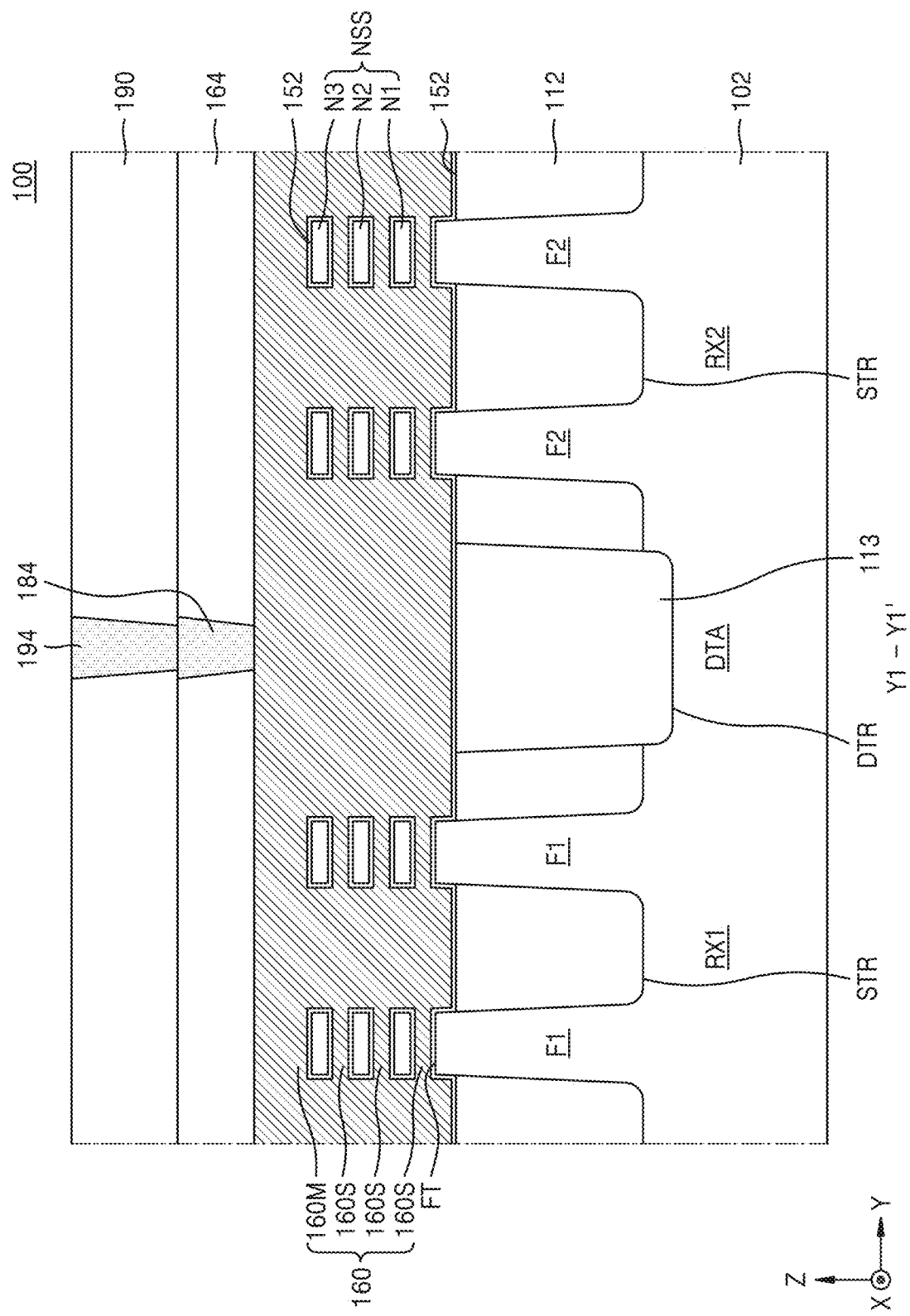
FIG. 2C is a cross-sectional view showing a partial configuration of a cross-sectional view taken along line Y1-Y1' of FIG. 1.
Figure 2D:
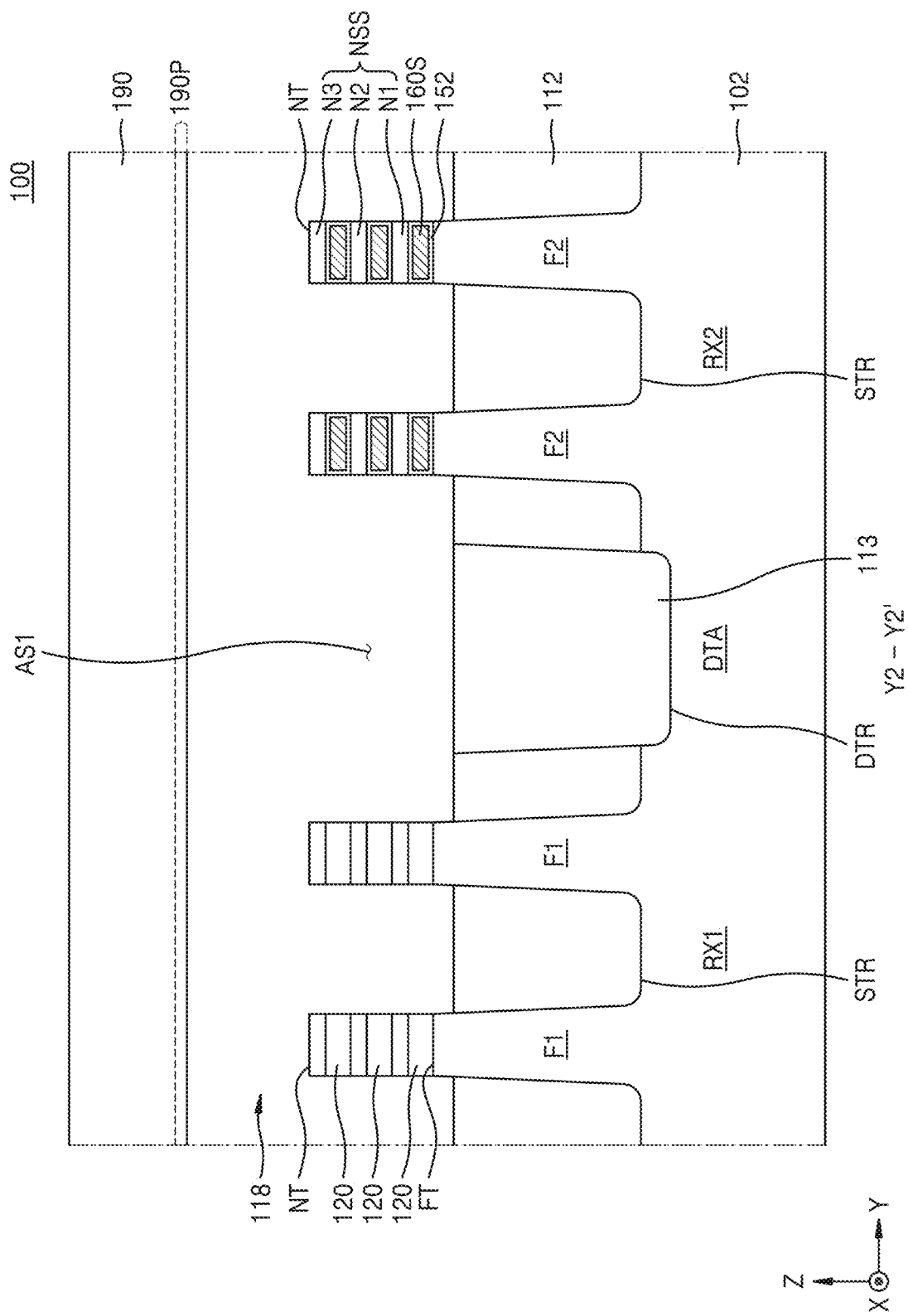
FIG. 2D is a cross-sectional view showing a partial configuration of a cross-sectional view taken along line Y2-Y2' of FIG. 1.

FIG. 1 is a plan layout diagram of some components of an integrated circuit device 100 according to some example embodiments of the inventive concepts. FIG. 2A is a cross-sectional view showing a partial configuration of a cross-section of the line X1-X1' of FIG. 1, FIG. 2B is a cross-sectional view showing a partial configuration of a cross-section taken along line X2-X2' of FIG. 1, FIG. 2C is a cross-sectional view showing a partial configuration of a cross-section taken along line Y1-Y1' of FIG. 1, and FIG. 2D is a cross-sectional view showing a partial configuration of a cross-section taken along line Y2-Y2' of FIG. 1.

Referring to FIGS. 1 and 2A to 2D, the integrated circuit device 100 includes a substrate 102 including a first device area RX1 and a second device area RX2, and an inter-device isolation area DTA therebetween. A deep trench DTR may be formed in the substrate 102 in the inter-device isolation area DTA. The first device area RX1 and the second device area RX2 may be defined by the deep trench DTR.

The substrate 102 may include a semiconductor such as Si or Ge, or a compound semiconductor such as SiGe, SiC, GaAs, InAs, InGaAs, or InP. The terms "SiGe", "SiC", "GaAs", "InAs", "InGaAs", and "InP" as used in the present specification mean a material composed of elements included in each term, and are not a chemical formula representing a stoichiometric relationship. The substrate 102 may include a conductive region, for example, a well doped with an impurity, or a structure doped with an impurity.

In the first device area RX1 and the second device area RX2, a plurality of fin-type active areas F1 and F2 may protrude from the substrate 102 in a vertical direction (Z direction). The plurality of fin-type active areas F1 and F2 may extend parallel to each other in a first horizontal direction (X direction). The plurality of fin-type active areas F1 and F2 may be defined by device isolation trenches STR formed on the substrate 102 in the first device area RX1 and the second device area RX2, respectively. Specific examples of the constituent materials of each of the plurality of fin-type active areas F1 and F2 are as described above with respect to the constituent materials of the substrate 102.

The plurality of fin-type active areas F1 and F2 may include a plurality of first fin-type active areas F1 disposed in the first device area RX1, and a plurality of second fin-type active areas F2 disposed in the second device area RX2. Each of the plurality of fin-type active areas F1 and F2 may have a fin upper surface FT. In FIG. 1, two first fin-type active areas F1 disposed in a first device area RX1 and two second fin-type active areas F2 disposed in a second device area RX2 are shown as an example, and one or three or more fin-type active areas F1 and F2 may be disposed in the first device area RX1 and the second device area RX2, respectively.

On the plurality of fin-type active areas F1 and F2, a gate line 160 extends in a second horizontal direction (Y direction) crossing a first horizontal direction (X direction). FIG. 1 illustrates a configuration in which one gate line 160 is disposed on a plurality of fin-type active areas F1 and F2, and the number of gate lines 160 disposed on the plurality of fin-type active areas F1 and F2 is not particularly limited. For example, at least two gate lines 160 may be disposed on each of the plurality of fin-type active areas F1 and F2.

The device isolation trench STR in the first device area RX1 and the second device area RX2 may be filled with a device isolation film 112. The device isolation film 112 may be disposed between the substrate 102 and the gate line 160 and may cover sidewalls of each of the plurality of fin-type active areas F1 and F2.

The device isolation film 112 may include an oxide film, a nitride film, or a combination thereof. The device isolation film 112 may contact sidewalls of each of the plurality of fin-type active areas F1 and F2. The level of the upper surface of the device isolation film 112 may be equal to or lower than the level of the fin upper surface FT of each of the plurality of fin-type active areas F1 and F2. The term "level" as used in the present specification means a height in a vertical direction (Z direction or −Z direction) from the upper surface of the substrate 102.

An inter-device isolation insulating film 113 may be disposed between the substrate 102 and the gate line 160 in the inter-device isolation area DTA. The inter-device isolation insulating film 113 may fill the deep trench DTR. The inter-device isolation insulating film 113 may be apart from the plurality of fin-type active areas F1 and F2 in the second horizontal direction (Y direction) with the device isolation film 112 therebetween. The inter-device isolation insulating film 113 may include an oxide film, a nitride film, or a combination thereof.

The gate line 160 may extend in a second horizontal direction (Y direction) on the plurality of fin-type active areas F1 and F2, the device isolation film 112, and the inter-device isolation insulating film 113. In areas where the plurality of fin-type active areas F1 and F2 intersect with the gate line 160, a plurality of nano sheet stacks NSS may be disposed on the fin upper surface FT of each of the plurality of fin-type active areas F1 and F2. Each of the plurality of nanosheet stacks NSS may constitute a nanosheet channel area. The plurality of nanosheet stacks NSS may face the fin upper surface FT of each of the plurality of fin-type active areas F1 and F2 at positions spaced from the plurality of fin-type active areas F1 and F2 in a vertical direction (Z direction), respectively.

The plurality of nanosheet stacks NSS each may include a plurality of nanosheets N1, N2, and N3 overlapping each other in a vertical direction (Z direction) on the fin upper surface FT of the fin-type active areas F1 and F2. The term "nanosheet" as used in the present specification refers to a conductive structure having a cross-section substantially perpendicular to a direction in which an electric current flows. It should be understood that the nanosheets include nanowires. The plurality of nanosheets N1, N2, and N3 may have different vertical distances (Z-direction distances) from the fin upper surface FT.

The number of nanosheets in each of the nanosheet stacks NSS and gate lines 160 disposed on one fin-type active area F1 or F2 is not particularly limited. For example, one or a plurality of nanosheet stacks NSS and one or a plurality of gate lines 160 may be disposed on one fin-type active area F1 or F2.

FIGS. 2A to 2D illustrate a case in which a plurality of nanosheet stacks NSS each include three nanosheets N1, N2, and N3, and the number of nanosheets included in the nanosheet stack NSS is not particularly limited. For example, the plurality of nanosheet stacks NSS may each include one or more nanosheets. Each of the plurality of nanosheets N1, N2, and N3 may have a channel area.

In some example embodiments, each of the plurality of nanosheets N1, N2, and N3 may have a thickness selected within a range of about 4 nm to about 6 nm, but is not limited thereto. Here, the thickness of the plurality of nanosheets N1, N2, and N3 means a size in the vertical direction (Z direction). In some example embodiments, the plurality of nanosheets N1, N2, and N3 may have substantially the same thickness in a vertical direction (Z direction). In other some example embodiments, at least some of the plurality of nanosheets N1, N2, and N3 may have different thicknesses in a vertical direction (Z direction).

As illustrated in FIGS. 2A and 2B, the plurality of nanosheets N1, N2, and N3 included in one nanosheet stack NSS may each have the same size in the first horizontal direction (X direction). In some other example embodiments, at least some of the plurality of nanosheets N1, N2, and N3 included in one nanosheet stack NSS may have different sizes in the first horizontal direction (X direction). For example, the length of the nanosheets N1 and N2, which are relatively close to the fin upper surface FT among the plurality of nanosheets N1, N2, and N3 in the first horizontal direction (X direction), may be less or greater than the length of the nanosheet N3, which is farthest from the fin upper surface FT.

As illustrated in FIG. 2A, a plurality of first recesses R1 may be formed in the upper surface of the first fin-type active area F1 in the first device area RX1, and as illustrated in FIG. 2B, a plurality of second recesses R2 may be formed in an upper surface of the second fin-type active area F2 in the second device area RX2. It is shown as an example in FIGS. 2A and 2B that the level of the lowest surface of each of the plurality of first recesses R1 and the plurality of second recesses R2 is lower than the level of the fin upper surface FT of the plurality of fin-type active areas F1 and F2, but the inventive concepts are not limited thereto. The level of the lowest surface of each of the plurality of first recesses R1 and the plurality of second recesses R2 may be the same as or substantially similar to the level of the fin upper surface FT of each of the plurality of fin-type active areas F1 and F2.

As illustrated in FIGS. 2A and 2B, a plurality of first source/drain regions SD1 are formed on the plurality of first recesses R1 in the first device area RX1, and a plurality of second source/drain regions SD2 may be formed on the plurality of second recesses R2 in the second device area RX2.

The gate line 160 may surround each of the plurality of nanosheets N1, N2, and N3 while covering the plurality of nanosheet stacks NSS over the plurality of fin-type active areas F1 and F2. A plurality of transistors may be formed on the substrate 102 in portions where the plurality of fin-type active areas F1 and F2 and the gate line 160 cross each other. In some example embodiments, the first device area RX1 is an NMOS transistor area, and a plurality of NMOS transistors TR1 may be formed in portions where the first fin-type active area F1 and the gate line 160 cross each other in the first device area RX1. The second device area RX2 is a PMOS transistor area, and a plurality of PMOS transistors TR2 may be formed in portions where the second fin-type active area F2 and the gate line 160 cross each other in the second device area RX2.

The gate line 160 may include a main gate portion 160M and a plurality of sub gate portions 160S. The main gate portion 160M may cover the upper surface of the nanosheet stack NSS and extend in the second horizontal direction (Y direction). The plurality of sub-gate portions 160S are integrally connected to the main gate portion 160M, and may be disposed one by one between each of the plurality of nanosheets N1, N2, and N3, and between the fin-type active areas F1 and F2 and the lowermost nanosheet N1.

The gate line 160 may be formed of a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may be TiAlC. In some example embodiments, the gate line 160 may have a structure in which a metal nitride film, a metal film, a conductive capping film, and a gap-fill metal film are sequentially stacked. The metal nitride film and the metal film may include at least one metal selected from Ti, Ta, W, Ru, Nb, Mo, and Hf. The gap-fill metal film may be formed of a W film or an Al film. The plurality of gate lines 160 may include at least one work function metal-containing film. The at least one work function metal-containing film may include at least one metal selected from Ti, W, Ru, Nb, Mo, Hf, Ni, Co, Pt, Yb, Tb, Dy, Er, and Pd.

In some example embodiments, the gate line 160 has a stacked structure of a plurality of metal-containing films, and among the gate lines 160, a local area (e.g., a portion of the gate line 160) disposed in the first device area RX1 and a local area (e.g., a portion of the gate line 160) disposed in the second device area RX2 may have different stacked structures. For example, a local area disposed in the first device area RX1 and a local area disposed in the second device area RX2 of the gate line 160 may have different stacked structures selected from a stacked structure of TiAlC/TiN/W, a stacked structure of TiN/TaN/TiAlC/TiN/W, and a stacked structure of TiN/TaN/TiN/TiAlC/TiN/W, but the inventive concepts are not limited thereto.

A gate dielectric film 152 may be between the plurality of nanosheets N1, N2, and N3 and the gate line 160. The gate dielectric film 152 may include portions covering the surface of each of the plurality of nanosheets N1, N2, and N3, portions covering sidewalls of the main gate portion 160M, portions covering the fin upper surface FT of each of the plurality of fin-type active areas F1 and F2, portions covering the upper surface of the device isolation film 112, and portions covering an upper surface of the inter-device isolation insulating film 113.

In some example embodiments, the gate dielectric film 152 may include a high dielectric film. The high dielectric film may be made of a material having a higher dielectric constant than that of a silicon oxide film. For example, the high dielectric film may have a dielectric constant of about 10 to about 25. The high dielectric film may be made of hafnium oxide, but is not limited thereto.

The plurality of nanosheets N1, N2, and N3 may be formed of semiconductor layers made of the same elements. In one example, each of the plurality of nanosheets N1, N2, and N3 may include a Si layer. In the first device area RX1, the plurality of nanosheets N1, N2, and N3 may be doped with a dopant having the same conductivity type as that of the first source/drain region SD1. In the second device area RX2, the plurality of nanosheets N1, N2, and N3 may be doped with a dopant having the same conductivity type as that of the second source/drain region SD2. For example, the plurality of nanosheets N1, N2, and N3 may include a Si layer doped with an n-type dopant in the first device area RX1, and the plurality of nanosheets N1, N2, and N3 may include a Si layer doped with a p-type dopant in the second device area RX2.

Sidewalls (hereinafter, referred to as gate sidewalls) of the gate line 160 in the first device area RX1, the second device area RX2, and the inter-device isolation area DTA may cover an insulating spacer structure 118. As illustrated in FIG. 1, the insulating spacer structure 118 may surround the gate line 160 in a closed loop shape to face the gate sidewalls in a first horizontal direction (X direction) and a second horizontal direction (Y direction).

As illustrated in FIGS. 2A, 2B, and 2D, the insulating spacer structure 118 may cover the gate sidewalls of the gate line 160 on upper surfaces of the nanosheet stack NSS, the device isolation film 112, and the inter-device isolation insulating film 113, respectively. The insulating spacer structure 118 may cover both sidewalls of the main gate portion 160M in the first horizontal direction (X direction) on the upper surface of the plurality of nanosheet stacks NSS. The insulating spacer structure 118 may be spaced apart from the gate line 160 with the gate dielectric film 152 therebetween.

The insulating spacer structure 118 may cover both sidewalls of the plurality of nanosheet stacks NSS in the second horizontal direction (Y direction) on the device isolation film 112. Accordingly, both sidewalls of each of the plurality of nanosheets N1, N2, and N3 constituting the nanosheet channel area in the second horizontal direction (Y direction) may be covered with the insulating spacer structure 118.

The insulating spacer structure 118 may include an inner insulating liner 118A, an air spacer AS1, and an outer insulating liner 118C sequentially covering sidewalls of the gate line 160. The term "air" used in the present specification may refer to other gases that may exist in the atmosphere or may be introduced during a manufacturing process.

In some example embodiments, the inner insulating liner 118A, the air spacer AS1, and the outer insulating liner 118C may have the same widths in the first horizontal direction (X direction). In some other example embodiments, at least some of the inner insulating liner 118A, the air spacer AS1, and the outer insulating liner 118C may have different widths in the first horizontal direction (X direction).

The inner insulating liner 118A may face sidewalls of the gate line 160 with the gate dielectric film 152 therebetween. The outer insulating liner 118C may be spaced apart from the inner insulating liner 118A in a first horizontal direction (X direction) and a second horizontal direction (Y direction) with the air spacer AS1 therebetween. The inner insulating liner 118A and the outer insulating liner 118C may be formed of silicon nitride (SiN), SiCN, SiBN, SiON, SiOCN, SiBCN, or a combination thereof, respectively. The terms "SiN", "SiCN", "SiBN", "SiON", "SiOCN", and "SiBCN" as used in the present specification refer to a material composed of elements included in each term, and are not a chemical formula representing a stoichiometric relationship.

As illustrated in FIG. 1, the air spacer AS1 may surround the gate line 160 in a closed loop shape to face the sidewalls of the gate line 160 in the first horizontal direction (X direction) and the second horizontal direction (Y direction). As illustrated in FIGS. 1, 2A, and 2B, the air spacer AS1 may include portions facing both sidewalls of the gate line 160 in the first horizontal direction (X direction).

As illustrated in FIG. 2D, the air spacer AS1 may include portions facing both sidewalls of each of the plurality of nanosheets N1, N2, and N3 in the second horizontal direction (Y direction). The top surface NT of the nanosheet stack NSS, both sidewalls of each of the plurality of nanosheets N1, N2, and N3, and the upper surface of the device isolation film 112 may be exposed to the air spacer AS1.

As illustrated in FIGS. 2A and 2B, the plurality of first and second source/drain regions SD1 and SD2 each may not include a portion overlapping the main gate portion 160M of the gate line 160 and the insulating spacer structure 118 in the vertical direction (Z direction).

As illustrated in FIG. 2A, a plurality of inner insulating spacers 120 may be between each of the plurality of nanosheets N1, N2, and N3 in the first device area RX1, and between the fin upper surface FT of the first fin-type active area F1 and the lowermost nanosheet N1. The plurality of inner insulating spacers 120 may be between the plurality of sub-gate portions 160S and the first source/drain regions SD1 in the first horizontal direction (X direction).

As illustrated in FIG. 2D, in the first device area RX1, the plurality of inner insulating spacers 120 and the plurality of nanosheets N1, N2, and N3 may each have surfaces exposed to the air spacer AS1. Both sidewalls of each of the plurality of inner insulating spacers 120 may be exposed to the air spacer AS1 in the second horizontal direction (Y direction). In addition, both sidewalls of portions vertically overlapping the plurality of inner insulating spacers 120 among the plurality of nanosheets N1, N2, and N3 may be exposed to the air spacer AS1 in the second horizontal direction (Y direction).

As illustrated in FIG. 2A, in the first horizontal direction (X direction), both sidewalls of each of the plurality of sub-gate portions 160S in the first device area RX1 may be covered with inner insulating spacers 120 with the gate dielectric film 152 therebetween. The plurality of sub-gate portions 160S in the first device area RX1 may be spaced apart from the first source/drain region SD1 with the gate dielectric film 152 and the inner insulating spacer 120 therebetween. Each of the plurality of inner insulating spacers 120 may contact the first source/drain region SD1. At least a portion of the plurality of inner insulating spacers 120 may overlap the insulating spacer structure 118 in a vertical direction (Z direction).

The inner insulating spacer 120 may be formed of silicon nitride, silicon oxide, SiCN, SiBN, SiON, SiOCN, SiBCN, SiOC, or a combination thereof. The inner insulating spacer 120 may further include an air gap. In some example embodiments, the inner insulating spacer 120 may be made of the same material as at least one of the inner insulating liner 118A and the outer insulating liner 118C included in the insulating spacer structure 118. In some other example embodiments, the inner insulating spacer 120 may be made of a material different from a material constituting each of the inner insulating liner 118A and the outer insulating liner 118C included in the insulating spacer structure 118.

In the first horizontal direction (X direction), the plurality of first source/drain regions SD1 in the first device area RX1 may each face a plurality of sub-gate portions 160S with an inner insulating spacer 120 therebetween. The plurality of first source/drain regions SD1 may not include a portion in contact with the gate dielectric film 152.

As illustrated in FIG. 2B, both sidewalls of each of the plurality of sub-gate portions 160S in the second device area RX2 in the first horizontal direction (X direction) may be spaced apart from the second source/drain region SD2 with the gate dielectric film 152 therebetween. In the second device area RX2, the gate dielectric film 152 may include a portion in contact with the second source/drain region SD2. In the first horizontal direction (X direction), the plurality of second source/drain regions SD2 may respectively face the nanosheet stack NSS and the plurality of sub-gate portions 160S. In the second device area RX2, the gate dielectric film 152 may be between each of the plurality of nanosheets N1, N2, and N3, and between the second fin-type active area F2 and the lowermost nanosheet N1, and may include portions vertically overlapping with the plurality of nanosheets N1, N2, and N3.

As illustrated in FIG. 2D, in the second horizontal direction (Y direction), the gate dielectric film 152 and the plurality of nanosheets N1, N2, and N3 in the second device area RX2 may have surfaces exposed to the air spacer AS1.

As illustrated in FIGS. 2A to 2C, the gate line 160 and the gate dielectric film 152 may be covered with a capping insulating pattern 164. The capping insulating pattern 164 may include a silicon nitride layer.

In the first device area RX1, the main gate portion 160M of the gate line 160 may be spaced apart from the first source/drain region SD1 with the insulating spacer structure 118 therebetween. In the second device area RX2, the main gate portion 160M of the gate line 160 may be spaced apart from the second source/drain region SD2 with the insulating spacer structure 118 therebetween.

When the first device area RX1 is an NMOS transistor area and the second device area RX2 is a PMOS transistor area, the plurality of first source/drain regions SD1 in the first device area RX1 may include a Si layer doped with an n-type dopant or a SiC layer doped with an n-type dopant, and the plurality of second source/drain regions SD2 in the second device area RX2 may include a SiGe layer doped with a p-type dopant. The n-type dopant may be selected from phosphorus (P), arsenic (As), and antimony (Sb). The p-type dopant may be selected from boron (B) and gallium (Ga).

The plurality of first source/drain regions SD1 in the first device area RX1 and the plurality of second source/drain regions SD2 in the second device area RX2 may have different shapes and sizes. The shapes of the plurality of first and second source/drain regions SD1 and SD2 are not limited to those shown in FIGS. 2A and 2B, and a plurality of first and second source/drain regions SD1 and SD2 having various shapes and sizes may be formed in the first device area RX1 and the second device area RX2.

As illustrated in FIGS. 2A and 2B, the plurality of first and second source/drain regions SD1 and SD2 may be covered with an insulating liner 142. The insulating liner 142 may conformally cover a surface of each of the plurality of first and second source/drain regions SD1 and SD2 and a portion of a sidewall of the insulating spacer structure 118. The insulating liner 142 may be formed of silicon oxide, silicon nitride, SiCN, SiBN, SiON, SiOCN, SiBCN, SiOC, or a combination thereof. In some example embodiments, the insulating liner 142 may be omitted.

The first and second source/drain regions SD1 and SD2 in the first device area RX1 and the second device area RX2 may be covered with an inter-gate insulating film 144. The insulating liner 142 may be between the inter-gate insulating film 144 and the first and second source/drain regions SD1 and SD2. As illustrated in FIGS. 2A and 2B, the level of the upper surface of the inter-gate insulating film 144 may be lower than the level of the upper surface of the capping insulating pattern 164. The inter-gate insulating film 144 may be formed of silicon oxide, silicon nitride, SiON, SiOCN, or a combination thereof. In some example embodiments, the insulating liner 142 and the inter-gate insulating film 144 may include a silicon oxide layer.

The insulating spacer structure 118, the insulating liner 142, the inter-gate insulating film 144, and the plurality of capping insulating patterns 164 may be covered with an interlayer insulating film 190. The interlayer insulating film 190 may include an oxide layer, a nitride layer, an ultra low-k (ULK) layer having an ultra low dielectric constant K of about 2.2 to about 2.4, or a combination thereof. For example, the interlayer insulating film 190 may include a tetraethylorthosilicate (TEOS) film, a high density plasma (HDP) film, a boro-phospho-silicate glass (BPSG) film, a SiON film, a SiN film, a SiOC film, a SiCOH film, or a combination of.

In some example embodiments, the inter-gate insulating film 144 and the interlayer insulating film 190 each include an oxide film, but may have different densities. For example, the inter-gate insulating film 144 may include a silicon oxide film formed using a flowable chemical vapor deposition (FCVD) process or a spin coating process, and the interlayer insulating film 190 may include a silicon oxide film formed by a plasma deposition method. In this case, the density of the silicon oxide film constituting the interlayer insulating film 190 may be greater than the density of the silicon oxide film constituting the inter-gate insulating film 144.

The interlayer insulating film 190 may include a protruding insulating portion 190P protruding downward in a vertical direction (Z direction) toward the air spacer AS1 included in the insulating spacer structure 118. The lowest level of the protruding insulating portion 190P may be lower than the uppermost level of each of the inner insulating liner 118A and the outer insulating liner 118C included in the insulating spacer structure 118.

As illustrated in FIGS. 2A and 2B, a plurality of source/drain contacts 174 and a plurality of source/drain via contacts 192 may be formed on the plurality of first and second source/drain regions SD1 and SD2 in the first device area RX1 and the second device area RX2. The plurality of first and second source/drain regions SD1 and SD2 may be connected to an upper conductive line (not shown) through the plurality of source/drain contacts 174 and the plurality of source/drain via contacts 192.

A metal silicide film 172 may be formed between the first and second source/drain regions SD1 and SD2 and the source/drain contact 174. In some example embodiments, the metal silicide film 172 may include Ti, W, Ru, Nb, Mo, Hf, Ni, Co, Pt, Yb, Tb, Dy, Er, or Pd. For example, the metal silicide film 172 may be made of titanium silicide.

The plurality of source/drain contacts 174 may penetrate the inter-gate insulating film 144 and the insulating liner 142 in a vertical direction (Z direction) to contact the metal silicide film 172. The plurality of source/drain via contacts 192 may penetrate the interlayer insulating film 190 in a vertical direction (Z direction) to contact the upper surface of the source/drain contact 174. The metal silicide film 172 may be omitted. In this case, the plurality of source/drain contacts 174 may directly contact corresponding regions of the first and second source/drain regions SD1 and SD2, respectively.

As illustrated in FIG. 2C, a gate contact 184 and a gate via contact 194 may be formed on the gate line 160. The gate line 160 may be connected to an upper conductive line (not shown) through the gate contact 184 and the gate via contact 194.

The gate contact 184 and the gate via contact 194 may be disposed in the inter-device isolation area DTA and configured to be connected to the main gate portion 160M of the gate line 160. However, the inventive concepts are not limited thereto. For example, the gate contact 184 and the gate via contact 194 are disposed in at least one of a first device area RX1 or a second device area RX2, and may be configured to be connected to the main gate portion 160M of the gate line 160.

The gate contact 184 may penetrate the capping insulating pattern 164 in a vertical direction (Z direction) to contact the upper surface of the gate line 160. The gate via contact 194 may penetrate the interlayer insulating film 190 in a vertical direction (Z direction) to contact the upper surface of the gate contact 184.

In some example embodiments, the plurality of source/drain contacts 174, the gate contact 184, the plurality of source/drain via contacts 192, and the gate via contact 194 may each include a metal plug and a conductive barrier layer surrounding the metal plug. The metal plug may be made of W, Co, Cu, Ru, Mn, or a combination thereof, and the conductive barrier layer may be formed of Ti, Ta, TiN, TaN, or a combination thereof, but is not limited thereto.

In some example embodiments, sidewalls of each of the plurality of source/drain contacts 174, the gate contact 184, the plurality of source/drain via contacts 192, and the gate via contact 194 may be surrounded by a contact insulating spacer (not shown). The contact insulating spacer may be formed of silicon nitride, SiCN, SiCON, or a combination thereof, but is not limited thereto.

The integrated circuit device 100 illustrated in FIGS. 1 and 2A to 2D includes an insulating spacer structure 118 covering gate sidewalls of the gate line 160 on the upper surface of each of the nanosheet stack NSS, the device isolation film 112, and the inter-device isolation insulating film 113, and the insulating spacer structure 118 includes an air spacer AS1. Therefore, in each of the first device area RX1, the second device area RX2, and the inter-device isolation area DTA, it is possible to reduce the parasitic capacitance caused by coupling between a plurality of conductive regions disposed relatively adjacent, for example, between the gate line 160 and the plurality of source/drain contacts 174. Further, the insulating spacer structure 118 includes an air spacer AS1 at portions disposed on the nanosheet stack NSS, the device isolation film 112, and the inter-device isolation insulating film 113, respectively, so that parasitic capacitance generated by coupling between the plurality of fin-type active areas F1 and F2 and the gate line 160 may be reduced. Accordingly, the ON current characteristics and OFF current characteristics of each of the plurality of transistors formed in the first device area RX1 and the second device area RX2 are improved to contribute to improving the performance and reliability of transistors, and the reliability of the integrated circuit device 100 may be improved.

Figure 3A:
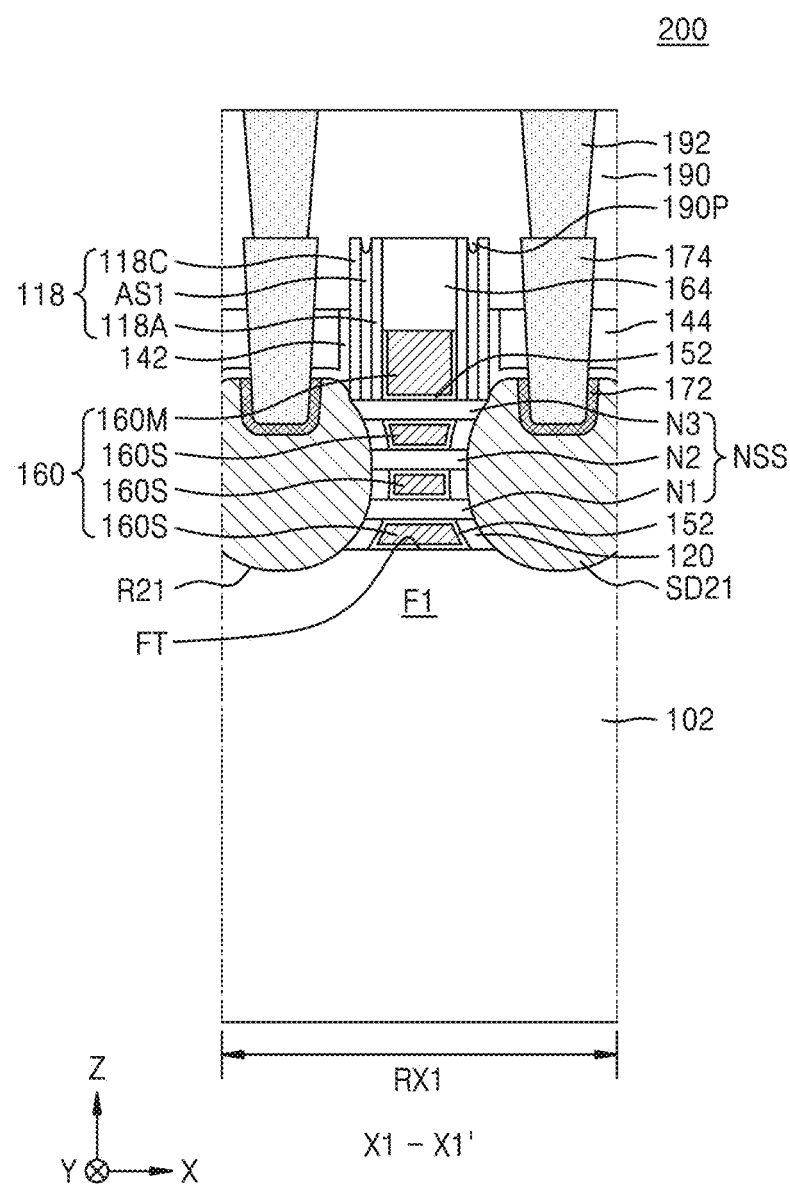
FIGS. 3A and 3B are cross-sectional views illustrating an integrated circuit device according to other example embodiments according to the inventive concepts.
Figure 3B:
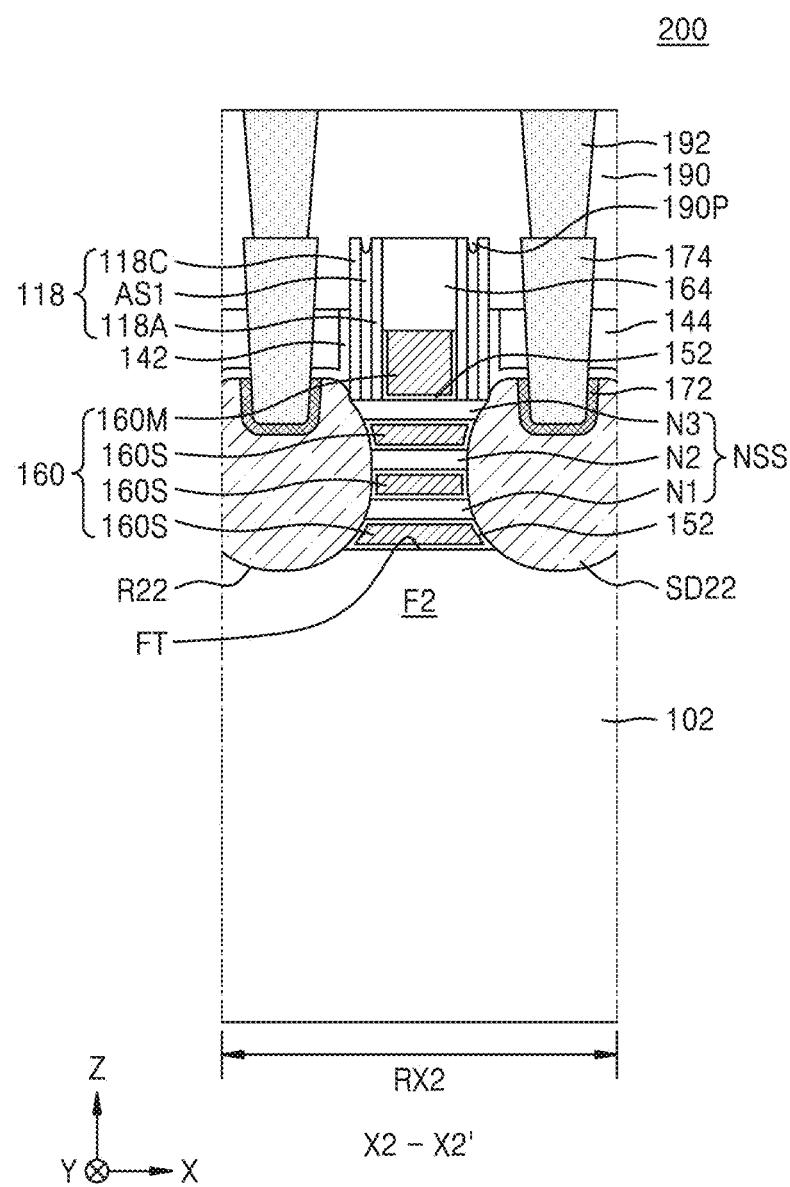

FIGS. 3A and 3B are cross-sectional views illustrating an integrated circuit device 200 according to other example embodiments according to the inventive concepts, and FIG. 3A is a cross-sectional view showing a partial configuration of a region corresponding to the cross-section of the line X1-X1' of FIG. 1, and FIG. 3B is a cross-sectional view showing a partial configuration of a region corresponding to a cross-section of the line X2-X2' of FIG. 1.

Referring to FIGS. 3A and 3B, the integrated circuit device 200 has substantially the same configuration as the integrated circuit device 100 described with reference to FIGS. 1 and 2A to 2D. However, the integrated circuit device 200 includes a plurality of first and second source/drain regions SD21 and SD22, instead of the plurality of first and second source/drain regions SD1 and SD2 illustrated with reference to FIGS. 2A and 2B.

A plurality of first source/drain regions SD21 may be formed on each of first recesses R21, and a plurality of second source/drain regions SD22 may be formed on each of second recesses R22. Unlike the plurality of first and second recesses R1 and R2 illustrated in FIGS. 2A and 2B, the plurality of first and second recesses R21 and R22 may have a width further extended in the first horizontal direction (X direction) to include a portion overlapping the insulating spacer structure 118 in the vertical direction (Z direction). Further, in the integrated circuit device 200, the plurality of nanosheets N1, N2, and N3 included in one nanosheet stack NSS may have different sizes in the first horizontal direction (X direction). Other detailed configurations of the first and second recesses R21 and R22 and the first and second source/drain regions SD21 and SD22 may be substantially the same as those described for the first and second recesses R1 and R2 and the first and second source/drain regions SD1 and SD2 with reference to FIGS. 2A and 2B.

Figure 4:
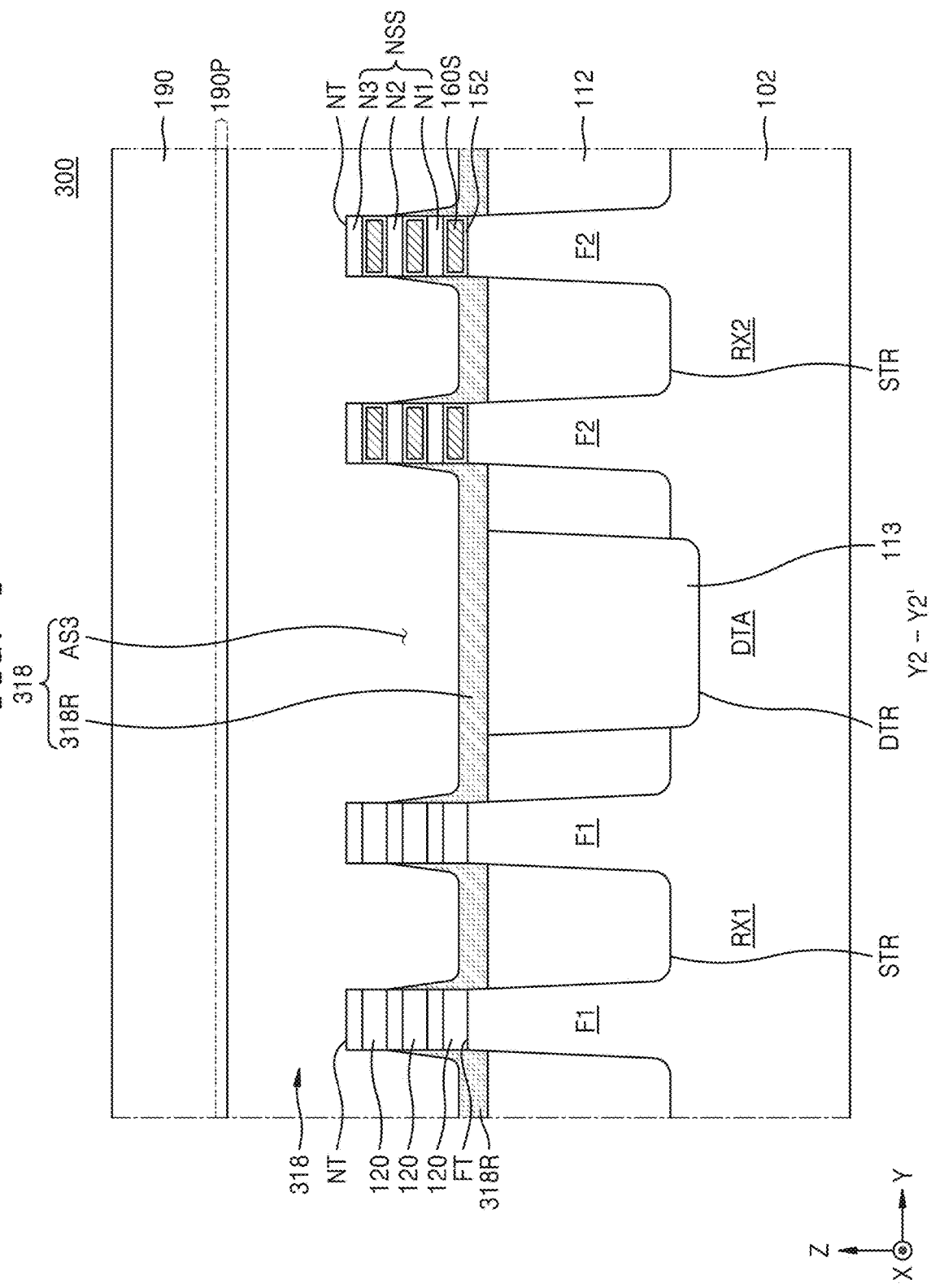
FIG. 4 is a cross-sectional view illustrating an integrated circuit device according to still other example embodiments of the inventive concepts.

FIG. 4 is a cross-sectional view illustrating an integrated circuit device 300 according to still other example embodiments according to the technical idea of the inventive concept. FIG. 4 illustrates a partial configuration of an area corresponding to a cross-section of the line Y2-Y2' of FIG. 1.

Referring to FIG. 4, the integrated circuit device 300 may have substantially the same configuration as the integrated circuit device 100 described with reference to FIGS. 1 and 2A to 2D. However, the integrated circuit device 300 includes an insulating spacer structure 318 instead of the insulating spacer structure 118 included in the integrated circuit device 100.

Similar to the description of the insulating spacer structure 118 with reference to FIGS. 1 and 2A, 2B, and 2D, the insulating spacer structure 318 may include an inner insulating liner 118A, an air spacer AS3, and an outer insulating liner 118C, which sequentially cover sidewalls of the gate line 160 (see FIGS. 1, 2A, and 2B). However, the insulating spacer structure 318 further includes a bottom insulating spacer 318R between the inner insulating liner 118A and the outer insulating liner 118C. The bottom insulating spacer 318R may be disposed in the first device area RX1 and the second device area RX2, and an inter-device isolation area DTA therebetween. The lower surface of the bottom insulating spacer 318R may have a surface in contact with the device isolation film 112 and a surface in contact with the inter-device isolation insulating film 113. The upper surface of the bottom insulating spacer 318R may extend non-linearly in the second horizontal direction (Y direction). In the first device area RX1, the second device area RX2, and the inter-device isolation area DTA, the upper surface of the bottom insulation spacer 318R may be exposed to the air spacer AS3.

In the first device area RX1 and the second device area RX2, the bottom insulating spacer 318R may include surfaces in contact with at least one of the plurality of nanosheets N1, N2, and N3 included in the nanosheet stack NSS. In the first device area RX1, the bottom insulating spacer 318R may have surfaces in contact with the plurality of inner insulating spacers 120. In the second device area RX2, the bottom insulating spacer 318R may have surfaces in contact with the gate dielectric film 152.

The air spacer AS3 may have substantially the same configuration as described for the air spacer AS1 with reference to FIGS. 2A, 2B, and 2D. However, the bottom level of the air spacer AS3 facing the substrate 102 may be limited by the bottom insulating spacer 318R. Accordingly, the device isolation film 112 and the inter-device isolation insulating film 113 may not be exposed to the air spacer AS3. In other example embodiments, unlike illustrated in FIG. 4, at least one upper surface of the device isolation film 112 or the inter-device isolation insulating film 113 may include a local area not covered by the bottom insulating spacer 318R, and exposed to the air spacer AS3.

Figure 5:
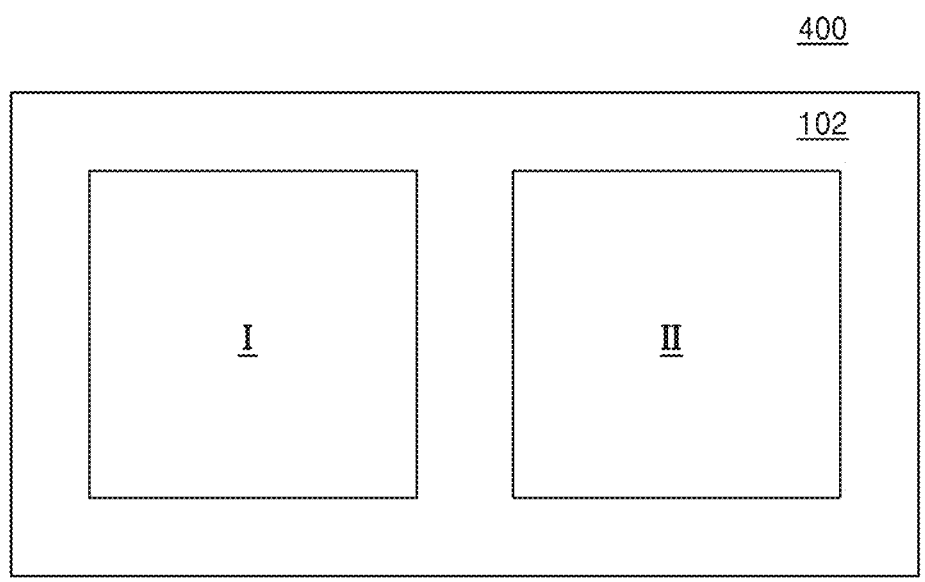
FIG. 5 is a block diagram of an integrated circuit device according to still other example embodiments according to the inventive concepts.

FIG. 5 is a block diagram of an integrated circuit device 400 according to still other example embodiments according to the inventive concepts.

Referring to FIG. 5, the integrated circuit device 400 includes a substrate 102 having a first area I and a second area II. The first area I and the second area II of the substrate 102 refer to different areas of the substrate 102, and the first area I and the second area II may be areas spaced apart from each other in a horizontal direction.

In some example embodiments, the first area I and the second area II may be areas performing different operations. In other example embodiments, the first area I and the second area II may be areas performing the same or similar operation to each other.

In some example embodiments, the first area I may be an area in which devices operating in a low power mode are formed, and the second area II may be an area in which devices operating in a high power mode are formed. In other example embodiments, the first area I may be an area in which a memory device or a non-memory device is formed, and the second area II may be an area in which a peripheral circuit such as an input/output device (I/O) is formed.

In some example embodiments, at least one of the first area I or the second area II may be an area constituting a volatile memory device such as Dynamic Random Access Memory (DRAM), Static RAM (SRAM), and the like, or a nonvolatile memory device such as Read Only Memory (ROM), Mask ROM (MROM), Programmable ROM (PROM), Erasable ROM (EPROM), Electrically Erasable ROM (EEPROM), Ferromagnetic ROM (FRAM), Phase change RAM (PRAM), Magnetic RAM (MRAM), Resistive RAM (RRAM), flash memory, and the like.

In other example embodiments, at least one of the first area I or the second area II may be an area in which a non-memory device such as a logic device is formed. The logic device may include standard cells that perform a desired logical function such as a counter and a buffer. The standard cell may include various types of logic cells including a plurality of circuit elements such as transistors and resistors. The logic cell may constitute, for example, AND, NAND, OR, NOR, exclusive OR (XOR), exclusive NOR (XNOR), inverter (INV), adder (ADD), buffer (BUF), delay (DLY), filter (FIL), multiplexer (MXT/MXIT), OR/AND/INVERTER (OAI), AND/OR (AO), AND/OR/INVERTER (AOI), D flip-flop, reset flip-flop, master-slaver flip-flop, latch, and the like.

In some example embodiments, in the integrated circuit device 400, the pattern formation density in the second area II may be less than the pattern formation density in the first area I.

In some example embodiments, any one of the first area I or the second area II may include at least one structure selected from the structures described for the integrated circuit devices 100, 200, and 300 with reference to FIGS. 1 to 4.

Figure 6A:
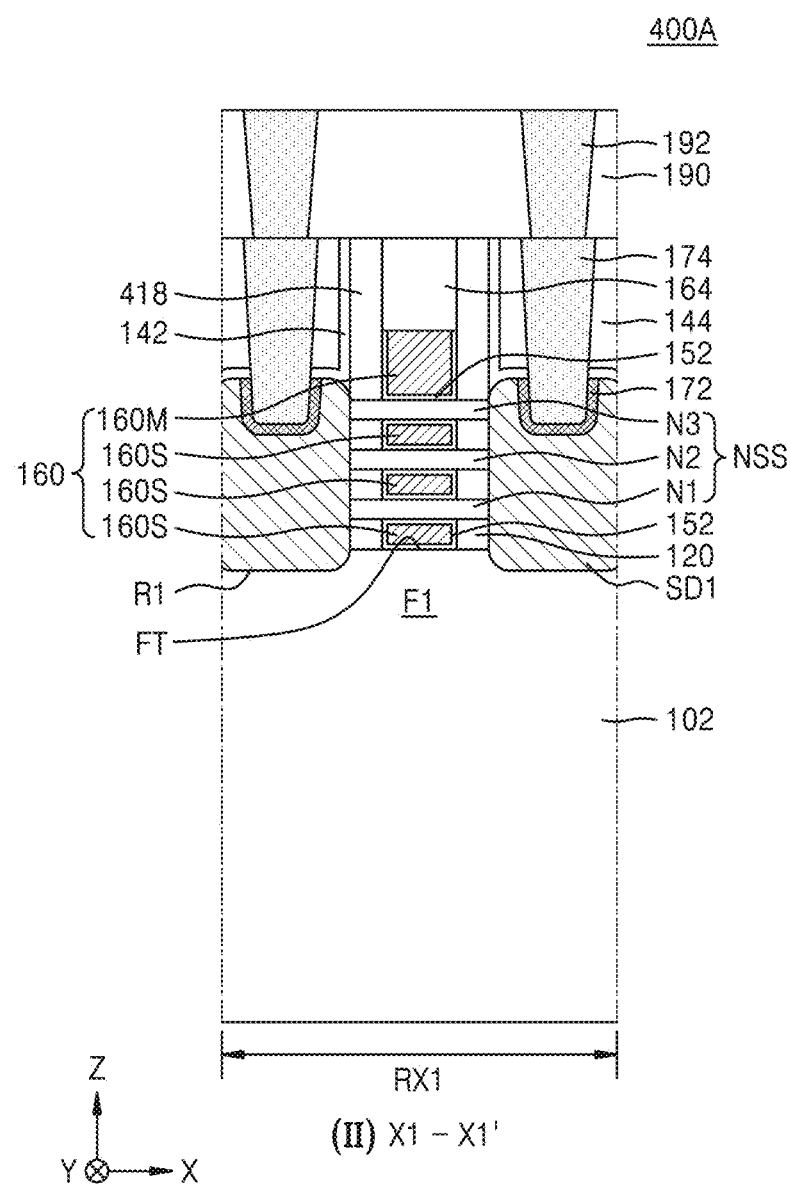
FIGS. 6A and 6B are cross-sectional views illustrating an integrated circuit device according to other example embodiments of the inventive concepts.
Figure 6B:
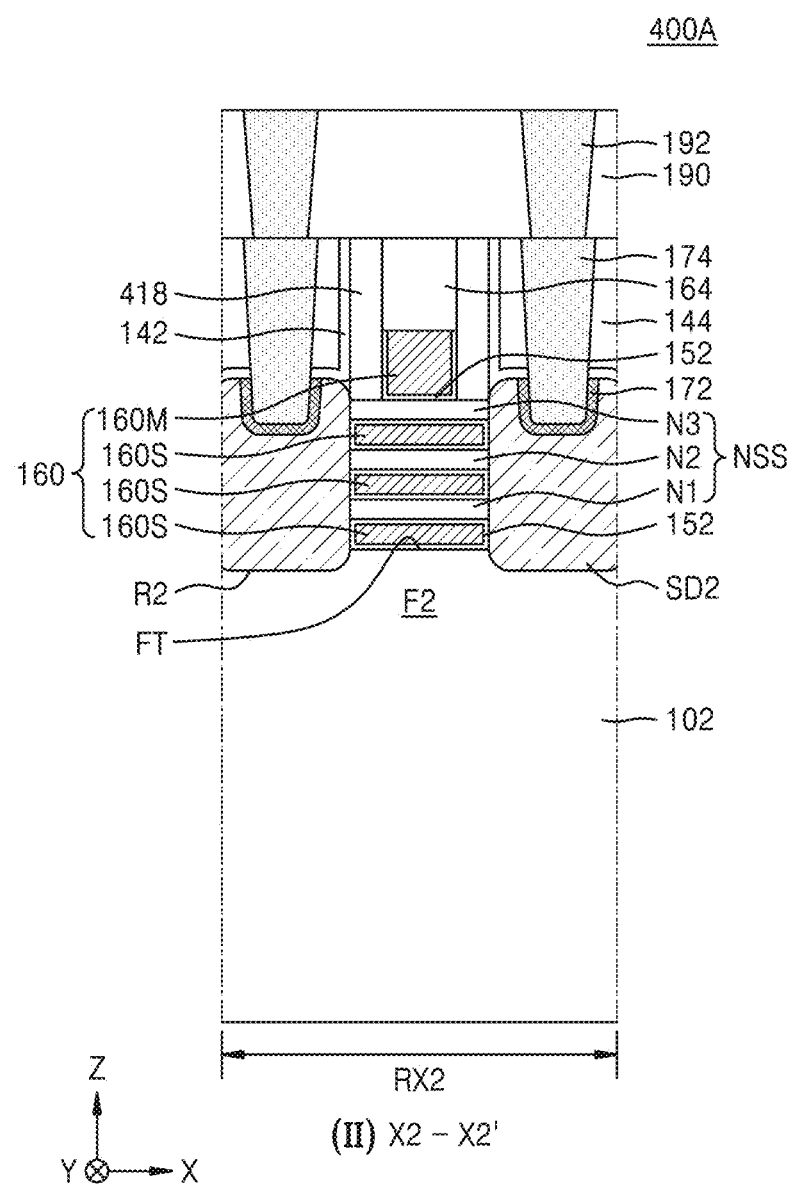

FIGS. 6A and 6B are cross-sectional views illustrating an integrated circuit device 400A according to still other example embodiments according to the inventive concepts, and FIG. 6A is a cross-sectional view showing a partial configuration of an area corresponding to the cross-section of the line X1-X1' of FIG. 1, and FIG. 6B is a cross-sectional view showing a partial configuration of an area corresponding to the cross-section of the line X2-X2' of FIG. 1.

The integrated circuit device 400A may include a substrate 102 having a first area I and a second area II as described with reference to FIG. 5. At least one structure selected from among the structures described for the integrated circuit devices 100, 200, and 300 may be disposed in the first area I of the integrated circuit device 400A with reference to FIGS. 1 to 4. The structure illustrated in FIGS. 6A and 6B may be disposed in the second area II of the integrated circuit device 400A.

Referring to FIGS. 6A and 6B, a structure substantially the same as that described for the integrated circuit device 100 with reference to FIGS. 2A to 2D may be disposed in the second area II of the integrated circuit device 400A. However, in the second area II of the integrated circuit device 400A, the insulating spacer structure 418 may be included instead of the insulating spacer structure 118 illustrated in FIGS. 1, 2A, 2B, and 2D.

The insulating spacer structure 418 may have a different structure from the insulating spacer structure 118. In some example embodiments, the insulating spacer structure 418 may not include an air spacer corresponding to the air spacer AS1 included in the insulating spacer structure 118.

The insulating spacer structure 418 may be formed of at least one silicon-containing insulating film covering sidewalls of the gate line 160. In some example embodiments, the at least one silicon-containing insulating film may be formed of silicon nitride, silicon oxide, SiCN, SiBN, SiON, SiOCN, SiBCN, or a combination thereof. For example, the insulating spacer structure 418 may include a multilayer including a first silicon nitride layer, a silicon oxide layer, and a second silicon nitride layer sequentially covering sidewalls of the gate line 160, but the inventive concepts are not limited thereto. Other detailed configurations of the insulating spacer structure 418 may be substantially the same as those described above for the insulating spacer structure 118 with reference to FIGS. 1, 2A, 2B, and 2D.

Figure 7A:
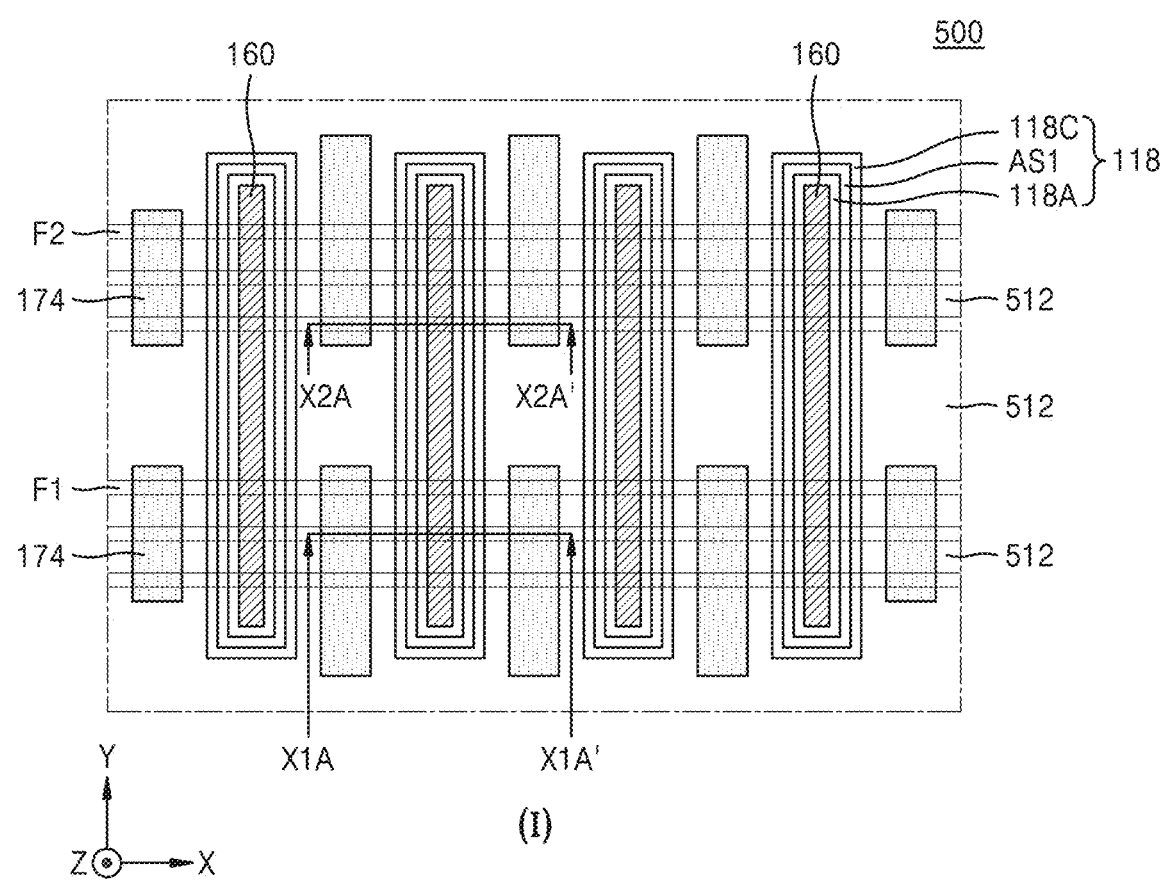
FIGS. 7A and 7B are plan layout diagrams for describing an integrated circuit device according to still other example embodiments of the inventive concept, respectively.
Figure 7B:
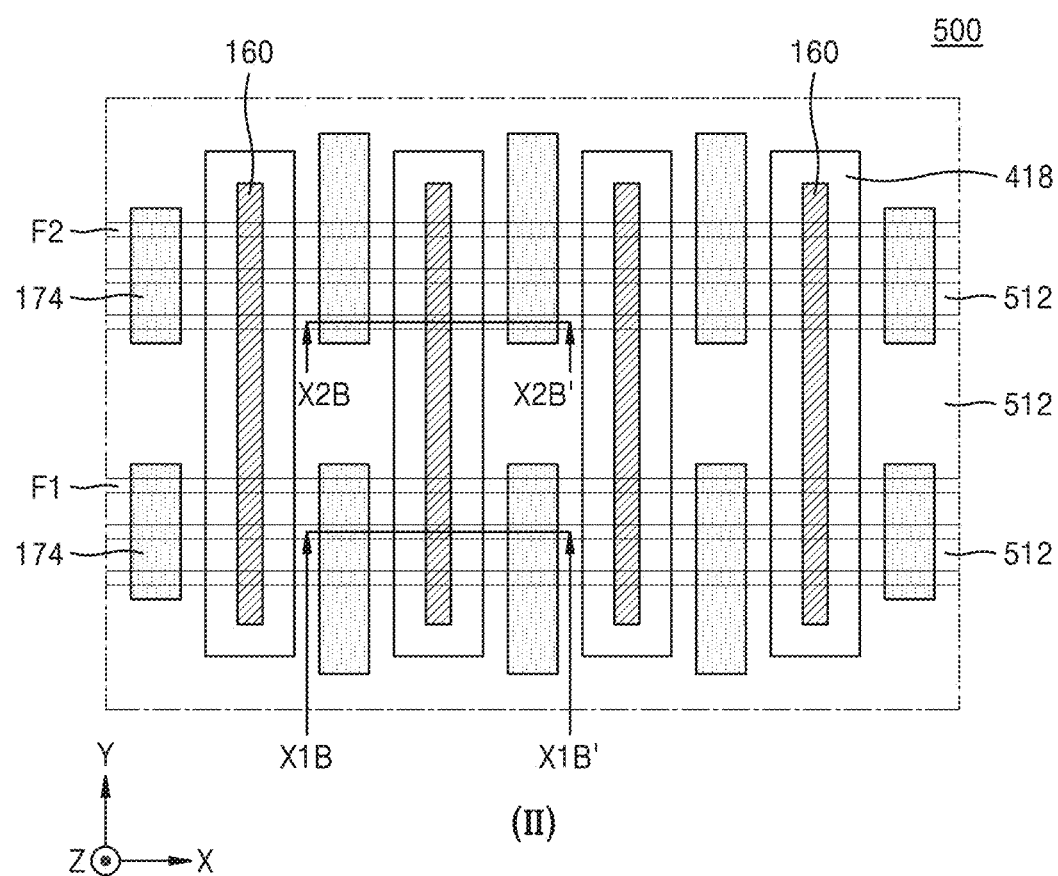

FIGS. 7A and 7B are plan layout diagrams for describing an integrated circuit device 500 according to still other example embodiments according to the inventive concepts, respectively.

Referring to FIGS. 7A and 7B, the integrated circuit device 500 may include a substrate 102 having a first area I and a second area II as described with reference to FIG. 5. FIG. 7A illustrates a configuration of the integrated circuit device 500 disposed in the first area I, and FIG. 7B illustrates a configuration of the integrated circuit device 500 disposed in the second area II.

In the first area I and the second area II of the integrated circuit device 500, each of the plurality of fin-type active areas F1 and F2 protrudes from the substrate 102 in the vertical direction (Z direction), and sidewalls of each of the plurality of fin-type active areas F1 and F2 may be covered with an insulating film 512. The insulating film 512 may have a configuration corresponding to a combined structure of the device isolation film 112 and the inter-device isolation insulating film 113 with reference to FIGS. 2C and 2D.

Although not shown in FIGS. 7A and 7B, a nanosheet stack NSS including a plurality of nanosheets N1, N2, and N3 described with reference to FIGS. 2A, 2B, and 2D may be disposed on the plurality of fin-type active areas F1 and F2.

A plurality of gate lines 160 may surround the plurality of nanosheets N1, N2, and N3 on the plurality of fin-type active areas F1 and F2, and extend in a second horizontal direction (Y direction).

Although not shown in FIGS. 7A and 7B, in the first area I and the second area II of the integrated circuit device 500, a plurality of first and second source/drain regions SD1 and SD2 as described with reference to FIGS. 2A and 2B may be disposed on the plurality of fin-type active areas F1 and F2.

The plurality of first and second source/drain regions SD1 and SD2 may be disposed one on both sides of each of the plurality of gate lines 160.

The integrated circuit device 500 may include a plurality of insulating spacer structures 118 surrounding the plurality of gate lines 160 in a closed loop shape in the first area I. The plurality of insulating spacer structures 118 may respectively cover sidewalls of the gate line 160 in the first horizontal direction (X direction) and the second horizontal direction (Y direction) in the first area I. Other detailed configurations of the insulating spacer structure 118 may be substantially the same as those described above with reference to FIGS. 1, 2A, 2B, and 2D.

The integrated circuit device 500 may include a plurality of insulating spacer structures 418 surrounding the plurality of gate lines 160 in a closed loop shape in the second area II. The plurality of insulating spacer structures 418 may respectively cover sidewalls of the gate line 160 in the first horizontal direction (X direction) and the second horizontal direction (Y direction) in the second area II. Other detailed configurations of the insulating spacer structure 418 may be substantially the same as those described above with reference to FIGS. 6A and 6B.

In some example embodiments, in the configuration of the first area I illustrated in FIG. 7A of the integrated circuit device 500, the configuration of the cross-section of the line X1A-X1A' may have the configuration as illustrated in FIG. 2A, and the configuration of the cross-section of the line X2A-X2A' may have a configuration as illustrated in FIG. 2B. Further, in the configuration of the second area II illustrated in FIG. 7B of the integrated circuit device 500, the configuration of the cross-section of the line X1B-X1B' may have the configuration as illustrated in FIG. 6A, and the configuration of the cross-section of the line X2B-X2B' may have the configuration as illustrated in FIG. 6B.

Figure 8A:
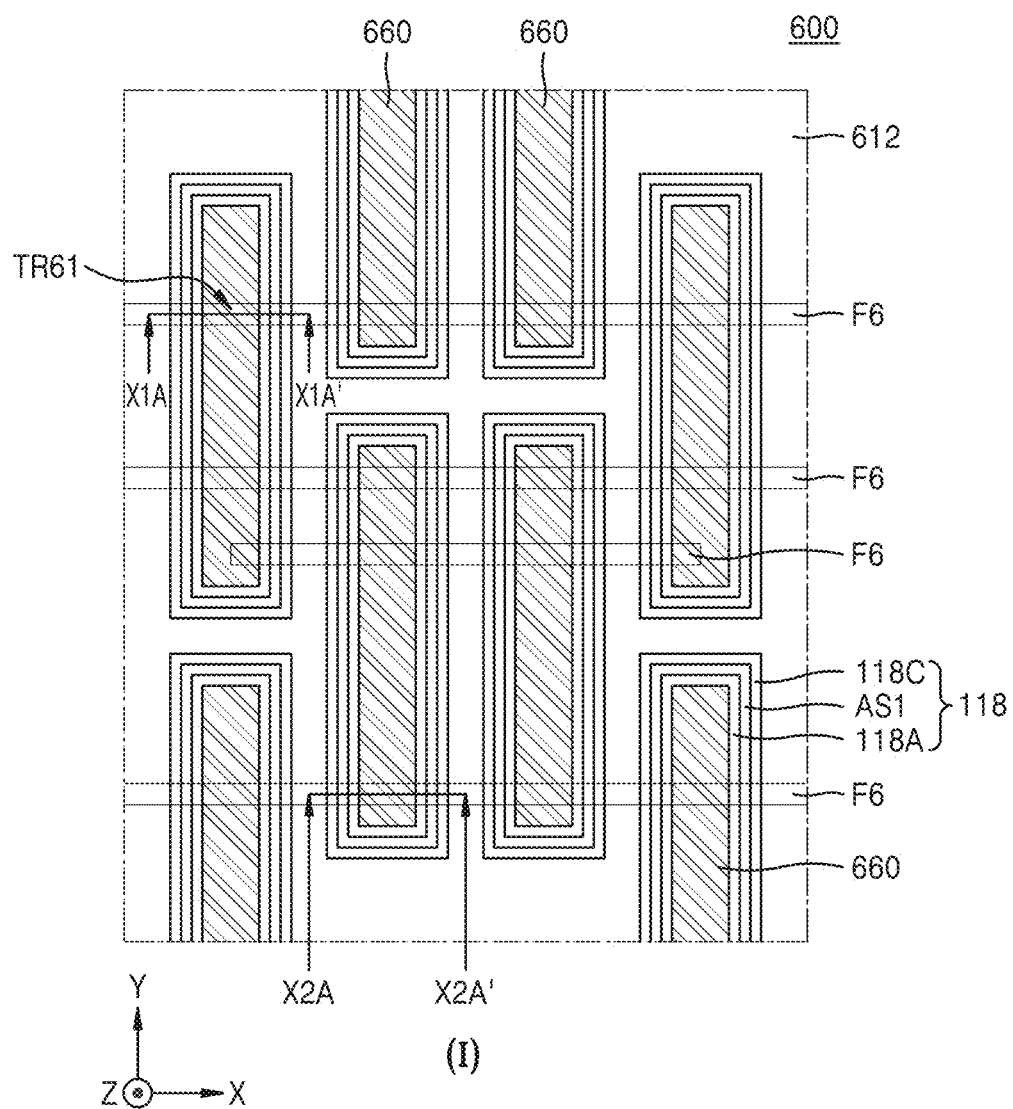
FIGS. 8A and 8B are plan layout diagrams for describing an integrated circuit device according to still other example embodiments of the inventive concepts, respectively.
Figure 8B:
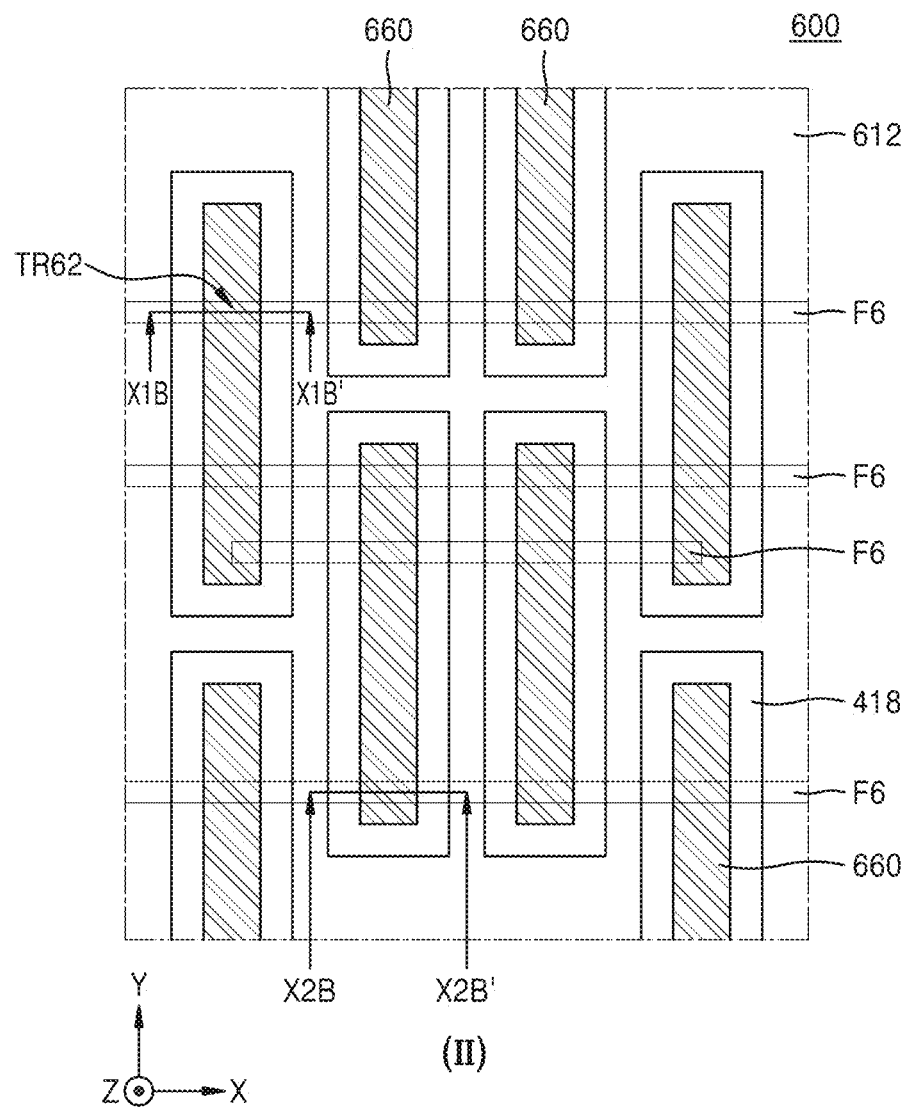

FIGS. 8A and 8B are plan layout diagrams for describing an integrated circuit device 600 according to still other example embodiments according to the inventive concepts, respectively.

Referring to FIGS. 8A and 8B, the integrated circuit device 600 may include a substrate 102 having a first area I and a second area II as described with reference to FIG. 5. FIG. 8A illustrates a configuration of the integrated circuit device 600 disposed in the first area I, and FIG. 8B illustrates a configuration of the integrated circuit device 600 disposed in the second area II.

In the first area I and the second area II of the integrated circuit device 600, each of the plurality of fin-type active areas F6 protrudes from the substrate 102 in the vertical direction (Z direction), and sidewalls of each of the plurality of fin-type active areas F6 may be covered with an insulating film 612. The insulating film 612 may have a configuration corresponding to a combined structure of the device isolation film 112 and the inter-device isolation insulating film 113 with reference to FIGS. 2C and 2D.

Although not shown in FIGS. 8A and 8B, a nanosheet stack NSS including a plurality of nanosheets N1, N2, and N3 described with reference to FIGS. 2A to 2D may be disposed on the plurality of fin-type active areas F6.

On the plurality of fin-type active areas F6, a plurality of gate lines 660 may surround each of the plurality of nanosheets N1, N2, and N3, and may extend in a second horizontal direction (Y direction). The plurality of fin-type active areas F6 and the plurality of gate lines 660 each may have substantially the same configuration as described for the plurality of fin-type active areas F1 and F2 and the gate line 160 with reference to FIGS. 1 and 2A to 2D.

In the first area I and the second area II of the integrated circuit device 600, the plurality of fin-type active areas F6 may be arranged with a variable pitch along the second horizontal direction (Y direction). Accordingly, a separation distance between each of the plurality of fin-type active areas F6 in the second horizontal direction (Y direction) may vary depending on the position. In the first horizontal direction (X direction), the lengths of each of the plurality of fin-type active areas F6 may vary according to positions.

Although not shown in FIGS. 8A and 8B, in the first area I and the second area II of the integrated circuit device 600, a plurality of first and second source/drain regions SD1 and SD2 as described with reference to FIGS. 2A and 2B may be disposed on the plurality of fin-type active areas F6. The plurality of first and second source/drain regions SD1 and SD2 may be disposed on both sides of each of the plurality of gate lines 660, respectively.

The integrated circuit device 600 may include a plurality of insulating spacer structures 118 surrounding the plurality of gate lines 660 in a closed loop shape in the first area I. The plurality of insulating spacer structures 118 may respectively cover sidewalls of the gate line 660 in the first horizontal direction (X direction) and the second horizontal direction (Y direction) in the first area I. Other detailed configurations of the insulating spacer structure 118 may be substantially the same as those described above with reference to FIGS. 1, 2A, 2B, and 2D.

The integrated circuit device 600 may include a plurality of insulating spacer structures 418 surrounding the plurality of gate lines 660 in a closed loop shape in the second area II. The plurality of insulating spacer structures 418 may respectively cover sidewalls of the gate line 660 in the first horizontal direction (X direction) and the second horizontal direction (Y direction) in the second area II. Other detailed configurations of the insulating spacer structure 418 may be substantially the same as those described above with reference to FIGS. 6A and 6B.

In some example embodiments, in the configuration of the first area I illustrated in FIG. 8A of the integrated circuit device 600, the configuration of the cross-section of the line X1A-X1A' may have the same configuration as at least some of the configurations illustrated in FIG. 2A, and the configuration of the cross-section of the line X2A-X2A' may have the same configuration as at least some of the configurations illustrated in FIG. 2B. Further, in the configuration of the second area II illustrated in FIG. 8B of the integrated circuit device 600, the configuration of the cross-section of the line X1B-X1B' may have the same configuration as at least some of the configurations illustrated in FIG. 6A and the configuration of the cross-section of the line X2B-X2B' may have the same configuration as at least some of the configurations illustrated in FIG. 6B.

A plurality of transistors TR61 may be formed at a plurality of positions where the plurality of fin-type active areas F6 and the plurality of gate lines 660 cross in the first area I of the integrated circuit device 600, and a plurality of transistors TR62 may be formed at a plurality of positions where the plurality of fin-type active areas F6 and the plurality of gate lines 660 cross each other in the second area II. The plurality of transistors TR61 and the plurality of transistors TR62 may each constitute a pull-up transistor, a pull-down transistor, or a pass transistor to configure a plurality of SRAM cells. The pull-up transistor may be formed of a PMOS transistor, and the pull-down transistor and the pass transistor each may be formed of an NMOS transistor.

Figure 9A:
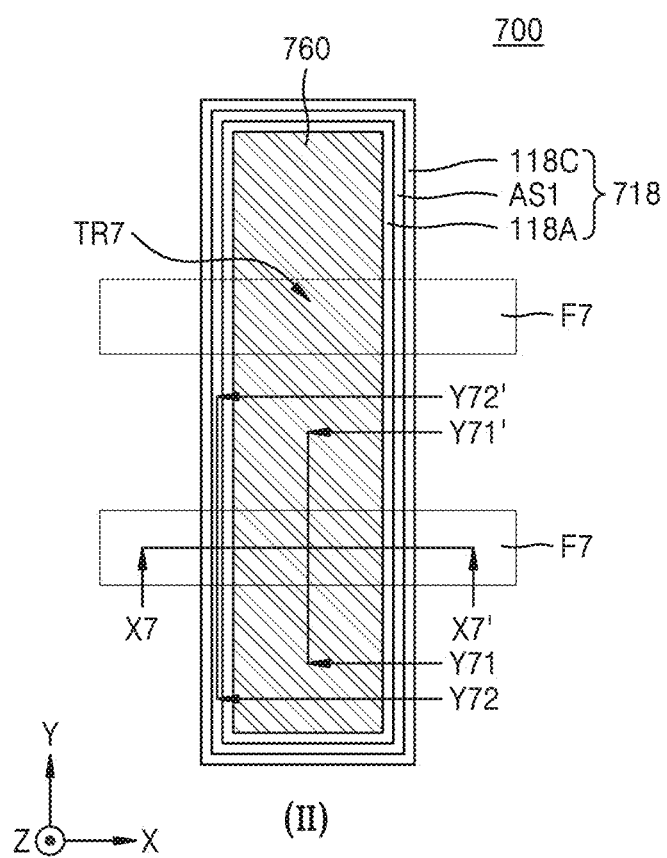
FIG. 9A is a plan layout diagram for explaining an integrated circuit device according to still other example embodiments of the inventive concepts.
Figure 9B:
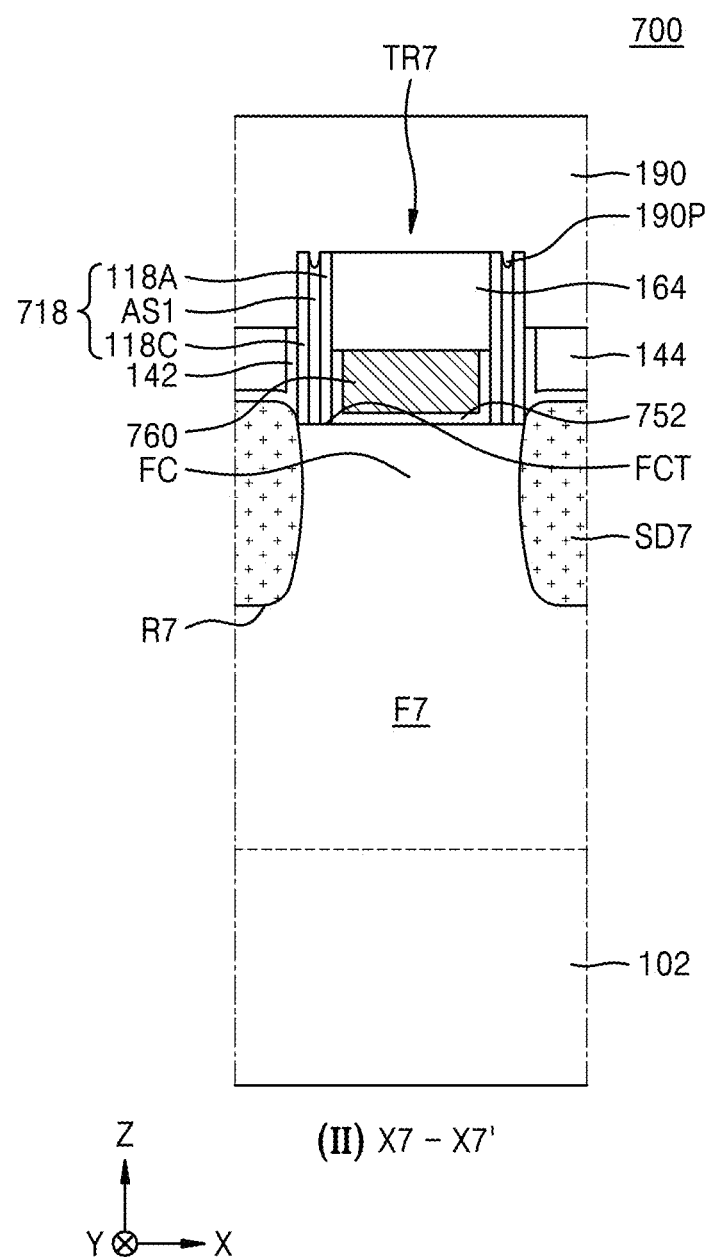
FIG. 9B is a cross-sectional view showing a partial configuration of a cross-section of the line X7-X7' of FIG. 9A.
Figure 9C:
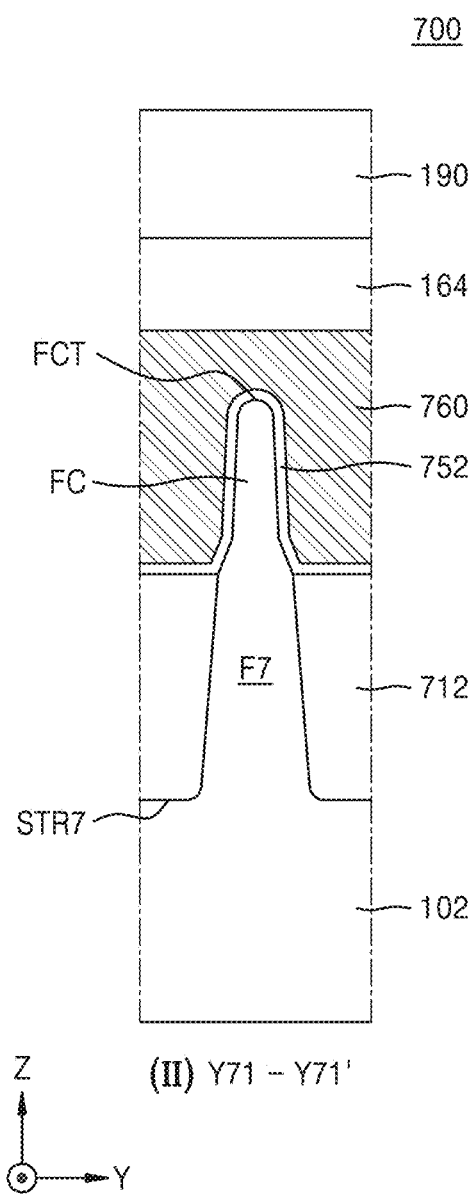
FIG. 9C is a cross-sectional view showing a partial configuration of a cross-section taken along line Y71-Y71' of FIG. 9A.
Figure 9D:
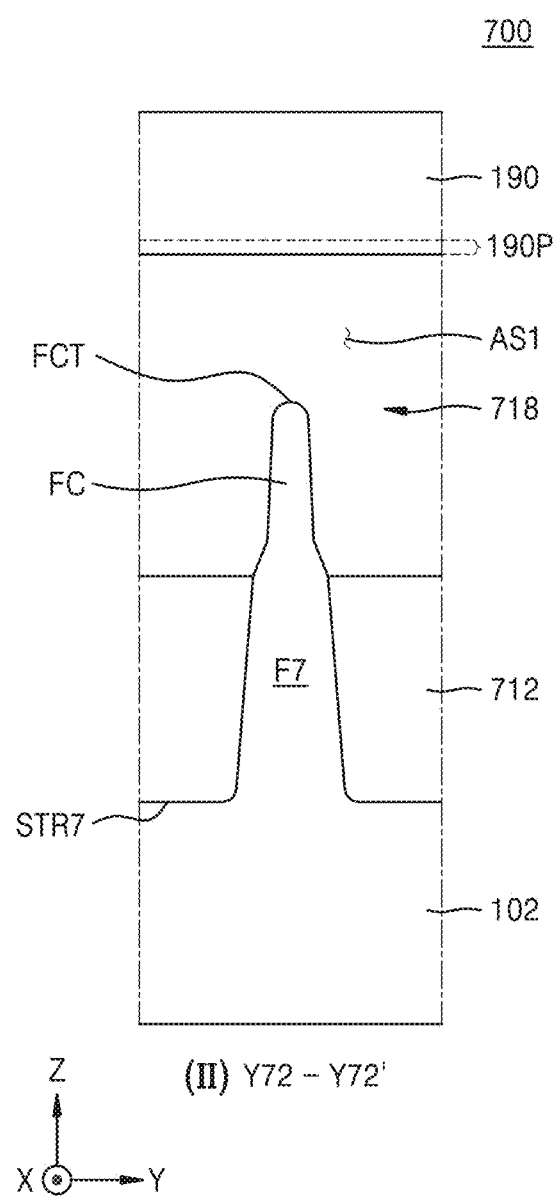
FIG. 9D is a cross-sectional view showing a partial configuration of a cross-sectional view taken along line Y72-Y72' of FIG. 9A.

FIG. 9A is a plan layout diagram for explaining an integrated circuit device 700 according to still other example embodiments according to the inventive concepts, FIG. 9B is a cross-sectional view showing a partial configuration of a cross-section of the line X7-X7' of FIG. 9A, FIG. 9C is a cross-sectional view showing a partial configuration of a cross-section taken along line Y71-Y71' of FIG. 9A, and FIG. 9D is a cross-sectional view showing a partial configuration of a cross-section taken along line Y72-Y72' of FIG. 9A.

The integrated circuit device 700 may include a substrate 102 having a first area I and a second area II as described with reference to FIG. 5. In the integrated circuit device 700, the first area I includes at least one structure selected from the structures described for the integrated circuit devices 100, 200, and 300 with reference to FIGS. 1 to 4, and structures described with reference to FIGS. 9A to 9D may be included in the second area II.

Referring to FIGS. 9A to 9D, the integrated circuit device 700 may include a plurality of fin-type active areas F7 protruding in a vertical direction (Z direction) from the substrate 102 in the second area II. The plurality of fin-type active areas F7 may extend parallel to each other in a first horizontal direction (X direction). Each of the plurality of fin-type active areas F7 may be defined by a device isolation trench STR7 formed in the substrate 102. The device isolation trench STR7 may be filled with a device isolation film 712. Sidewalls of each of the plurality of fin-type active areas F7 may be covered with a device isolation film 712.

A fin channel area FC protruding above the device isolation film 712 may be disposed on each of the plurality of fin-type active areas F7. The fin channel area FC may be integrally connected to the fin-type active area F7. On the plurality of fin-type active areas F7, the gate line 760 may surround the fin channel area FC and extend long in the second horizontal direction (Y direction). In FIG. 9A, two fin-type active areas F7 and one gate line 760 disposed on the two fin-type active areas F7 are illustrated, but the number of each of the fin-type active area F7 and the gate line 760 is not limited to the illustrated example and may be variously selected. The device isolation film 712 may be disposed between the substrate 102 and the gate line 760 and may cover a sidewall of the fin-type active area F7.

As illustrated in FIG. 9B, a plurality of recesses R7 may be formed above the fin-type active area F7 on both sides of the fin channel area FC, and a plurality of source/drain regions SD7 may be formed on the plurality of recesses R7.

Constituent materials of each of a plurality of fin-type active areas F7, fin channel areas FC, gate lines 760, a plurality of source/drain regions SD7, and device isolation films 712 are substantially the same as described for the constituent materials of the plurality of fin-type active areas F1 and F2, the plurality of nanosheets N1, N2, and N3, the gate line 160, the plurality of first and second source/drain regions SD1 and SD2, and the device isolation film 112 described with reference to FIGS. 1 and 2A to 2D.

A plurality of transistors TR7 may be formed in portions where the plurality of fin-type active areas F7 and the gate line 760 cross each other. Each of the plurality of transistors TR7 may be an NMOS transistor or a PMOS transistor.

A gate dielectric film 752 may be between the fin channel area FC and the gate line 760. The gate dielectric film 752 may include portions covering a surface of the fin channel area FC, portions covering sidewalls of the gate line 760, and portions covering an upper surface of the device isolation film 712. The constituent material of the gate dielectric film 752 is the same as the constituent material of the gate dielectric film 152 described with reference to FIGS. 2A to 2D.

In the integrated circuit device 700, the width in the first horizontal direction (X direction) of the gate line 760 (see FIG. 9A) in the second area II may be greater than the width of the gate line 160 (see FIG. 1) in the first area I in the first horizontal direction (X direction), but the inventive concepts are not limited thereto.

In the second area II, sidewalls (hereinafter, referred to as gate sidewalls) of the gate line 760 may be covered with an insulating spacer structure 718. As illustrated in FIG. 9A, the insulating spacer structure 718 may surround the gate line 760 in a closed loop shape to face the gate sidewalls in a first horizontal direction (X direction) and a second horizontal direction (Y direction).

As illustrated in FIGS. 9B and 9D, the insulating spacer structure 718 may cover the gate sidewalls of the gate line 760 on the top surface FCT of the fin channel area FC and the upper surface of the device isolation film 712. The insulating spacer structure 718 may cover both sidewalls of the gate line 760 in the first horizontal direction (X direction) on the top surface FCT of the fin channel area FC. The insulating spacer structure 718 may cover the top surface FCT of the fin channel area FC and both sidewalls of the fin channel area FC in the second horizontal direction (Y direction) on the device isolation film 712. The insulating spacer structure 718 may be spaced apart from the gate line 760 with the gate dielectric film 752 therebetween.

The insulating spacer structure 718 may include an inner insulating liner 118A, an air spacer AS1, and an outer insulating liner 118C sequentially covering sidewalls of the gate line 760.

As illustrated in FIG. 9A, the air spacer AS1 may surround the gate line 760 in a closed loop shape to face the sidewalls of the gate line 760 in the first horizontal direction (X direction) and the second horizontal direction (Y direction). The air spacer AS1 may face sidewalls of the gate line 760 with the gate dielectric film 752 and the inner insulating liner 118A therebetween.

As illustrated in FIG. 9D, both sidewalls of the fin channel area FC in the second horizontal direction (Y direction) on the device isolation film 712 may face the air spacer AS1. The top surface FCT and both sidewalls of the fin channel area FC and the upper surface of the device isolation film 112 may each include portions exposed to the air spacer AS1. A portion of the fin channel area FC exposed to the air spacer AS1 may vertically overlap the device isolation film 712.

Detailed descriptions of the inner insulating liner 118A, the air spacer AS1, and the outer insulating liner 118C are substantially the same as those described with reference to FIGS. 1, 2A, 2B, and 2D.

As illustrated in FIGS. 9B and 9C, the gate line 760 and the gate dielectric film 752 may be covered with a capping insulating pattern 164. The gate line 760 may be spaced apart from the source/drain region SD7 with the insulating spacer structure 718 therebetween.

In the second area II, the source/drain region SD7 may be covered with an inter-gate insulating film 144. The insulating spacer structure 718, the inter-gate insulating film 144, and the capping insulating pattern 164 may be covered with an interlayer insulating film 190. The interlayer insulating film 190 may include a protruding insulating portion 190P protruding downward in a vertical direction (Z direction) toward the air spacer AS1 included in the insulating spacer structure 718. Other detailed configurations of the inter-gate insulating film 144, the capping insulating pattern 164, and the interlayer insulating film 190 may be substantially the same as those described above with reference to FIGS. 2A to 2D.

Although not shown in FIGS. 9A and 9B, in the second area II, a source/drain contact and a source/drain via contact having a structure similar to the source/drain contact 174 and the source/drain via contact 192 illustrated in FIGS. 1, 2A, and 2B may be disposed on the plurality of source/drain regions SD7. The plurality of source/drain regions SD7 may be connected to an upper conductive line (not shown) through a plurality of source/drain contacts 174 and a plurality of source/drain via contacts 192. Also, a gate contact and a gate via contact having structures similar to those of the gate contact 184 and the gate via contact 194 illustrated in FIGS. 1 and 2C may be disposed on the gate line 760. The gate line 760 may be connected to an upper conductive line (not shown) through the gate contact 184 and the gate via contact 194.

The integrated circuit device 700 described with reference to FIGS. 9A to 9D includes an insulating spacer structure 718 covering sidewalls of the gate line 760 on the fin channel area FC and the device isolation film 712, and the insulating spacer structure 718 includes an air spacer AS1. Therefore, when the source/drain contacts are disposed adjacent to the gate line 760 in the second area II, parasitic capacitance generated by coupling between the gate line 760 and the source/drain contact may be reduced. Further, parasitic capacitance generated by coupling between the plurality of fin-type active areas F7 and the gate line 760 may be reduced. Accordingly, the ON current characteristics and OFF current characteristics of each of the plurality of transistors formed in the second area II may be improved, thereby improving the performance and reliability of transistors, and reliability of the integrated circuit device 700.

Figure 9E:
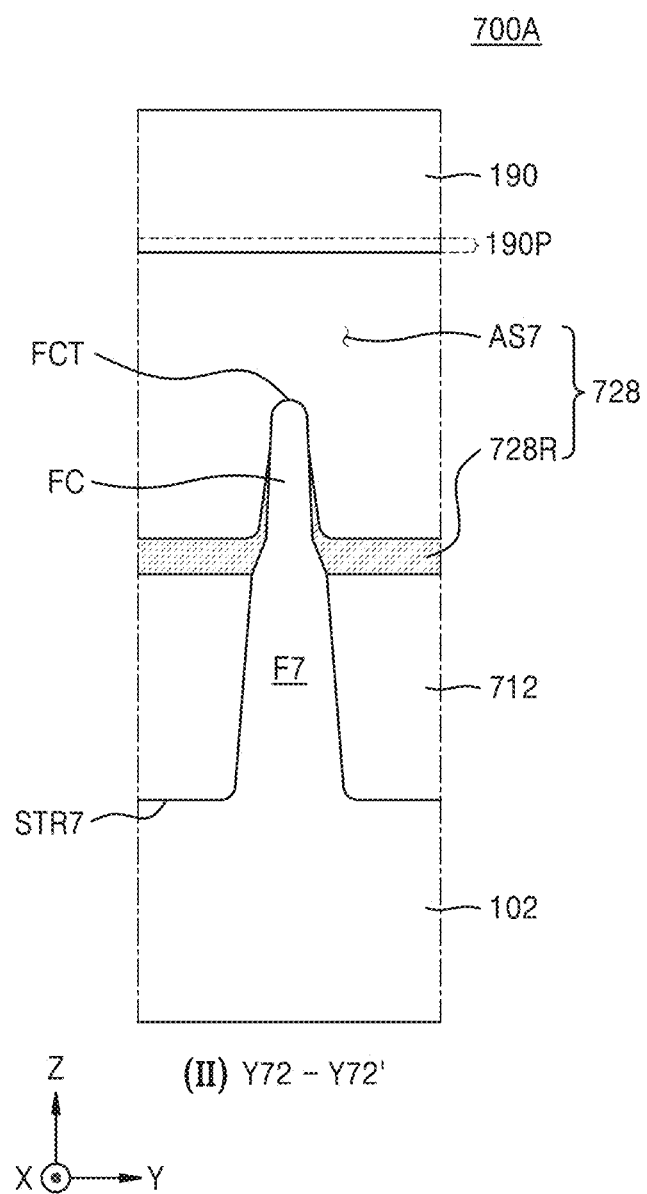
FIG. 9E is a cross-sectional view illustrating an integrated circuit device according to still other example embodiments of the inventive concepts.

FIG. 9E is a cross-sectional view illustrating an integrated circuit device 700A according to still other example embodiments according to the inventive concepts. In FIG. 9E, a partial configuration of an area corresponding to a cross-section of the line Y72-Y72' of FIG. 9A is illustrated.

Referring to FIG. 9E, the integrated circuit device 700A may have substantially the same configuration as the integrated circuit device 700 described with reference to FIGS. 9A to 9D. However, the integrated circuit device 700A includes an insulating spacer structure 728 instead of the insulating spacer structure 718 included in the second area II of the integrated circuit device 700.

Similar to the description of the insulating spacer structure 718 with reference to FIGS. 9A and 9D, the insulating spacer structure 728 may include an inner insulating liner 118A, an air spacer AS7, and an outer insulating liner 118C, which sequentially cover sidewalls of the gate line 760 (see FIGS. 9A and 9B). However, the insulating spacer structure 728 further includes a bottom insulating spacer 728R interposed between the inner insulating liner 118A and the outer insulating liner 118C. The bottom insulating spacer 728R may have a surface in contact with the device isolation film 712 and a surface in contact with the fin channel area FC. The upper surface of the bottom insulating spacer 728R may extend non-linearly in the second horizontal direction (Y direction). The upper surface of the bottom insulating spacer 728R may be exposed to the air spacer AS7.

The air spacer AS7 may have substantially the same configuration as described for the air spacer AS1 with reference to FIGS. 9A, 9B, and 9D. However, the bottom level of the air spacer AS7 facing the substrate 102 may be limited by the bottom insulating spacer 728R. Accordingly, the device isolation film 712 may not be exposed to the air spacer AS7. In other example embodiments, unlike illustrated in FIG. 9E, the upper surface of the device isolation film 712 may include a local area not covered by the bottom insulation spacer 728R, and thus the local area may be exposed to the air spacer AS7.

Figure 10A:
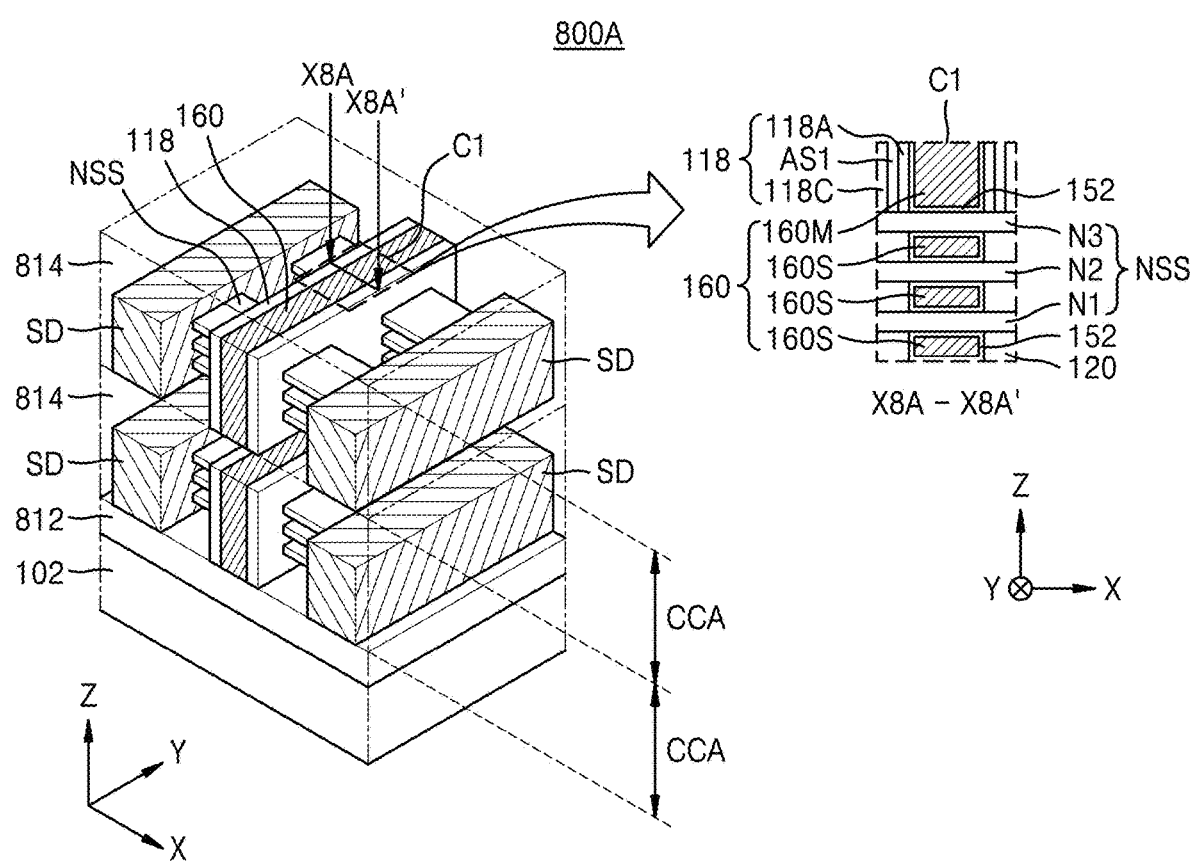
FIGS. 10A to 10C are perspective views of a partial area of an integrated circuit device according to still other example embodiments according to the inventive concepts.

FIG. 10A is a perspective view of a partial area of an integrated circuit device 800A according to still other example embodiments according to the inventive concepts.

Referring to FIG. 10A, the integrated circuit device 800A includes a plurality of circuit areas CCA stacked on a substrate 102 so as to overlap each other in a vertical direction (Z direction). A device isolation film 812 may be between the substrate 102 and the plurality of circuit areas CCA. The device isolation film 812 may have substantially the same configuration as described for the device isolation film 112 with reference to FIGS. 2C and 2D.

The plurality of circuit areas CCA may each include components included in the integrated circuit device 100 described with reference to FIGS. 1 and 2A to 2D. For example, a plurality of circuit areas CCA may each include a nanosheet stack NSS including a plurality of nanosheets N1, N2, and N3, a gate line 160 covering each of the plurality of nanosheets N1, N2, and N3 while covering the plurality of nanosheet stacks NSS, an insulating spacer structure 118 covering the gate line 160 and the plurality of nanosheets N1, N2, and N3, and a plurality of source/drain regions SD in contact with the plurality of nanosheets N1, N2, and N3. The insulating spacer structure 118 may include an inner insulating liner 118A, an air spacer AS1, and an outer insulating liner 118C sequentially covering sidewalls of the gate line 160. Each of the plurality of source/drain regions SD may have a configuration as described with respect to the first source/drain region SD1 illustrated in FIG. 2A. In FIG. 10A, the cross-sectional configuration of the local area indicated by "C1" along the line X8A-X8A' may be substantially the same as that illustrated in FIG. 2A.

In each of the plurality of circuit areas CCA, a nanosheet stack NSS including a plurality of nanosheets N1, N2, and N3, a gate line 160, an insulating spacer structure 118, and a plurality of source/drain regions SD may be covered with an insulating structure 814. The insulating structure 814 may include an oxide film, a nitride film, or a combination thereof, but is not limited thereto.

The gate lines 160 included in each of the two circuit areas CCA adjacent to each other in the vertical direction (Z direction) among the plurality of circuit areas CCA may be spaced apart from each other in a vertical direction (Z direction) with the insulating structure 814 therebetween, and may overlap each other in a vertical direction (Z direction). The source/drain regions SD included in each of the two circuit areas CCA adjacent to each other in the vertical direction (Z direction) among the plurality of circuit areas CCA may be spaced apart from each other in a vertical direction (Z direction) with the insulating structure 814 therebetween, and may overlap each other in a vertical direction (Z direction).

FIG. 10A illustrates a structure in which two circuit areas CCA on the substrate 102 overlap each other in a vertical direction (Z direction), but the inventive concepts are not limited thereto. For example, on the substrate 102, at least three circuit areas CCA may overlap each other in a vertical direction (Z direction).

Figure 10B:
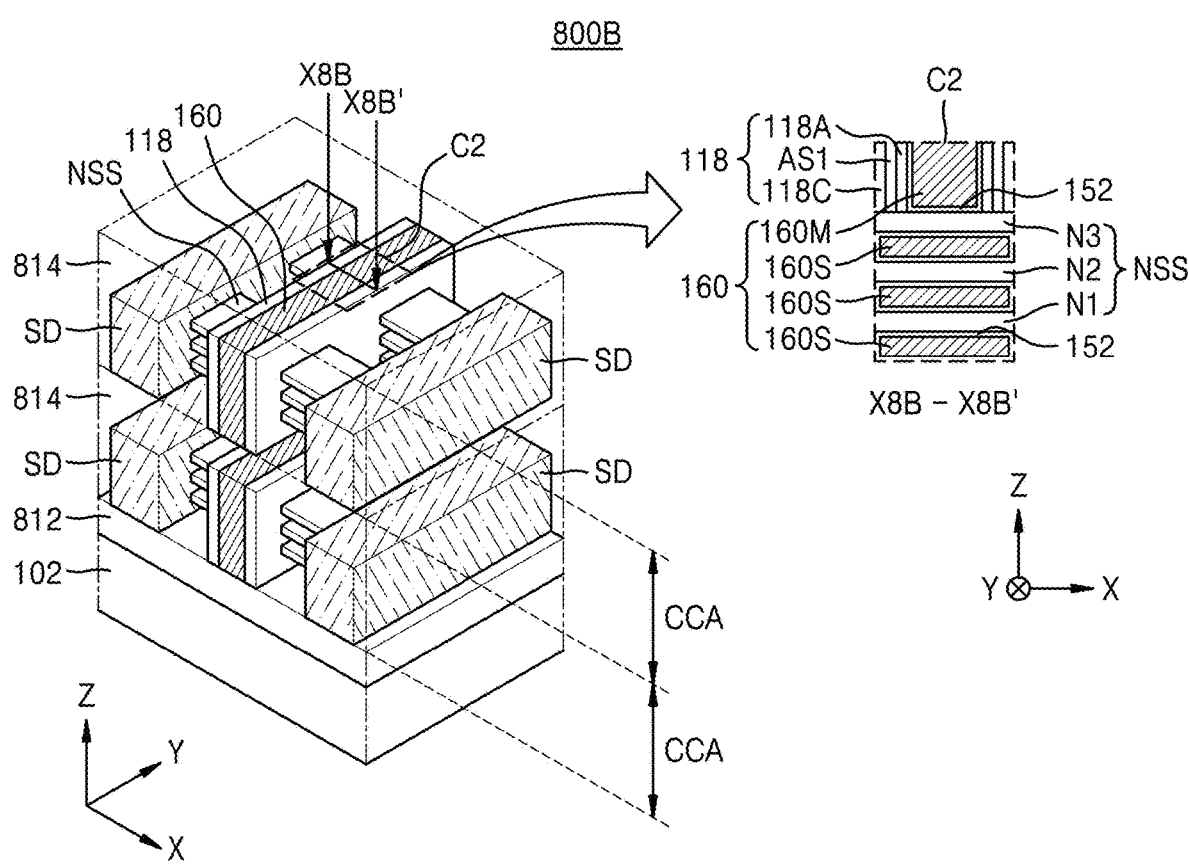

FIG. 10B is a perspective view of a partial area of an integrated circuit device 800B according to still other example embodiments according to the inventive concepts.

Referring to FIG. 10B, the integrated circuit device 800B may have substantially the same configuration as described for the integrated circuit device 800A with reference to FIG. 10A. However, in the integrated circuit device 800B, each of the plurality of source/drain regions SD may have the same configuration as described for the second source/drain region SD2 illustrated in FIG. 2B. In FIG. 10B, the cross-sectional configuration of the local area indicated by "C2" along the line X8B-X8B' may be substantially the same as that illustrated in FIG. 2B.

Figure 10C:
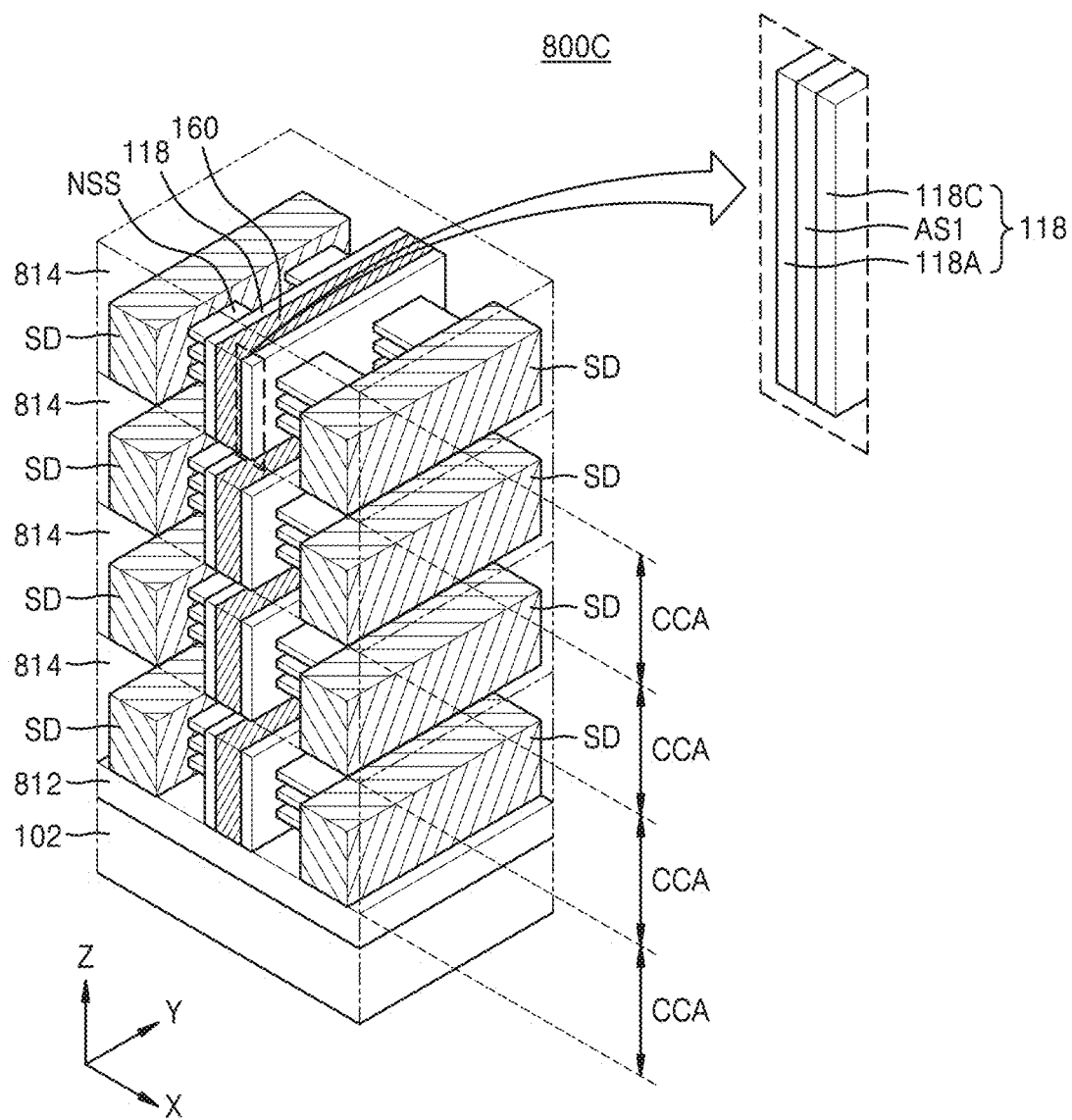

FIG. 10C is a perspective view of a partial area of an integrated circuit device 800C according to still other example embodiments according to the inventive concepts.

Referring to FIG. 10C, the integrated circuit device 800C may have substantially the same configuration as described for the integrated circuit device 800A with reference to FIG. 10A. However, the integrated circuit device 800C includes four circuit areas CCA overlapping each other in the vertical direction (Z direction) on the substrate 102.

In the integrated circuit device 800C, the gate lines 160 included in the four circuit areas CCA each include an insulating spacer structure 118 covering a gate line 160 and a plurality of nanosheets N1, N2, and N3, and the insulating spacer structure 118 may include an inner insulating liner 118A, an air spacer AS1, and an outer insulating liner 118C that sequentially cover sidewalls of the gate line 160. Each of the plurality of source/drain regions SD included in the integrated circuit device 800C may have the same configuration as described for the first source/drain region SD1 illustrated in FIG. 2A or the second source/drain region SD2 illustrated in FIG. 2B.

The integrated circuit devices 800A, 800B, and 800C described with reference to FIGS. 10A to 10C each include a plurality of circuit areas CCA overlapping in a vertical direction (Z direction), and sidewalls of the gate line 160 included in each of the plurality of circuit areas CCA are covered with an insulating spacer structure 118 including an air spacer AS1. Accordingly, unwanted parasitic capacitance between the gate line 160 and conductive areas disposed relatively adjacent to the gate line 160 in each of the plurality of circuit areas CCA may be reduced. Accordingly, reliability of the integrated circuit devices 800A, 800B, and 800C may be improved.

Figure 11A:
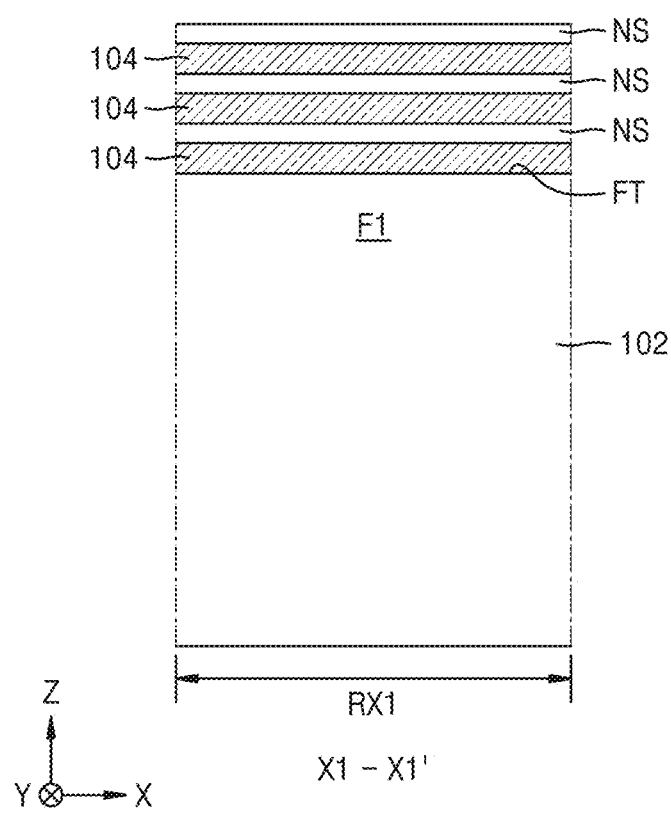
FIGS. 11A to 19D are cross-sectional views illustrating a method of manufacturing an integrated circuit device according to some example embodiments of the inventive concepts, according to a process sequence, and FIGS. 11A, 12A, . . . , and 19A are cross-sectional views illustrating a partial configuration according to a process sequence of a portion corresponding to the cross-section of the line X1-X1' of FIG. 1, and FIGS. 11B, 12B, . . . , and 19B are cross-sectional views illustrating a partial configuration according to a process sequence of a portion corresponding to the cross-section of the line X2-X2' of FIG. 1, and FIGS. 11C, 12C, . . . , and 19C are cross-sectional views illustrating a partial configuration according to a process sequence of a portion corresponding to the cross-section of the line Y1-Y1' of FIG. 1, and FIGS. 12D, 14D, 15D, 16D, 18D, and 19D are cross-sectional views illustrating a partial configuration according to a process sequence of a portion corresponding to the cross-section of the line Y2-Y2' of FIG. 1.
Figure 11B:
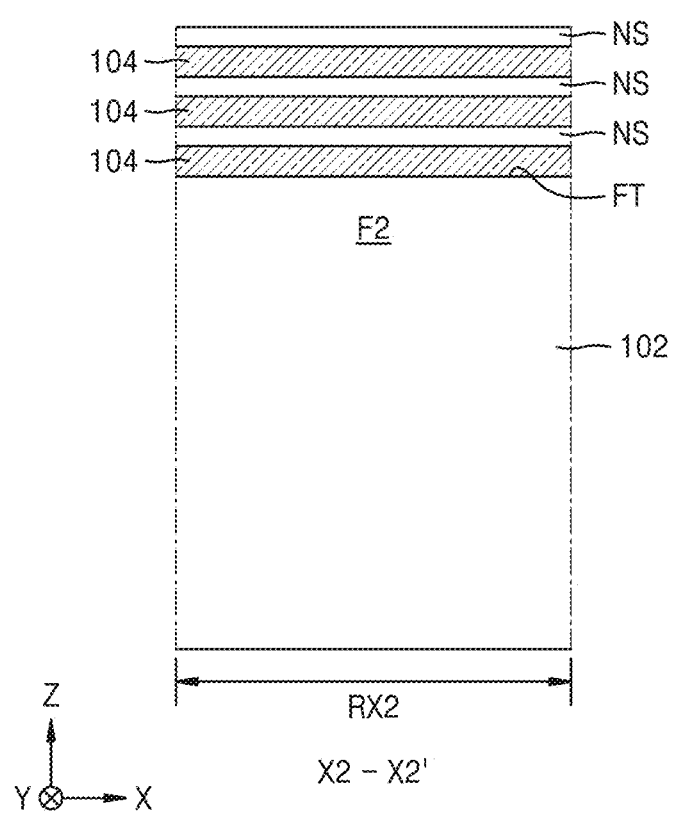
Figure 11C:
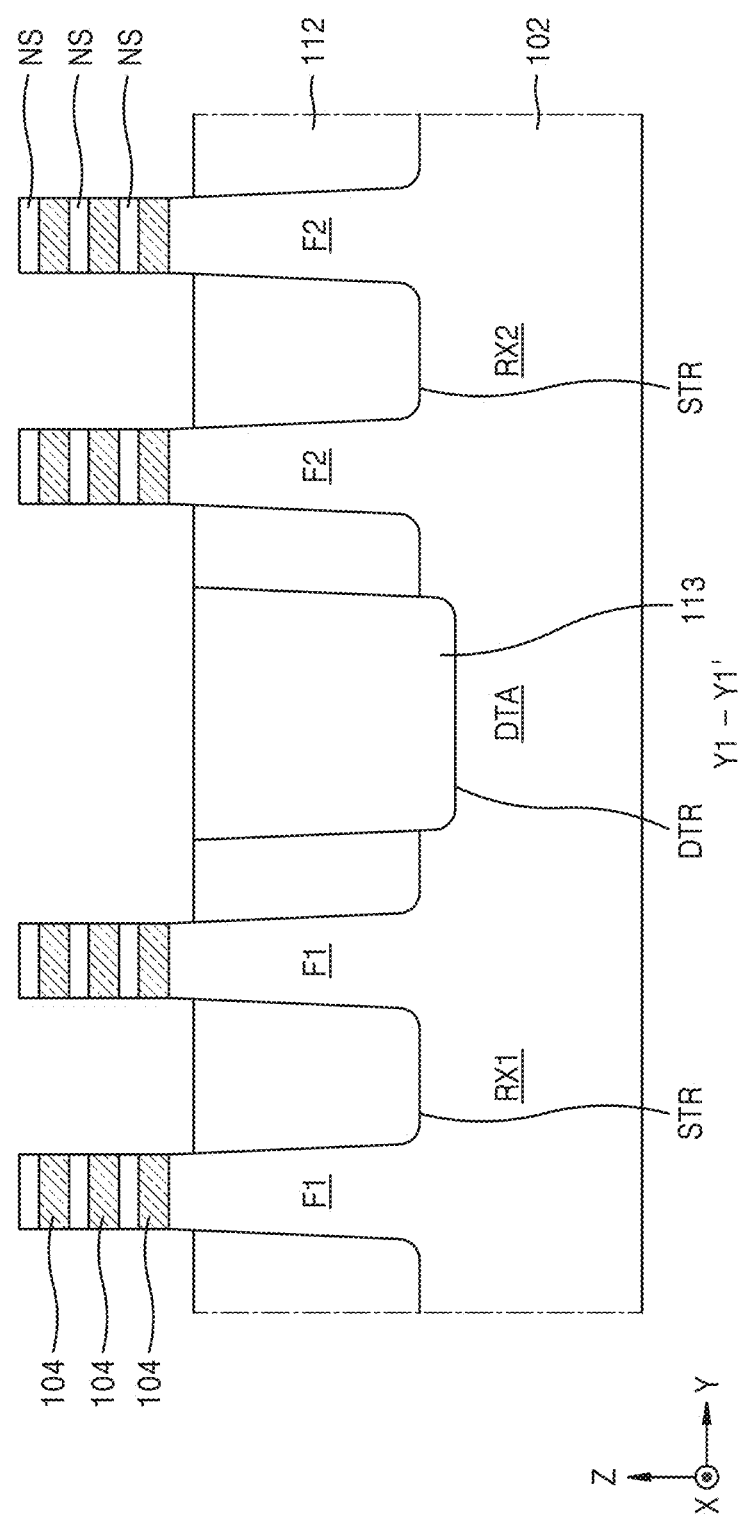
Figure 12A:
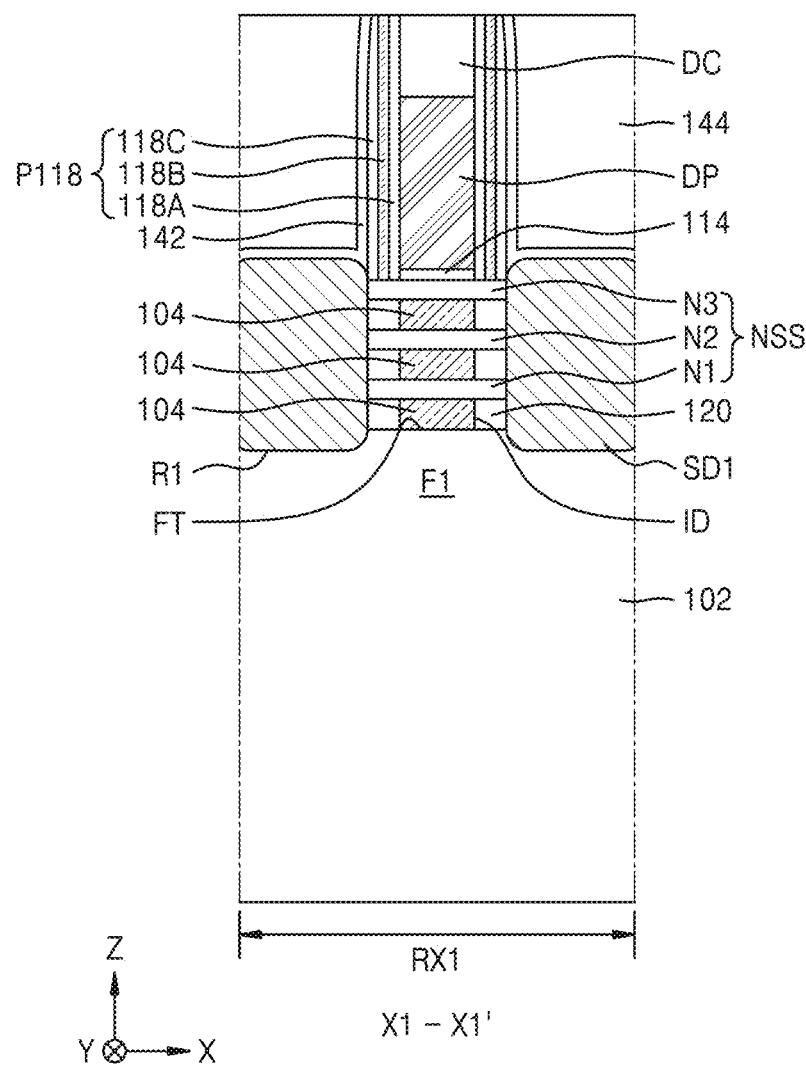
Figure 12B:
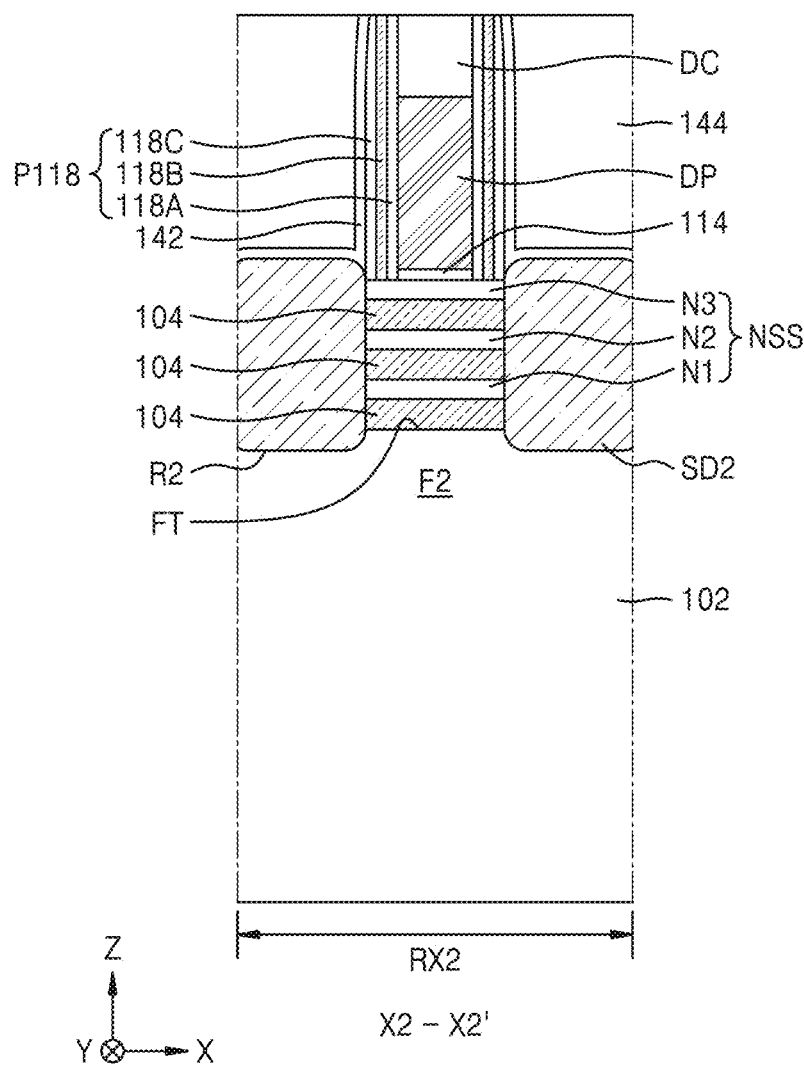
Figure 12C:
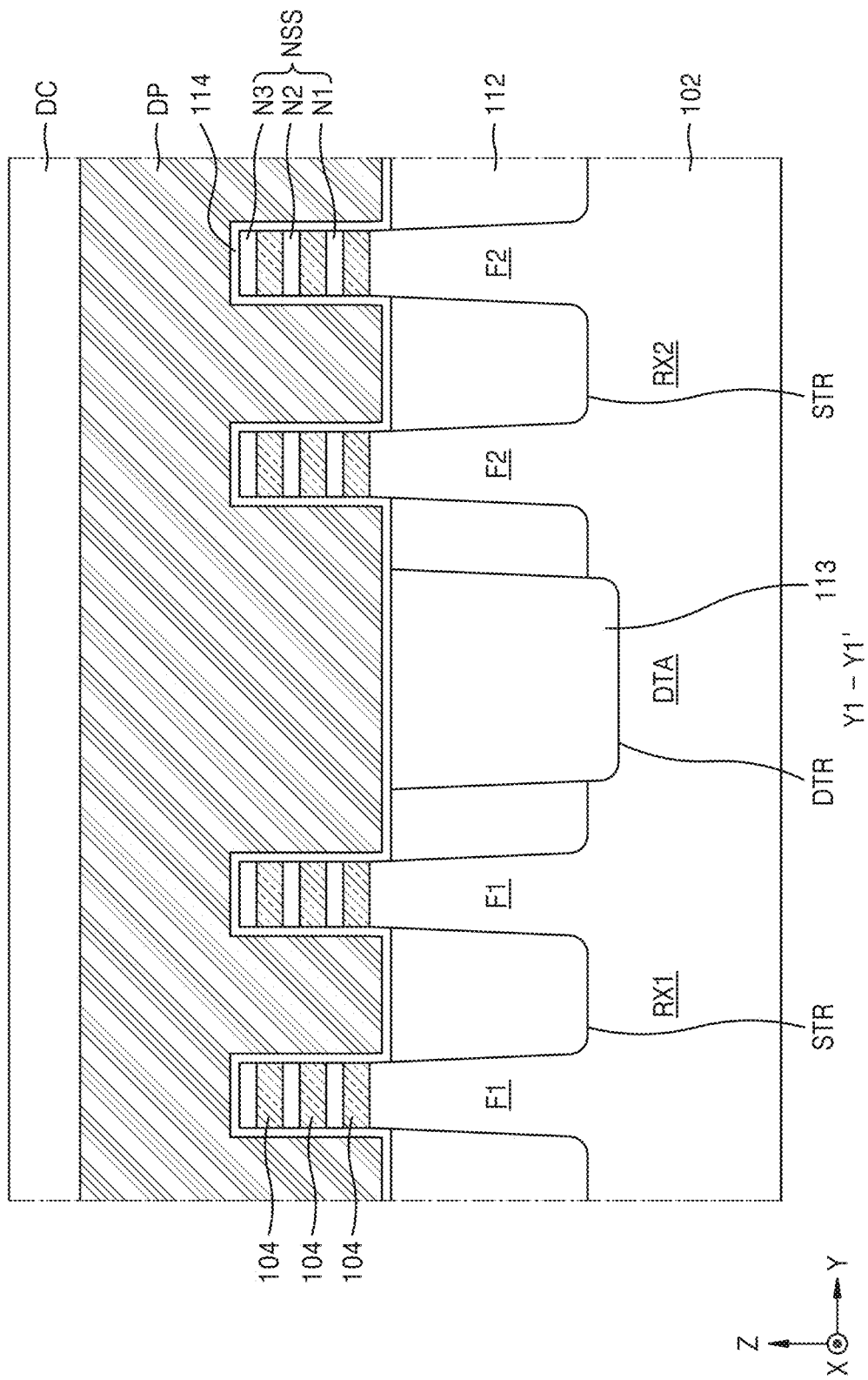
Figure 12D:
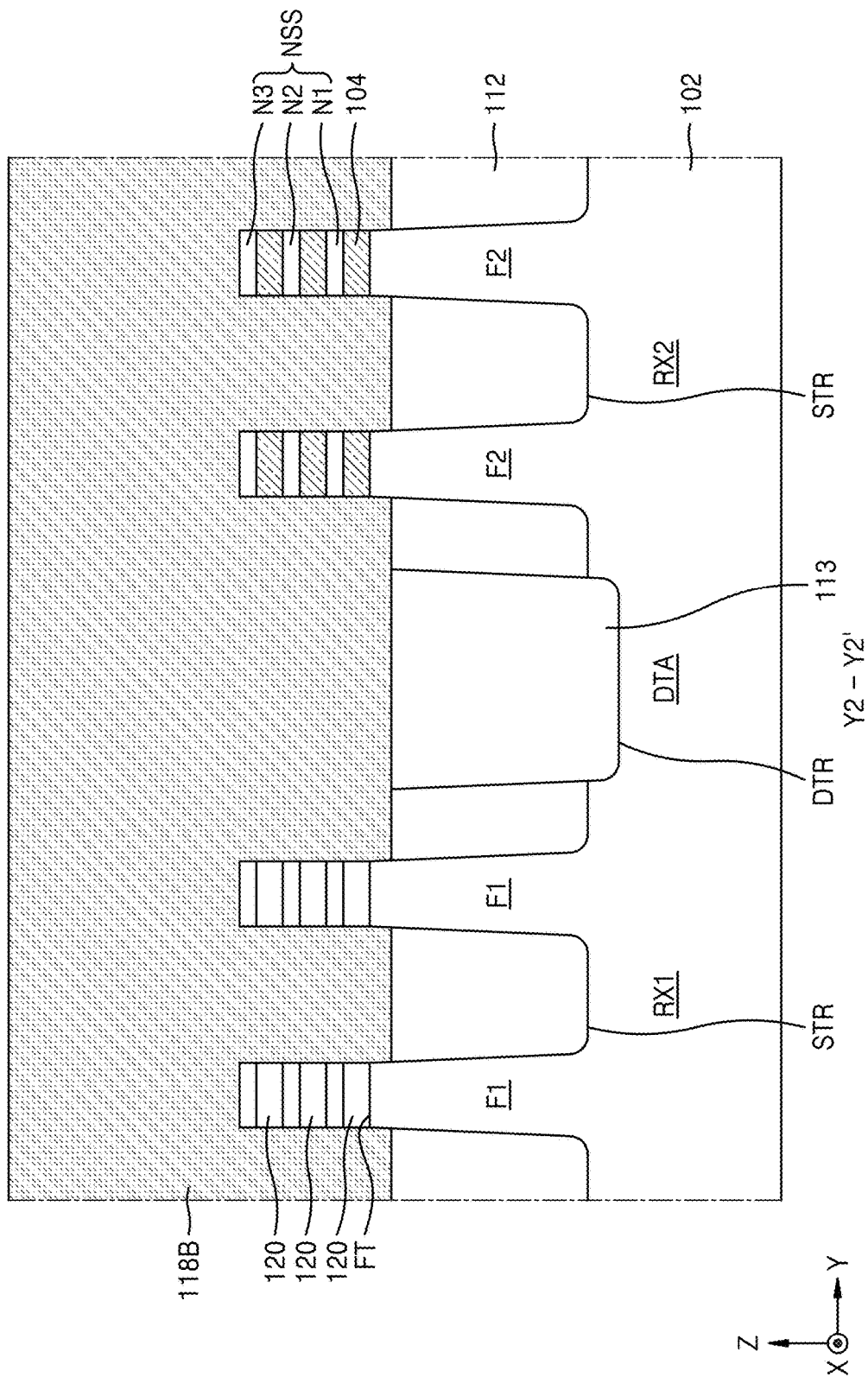

FIGS. 11A to 19D are cross-sectional views illustrating a method of manufacturing an integrated circuit device according to some example embodiments of the inventive concept, according to a process sequence, and FIGS. 11A, 12A, . . . , and 19A are cross-sectional views illustrating a partial configuration according to a process sequence of a portion corresponding to the cross-section of the line X1-X1' of FIG. 1, and FIGS. 11B, 12B, . . . , and 19B are cross-sectional views illustrating a partial configuration according to a process sequence of a portion corresponding to the cross-section of the line X2-X2' of FIG. 1, and FIGS. 11C, 12C, . . . , and 19C are cross-sectional views illustrating a partial configuration according to a process sequence of a portion corresponding to the cross-section of the line Y1-Y1' of FIG. 1, and FIGS. 12D, 14D, 15D, 16D, 18D, and 19D are cross-sectional views illustrating a partial configuration according to a process sequence of a portion corresponding to the cross-section of the line Y2-Y2' of FIG. 1. Example manufacturing methods of the integrated circuit device 100 illustrated with reference to FIGS. 1 and 2A to 2D will be described with reference to FIGS. 11A to 19D. In FIGS. 11A to 19D, the same reference numerals as in FIGS. 1 and 2A to 2D denote the same members, and detailed descriptions thereof are omitted here.

Referring to FIGS. 11A to 11C, after alternately stacking a plurality of sacrificial semiconductor layers 104 and a plurality of nanosheet semiconductor layers NS on the substrate 102, one by one, a device isolation trench STR is formed in the substrate 102 by etching a portion of each of the plurality of sacrificial semiconductor layers 104, the plurality of nanosheet semiconductor layers NS, and the substrate 102. As a result, a plurality of fin-type active areas F1 and F2 protruding upward from the substrate 102 in the vertical direction (Z direction) are formed, and the plurality of sacrificial semiconductor layers 104 and the plurality of nanosheet semiconductor layers NS may remain elongated along the first horizontal direction (X direction) on the fin upper surface FT of each of the plurality of fin-type active areas F1 and F2.

The plurality of sacrificial semiconductor layers 104 and the plurality of nanosheet semiconductor layers NS may be formed of semiconductor materials having different etch selectivity. In some example embodiments, the plurality of nanosheet semiconductor layers NS may include a Si layer, and the plurality of sacrificial semiconductor layers 104 may be formed of a SiGe layer. In some example embodiments, the Ge content in the plurality of sacrificial semiconductor layers 104 may be constant. The SiGe layer constituting the plurality of sacrificial semiconductor layers 104 may have a constant Ge content selected within a range of about 5 atomic % to about 60 atomic % (e.g., about 10 atomic % to about 40 atomic %). The Ge content in the SiGe layer constituting the plurality of sacrificial semiconductor layers 104 may be variously selected as desired.

Thereafter, a device isolation film 112 filling the device isolation trench STR is formed, and a part of the device isolation film 112 is etched in the inter-device isolation area DTA, and as a result, a part of the exposed substrate 102 may be etched to form a deep trench DTR defining a first device area RX1 and a second device area RX2, and the deep trench DTR may be filled with an inter-device isolation insulating film 113. Thereafter, the device isolation film 112 and the inter-device isolation insulating film 113 are etched back, so that sidewalls of each of the plurality of sacrificial semiconductor layers 104 and the plurality of nanosheet semiconductor layers NS may be exposed in the first device area RX1 and the second device area RX2. In the result obtained after etching back the device isolation film 112 and the inter-device isolation insulating film 113, the level of the upper surface of each of the device isolation film 112 and the inter-device isolation insulating film 113 may be lower than the level of the fin upper surface FT of each of the plurality of fin-type active areas F1 and F2.

Referring to FIGS. 12A to 12D, a stacked pattern including an insulating liner 114, a dummy gate pattern DP, and a dummy capping pattern DC may be formed on the results of FIGS. 11A to 11C. The stacked pattern may be formed to extend in the second horizontal direction (Y direction) on the plurality of nanosheet stacks NSS, the device isolation film 112, and the inter-device isolation insulating film 113 illustrated in FIGS. 11A to 11C.

After that, on the plurality of nanosheet stacks NSS, the device isolation film 112 and the inter-device isolation insulating film 113, a preliminary spacer structure P118 may be formed to cover sidewalls of the dummy gate pattern DP. The preliminary spacer structure P118 may cover both sidewalls in the first horizontal direction (X direction) and both sidewalls in the second horizontal direction (Y direction) of the stacked pattern including the dummy gate pattern DP. The preliminary spacer structure P118 may surround the stacked pattern including the dummy gate pattern DP in a closed loop shape when viewed from a plane, for example, an X-Y plane.

In some example embodiments, the insulating liner 114 may include a silicon oxide film formed by a plasma deposition method, the dummy gate pattern DP may be formed of a polysilicon film, and the dummy capping pattern DC may be formed of a silicon nitride film.

The preliminary spacer structure P118 may include an inner insulating liner 118A, a sacrificial liner 118B, and an outer insulating liner 118C that sequentially cover sidewalls of the dummy gate pattern DP. The sacrificial liner 118B may be made of a material different from that of each of the inner insulating liner 118A and the outer insulating liner 118C. In some example embodiments, when the inner insulating liner 118A and the outer insulating liner 118C are made of a silicon nitride film, the sacrificial liner 118B may include a silicon oxide film, but the inventive concepts are not limited thereto.

After the preliminary spacer structure P118 is formed, a portion of each of the plurality of sacrificial semiconductor layers 104 and the plurality of nanosheet semiconductor layers NS is selectively formed in the first device area RX1, and a nanosheet stack NSS including a plurality of nanosheets N1, N2, and N3 is formed from the plurality of nanosheet semiconductor layer NS, and a plurality of first recesses R1 are formed on the upper portion of the first fin-type active area F1 by etching some areas of the first fin-type active area F1 on both sides of the nanosheet stack NSS, and a plurality of indent spaces ID are formed by selectively removing portions of the plurality of sacrificial semiconductor layers 104 exposed from both sides of the nanosheet stack NSS through the plurality of first recesses R1, and a plurality of inner insulating spacers 120 filling the plurality of indent spaces ID are formed, and a plurality of first source/drain regions SD1 filling the plurality of first recesses R1 are be formed on both sides of the nanosheet stack NSS. The plurality of first source/drain regions SD1 may be formed at positions spaced apart from the dummy gate pattern DP with the preliminary spacer structure P118 therebetween, respectively.

In order to form a plurality of first source/drain regions SD1, in the first device area RX1, a semiconductor material may be epitaxially grown from the surface of the first fin-type active area F1 exposed from the bottom of the plurality of first recesses R1 and the sidewalls of each of the plurality of nanosheets N1, N2, and N3. In some example embodiments, in order to form a plurality of first source/drain regions SD1, a low-pressure chemical vapor deposition (LPCVD) process, a selective epitaxial growth (SEG) process, or a cyclic deposition and etching (CDE) process may be performed using raw materials including an element semiconductor precursor. In some example embodiments, the plurality of first source/drain regions SD1 may include a Si layer doped with an n-type dopant. In order to form the plurality of first source/drain regions SD1, silane ($SiH_4$), disilane ($Si_2H_6$), trisilane ($Si_3H_8$), and dichlorosilane ($SiH_2Cl_2$) may be used as Si sources. The n-type dopant may be selected from phosphorus (P), arsenic (As), and antimony (Sb).

A nanosheet stack NSS including a plurality of nanosheets N1, N2, and N3 from the plurality of nanosheet semiconductor layers NS may be formed by selectively removing a portion of each of the plurality of sacrificial semiconductor layers 104 and the plurality of nanosheet semiconductor layers NS in the second device area RX2, and a plurality of second recesses R2 may be formed on the second fin-type active area F2 by etching the second fin-type active area F2 exposed from both sides of the nanosheet stack NSS, and a plurality of second source/drain regions SD2 filling the plurality of second recesses R2 may be formed on both sides of the nanosheet stack NSS. The plurality of second source/drain regions SD2 may be formed at positions spaced apart from the dummy gate pattern DP with the preliminary spacer structure P118 therebetween, respectively.

In order to form a plurality of second source/drain regions SD2, in the second device area RX2, a semiconductor material may be epitaxially grown from the surface of the second fin-type active area F2 exposed from the bottom of the plurality of second recesses R2 and the sidewalls of each of the plurality of nanosheets N1, N2, and N3. In some example embodiments, the plurality of second source/drain regions SD2 may include a SiGe layer doped with a p-type dopant. Si source and Ge source may be used to form a plurality of second source/drain regions SD2. As the Si source, silane ($SiH_4$), disilane ($Si_2H_6$), trisilane ($Si_3H_8$), dichlorosilane ($SiH_2Cl_2$), or the like may be used. As the Ge source, germane ($GeH_4$), desermain ($Ge_2H_6$), trigermain ($Ge_3H_8$), tetragermain ($Ge_4H_{10}$), dichlorogermain ($Ge_2H_2Cl_2$), and the like may be used. The p-type dopant may be selected from boron (B) and gallium (Ga).

After that, in the first device area RX1 and the second device area RX2, an insulating liner 142 covering the surfaces of each of the plurality of first and second source/drain regions SD1 and SD2 and the surfaces of each of the plurality of preliminary spacer structures P118 may be formed and an inter-gate insulating film 144 may be formed on the insulating liner 142.

Figure 13A:
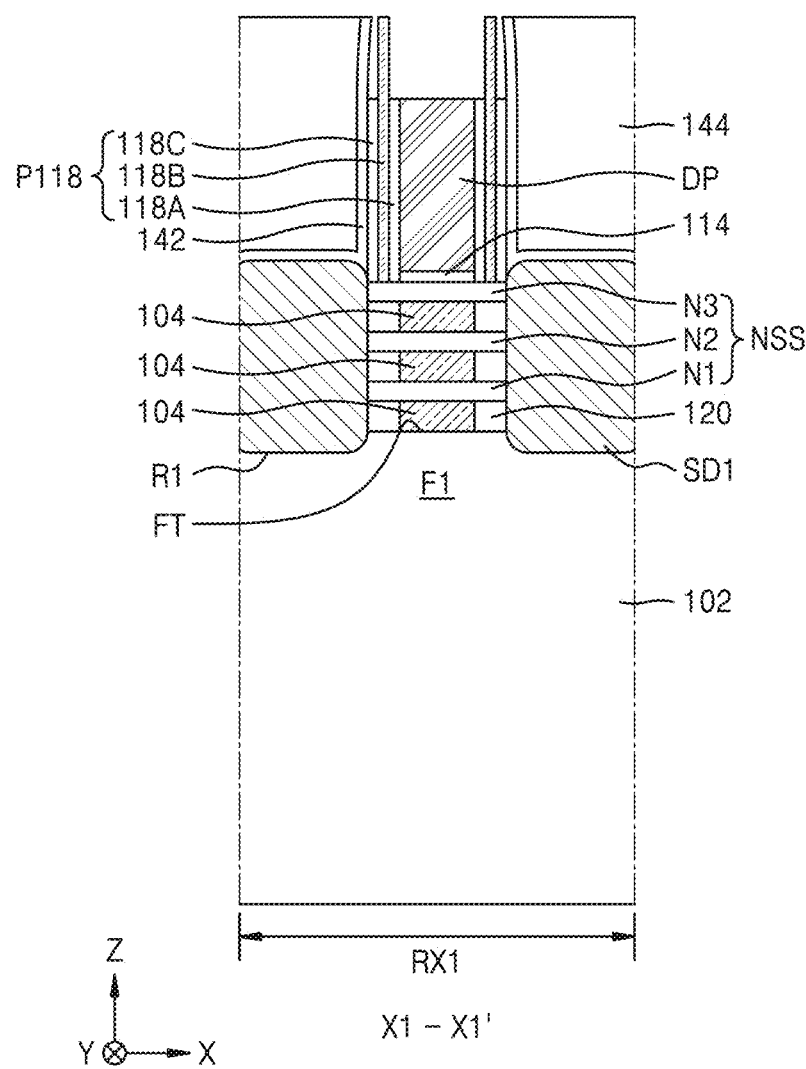
Figure 13B:
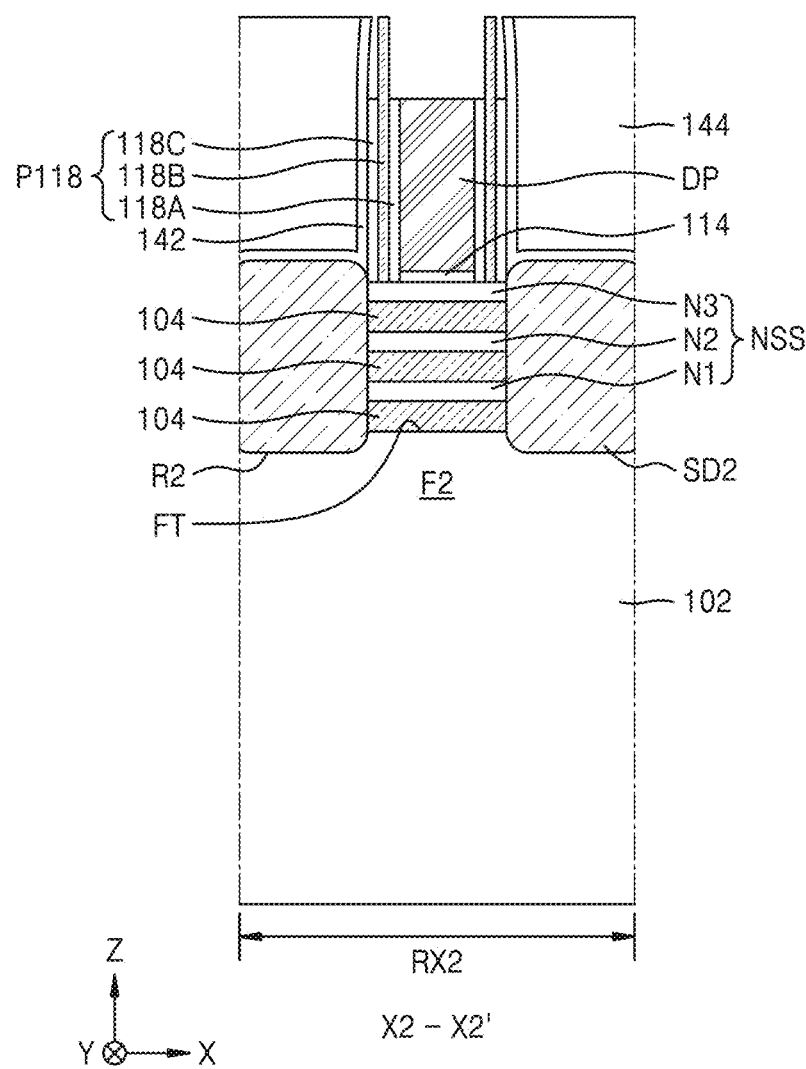
Figure 13C:
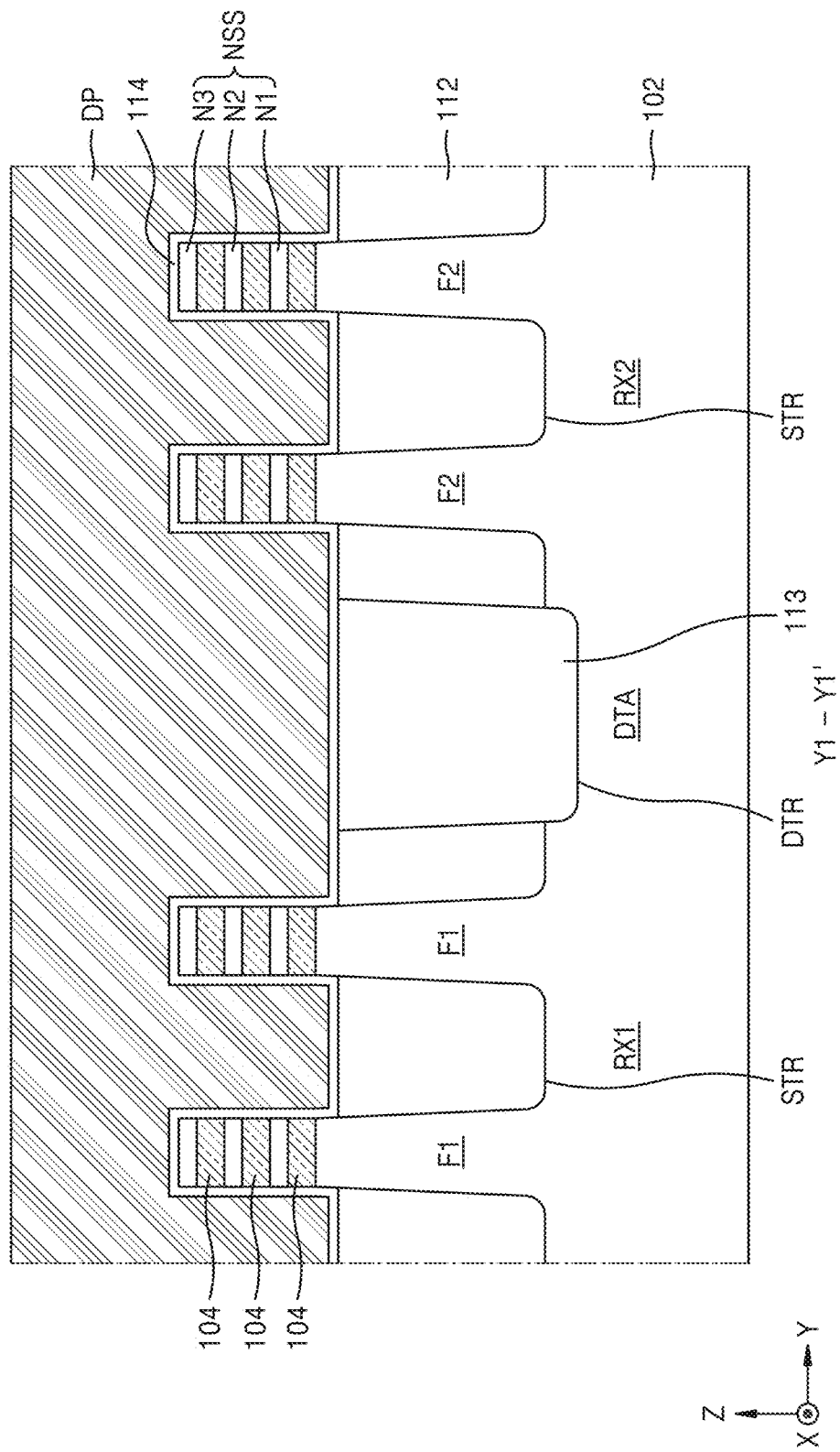
Figure 14A:
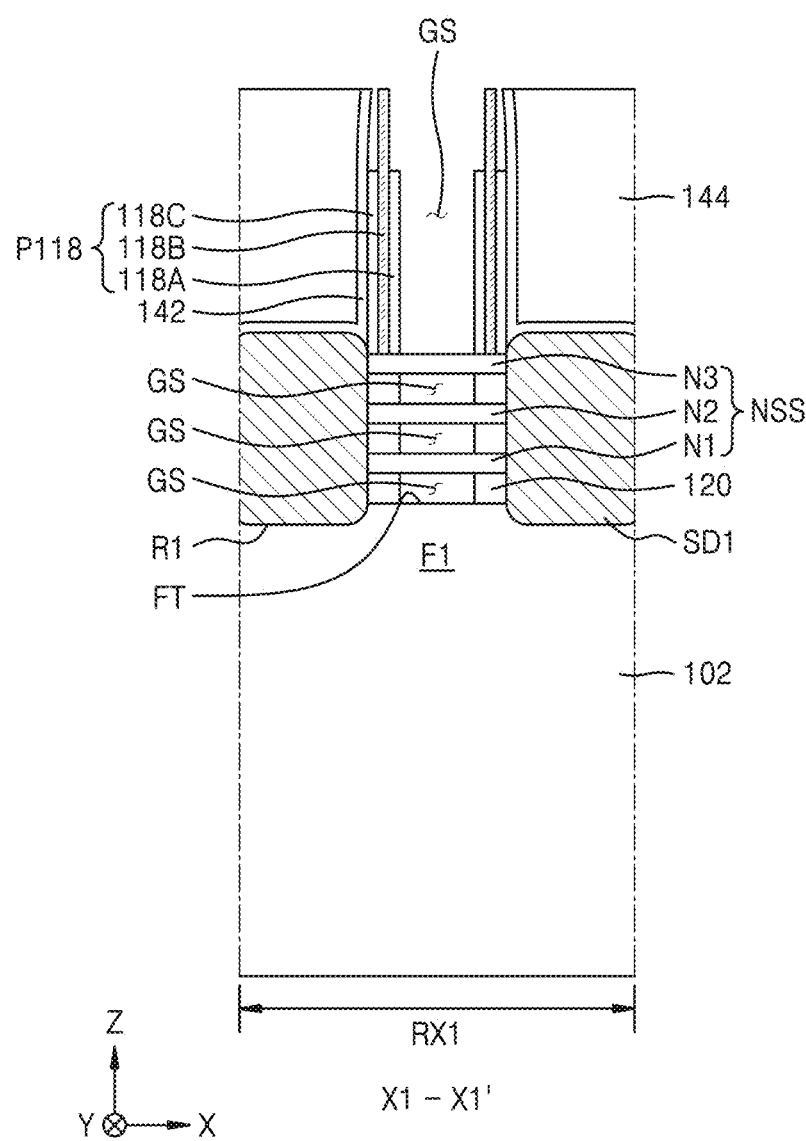
Figure 14B:
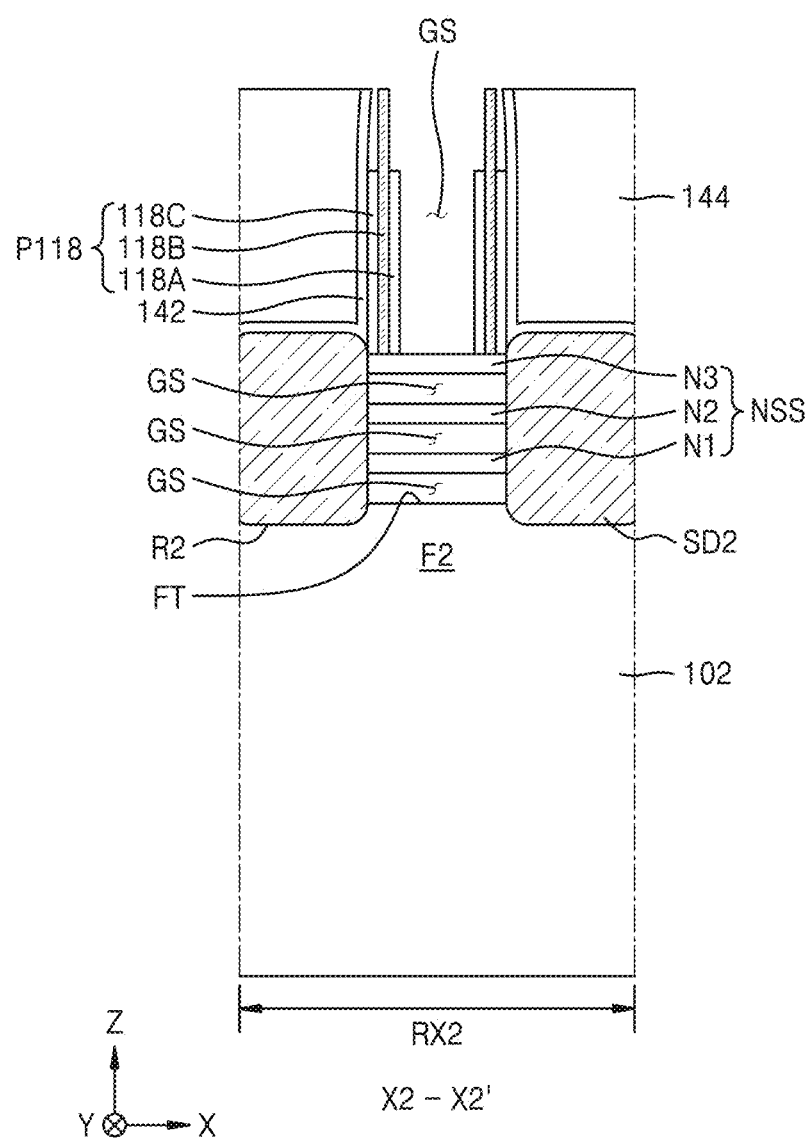
Figure 14C:
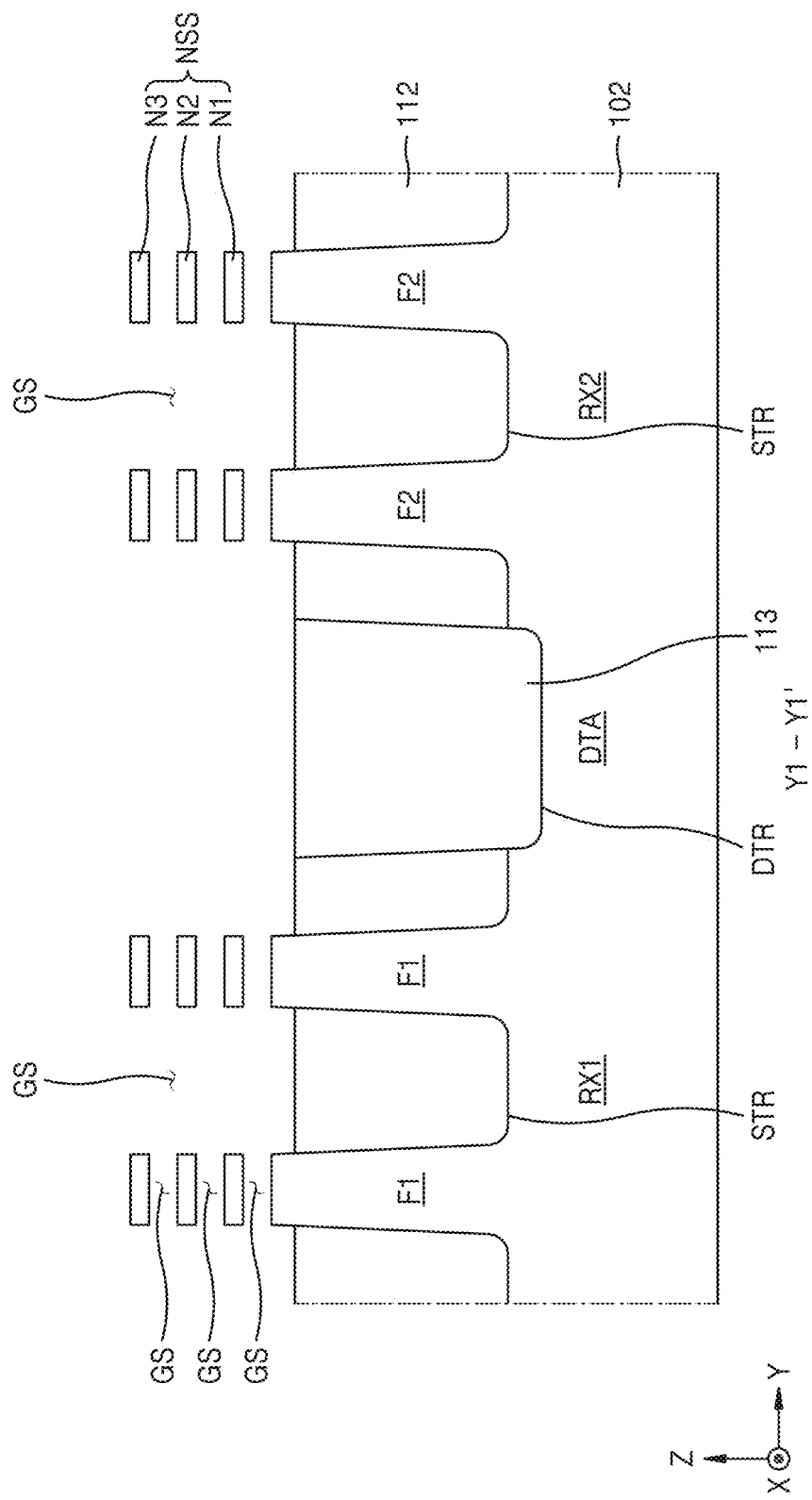
Figure 14D:
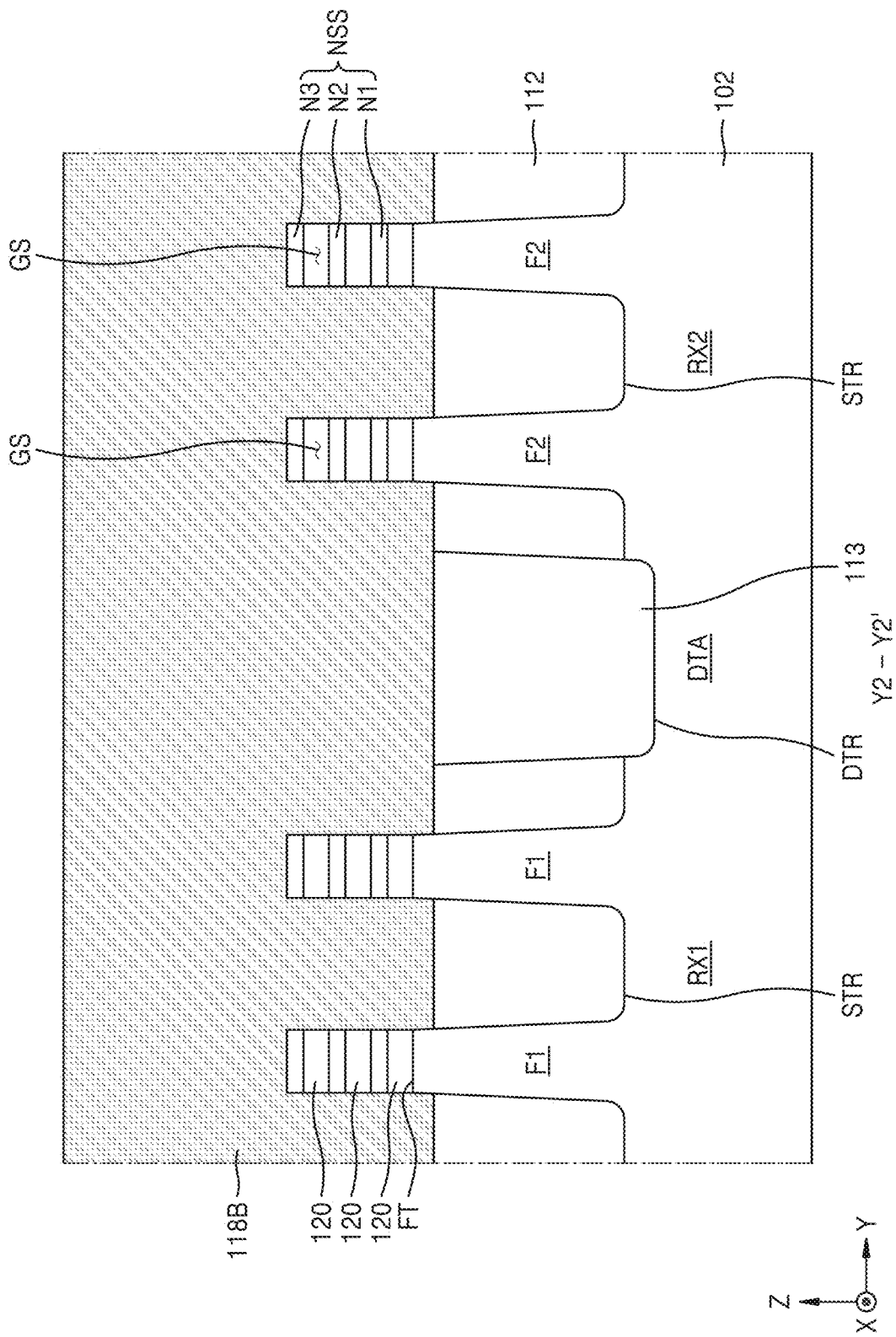
Figure 15A:
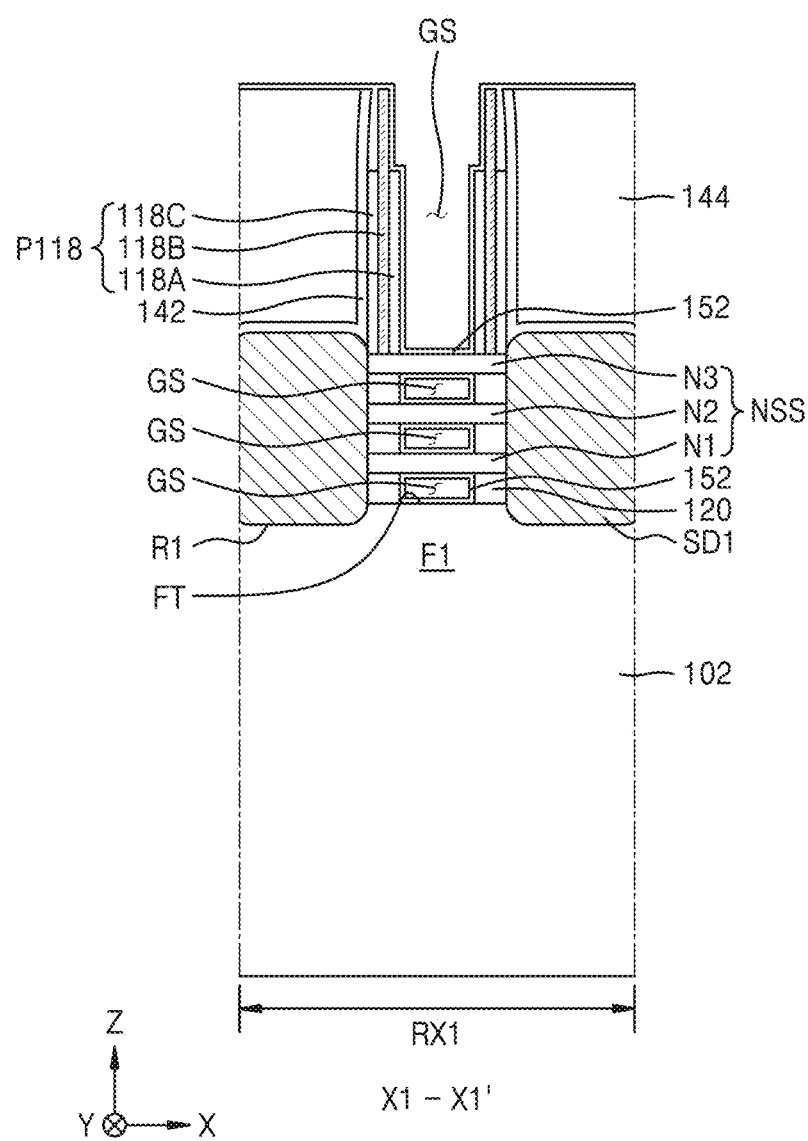
Figure 15B:
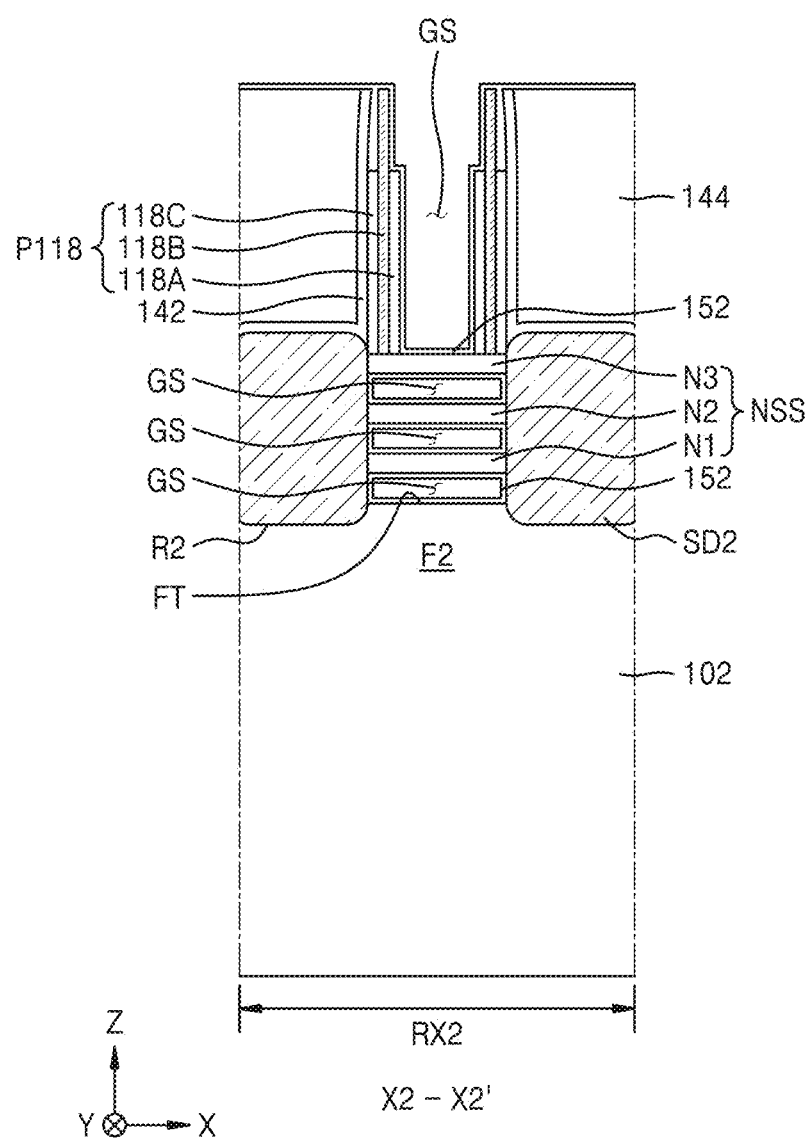
Figure 15C:
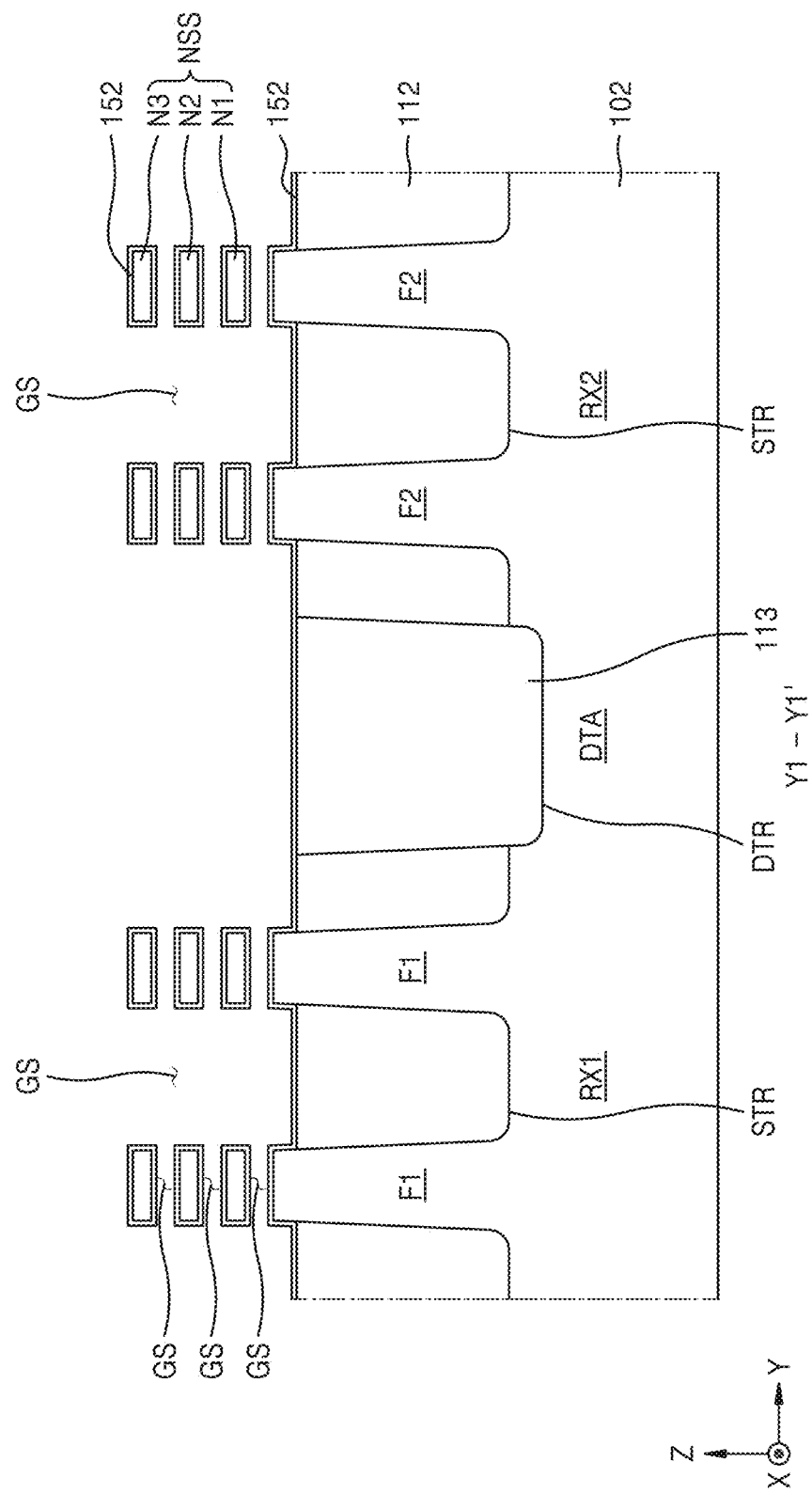
Figure 15D:
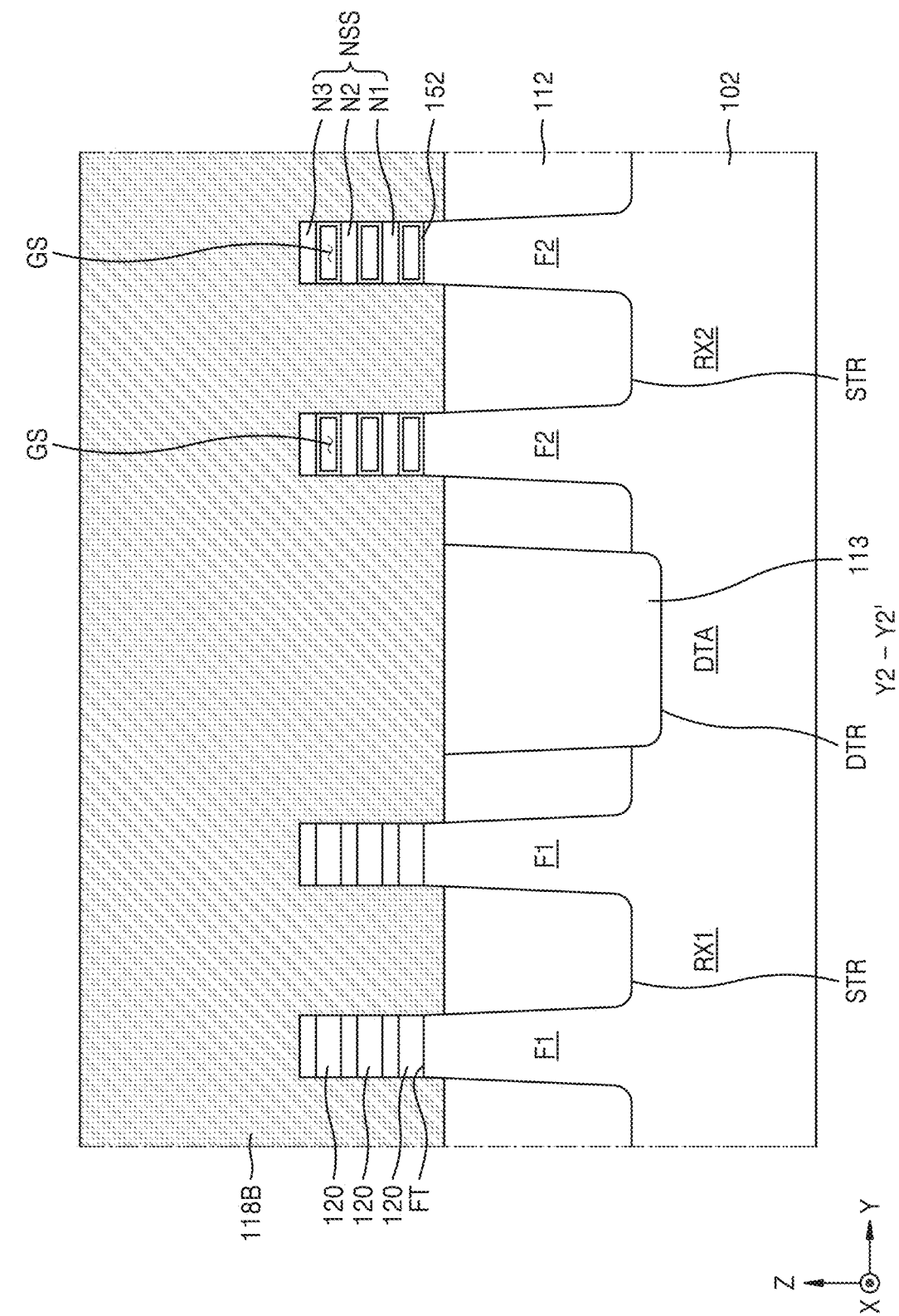
Figure 16A:
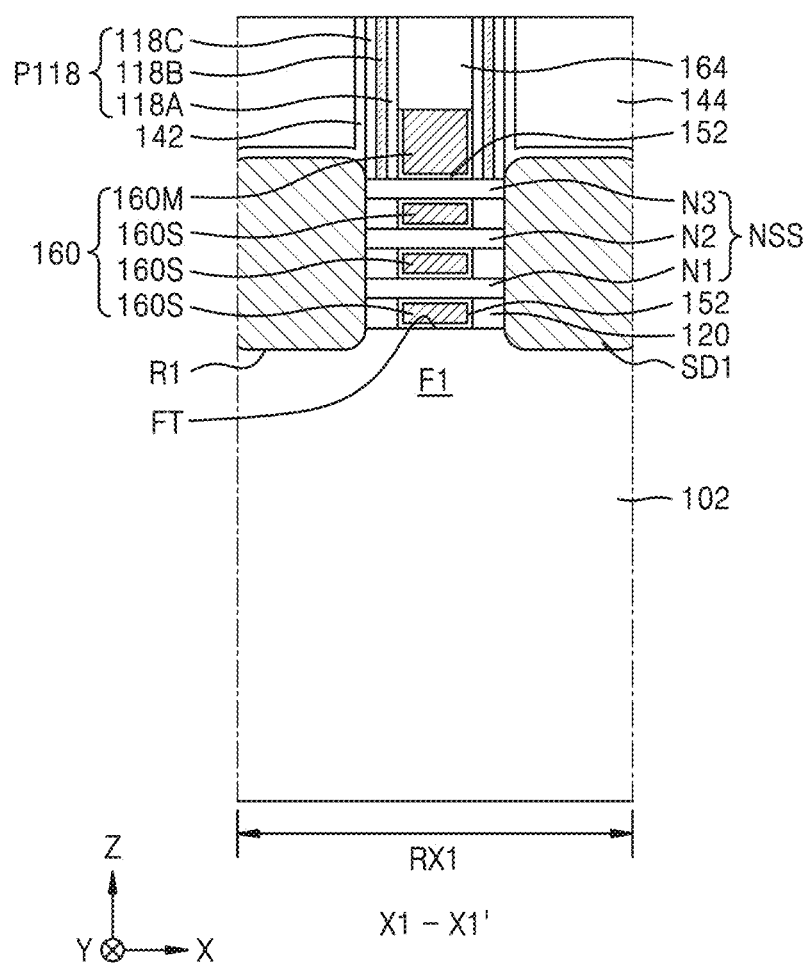
Figure 16B:
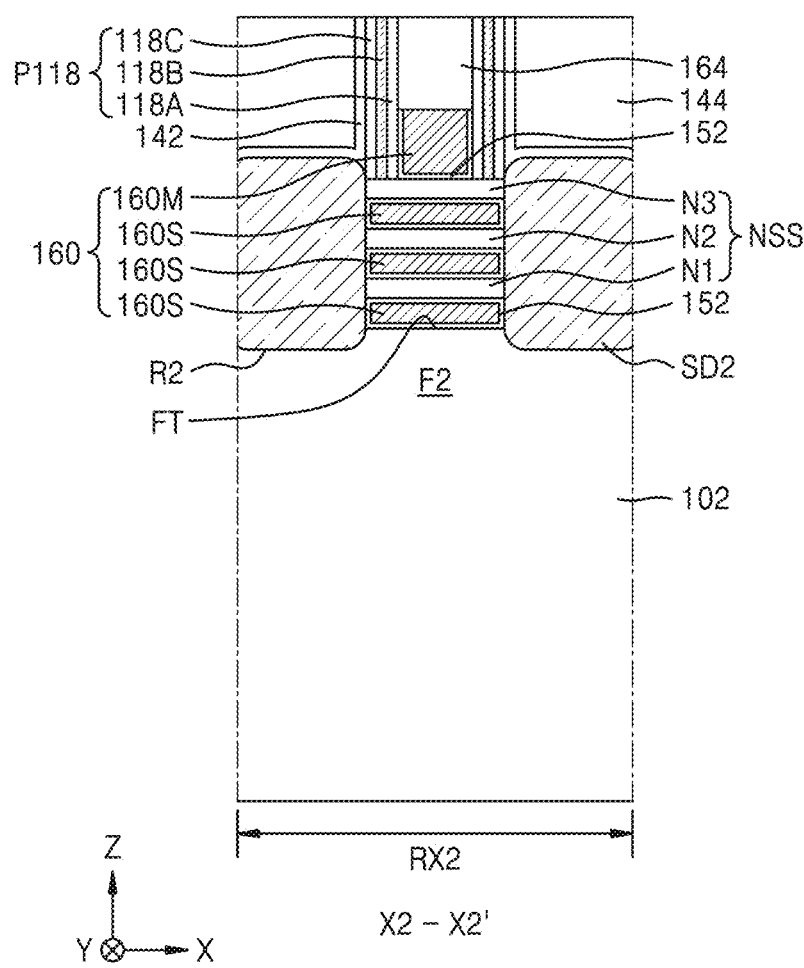
Figure 16C:
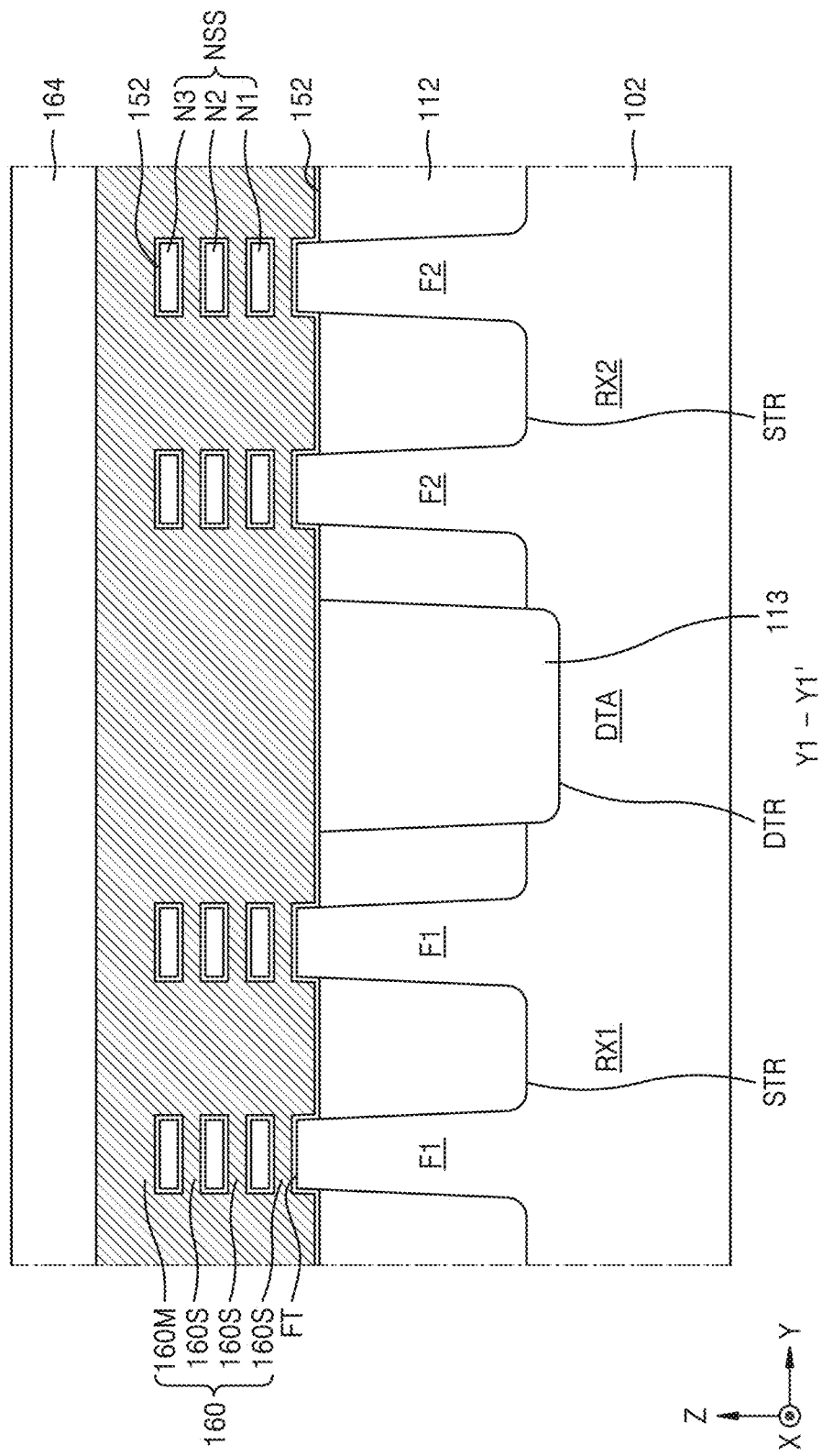
Figure 16D:
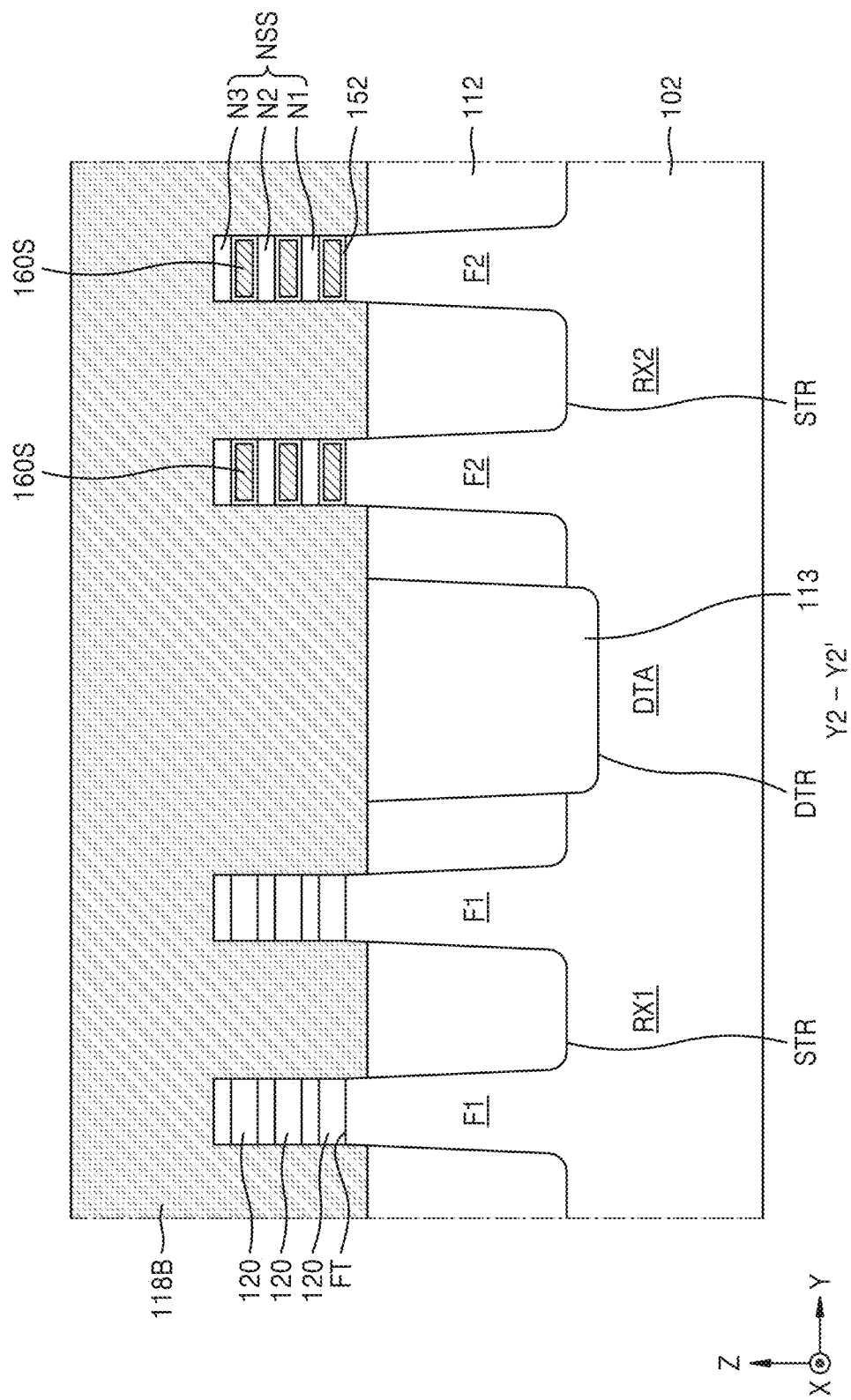

Referring to FIGS. 13A to 13C, the upper surface of the dummy gate pattern DP may be exposed by removing the dummy capping pattern DC from the results of FIGS. 12A to 12D.

When the material of the dummy capping pattern DC is the same as or similar to the material of each of the inner insulating liner 118A and the outer insulating liner 118C, while removing the dummy capping pattern DC, some areas of the upper side of each of the inner insulating liner 118A and the outer insulating liner 118C are removed together so that the upper surface level of each of the inner insulating liner 118A and the outer insulating liner 118C may be lower than the upper surface level of the sacrificial liner 118B.

Referring to FIGS. 14A to 14D, by selectively removing the dummy gate pattern DP and the insulating liner 114 from the result of FIGS. 13A to 13C, a gate space GS may be provided on each of the plurality of nanosheet stacks NSS, the device isolation film 112, and the inter-device isolation insulating film 113, and by selectively removing the plurality of sacrificial semiconductor layers 104 remaining on the plurality of fin-type active areas F1 and F2 through the gate space GS, the gate space GS may be extended to a space between each of the plurality of nanosheets N1, N2, and N3 and a space between the lowermost nanosheet Ni and the fin upper surface FT.

When viewed from the X-Y plane, the preliminary spacer structure P118 may define the gate space GS in a closed loop shape. The inner insulating liner 118A constituting the preliminary spacer structure P118 may be exposed through the gate space GS.

In some example embodiments, in order to selectively remove the plurality of sacrificial semiconductor layers 104, a difference in etch selectivity between the plurality of nanosheets N1, N2, and N3 and the plurality of sacrificial semiconductor layers 104 may be used. A wet or dry etching process may be used to selectively remove the plurality of sacrificial semiconductor layers 104.

Referring to FIGS. 15A to 15D, by forming a high dielectric film on the result of FIGS. 14A to 14D, in the gate space GS, a gate dielectric film 152 may be formed to cover the exposed surfaces of each of the plurality of nanosheets N1, N2, and N3 and the plurality of fin-type active areas F1 and F2.

Referring to FIGS. 16A to 16D, after forming a conductive layer covering the gate dielectric film 152 and filling the gate space GS in the results of FIGS. 15A to 15D, the conductive layer and the gate dielectric film 152 may be etched back so that the conductive layer and the gate dielectric film 152 fill only a partial area of the gate space GS. As a result, the gate line 160 covering the gate dielectric film 152 may be formed in the gate space GS. Thereafter, a capping insulating pattern 164 filling the gate space GS may be formed on the gate line 160.

Figure 17A:
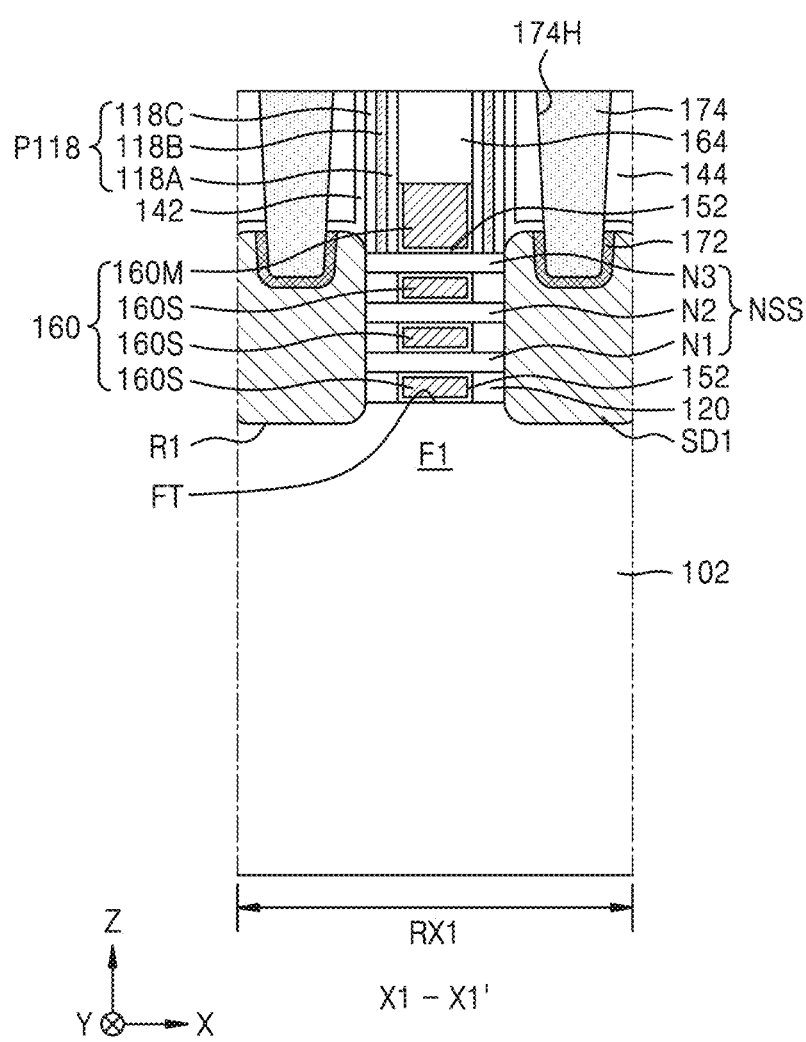
Figure 17B:
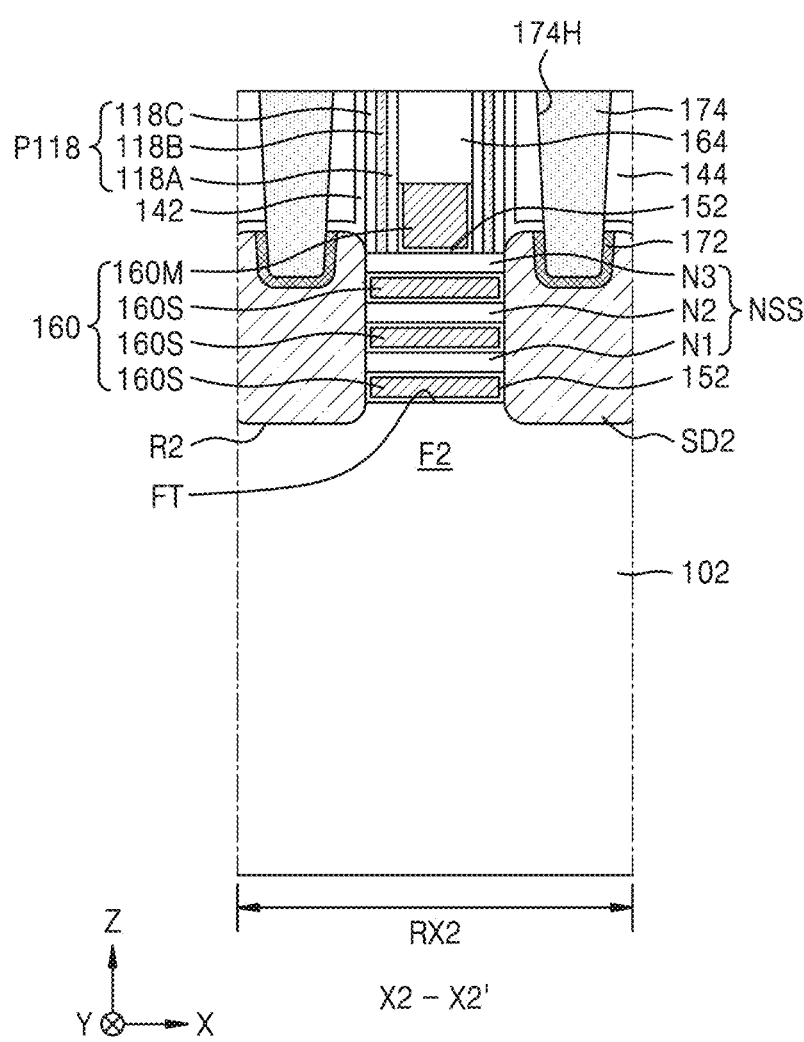
Figure 17C:
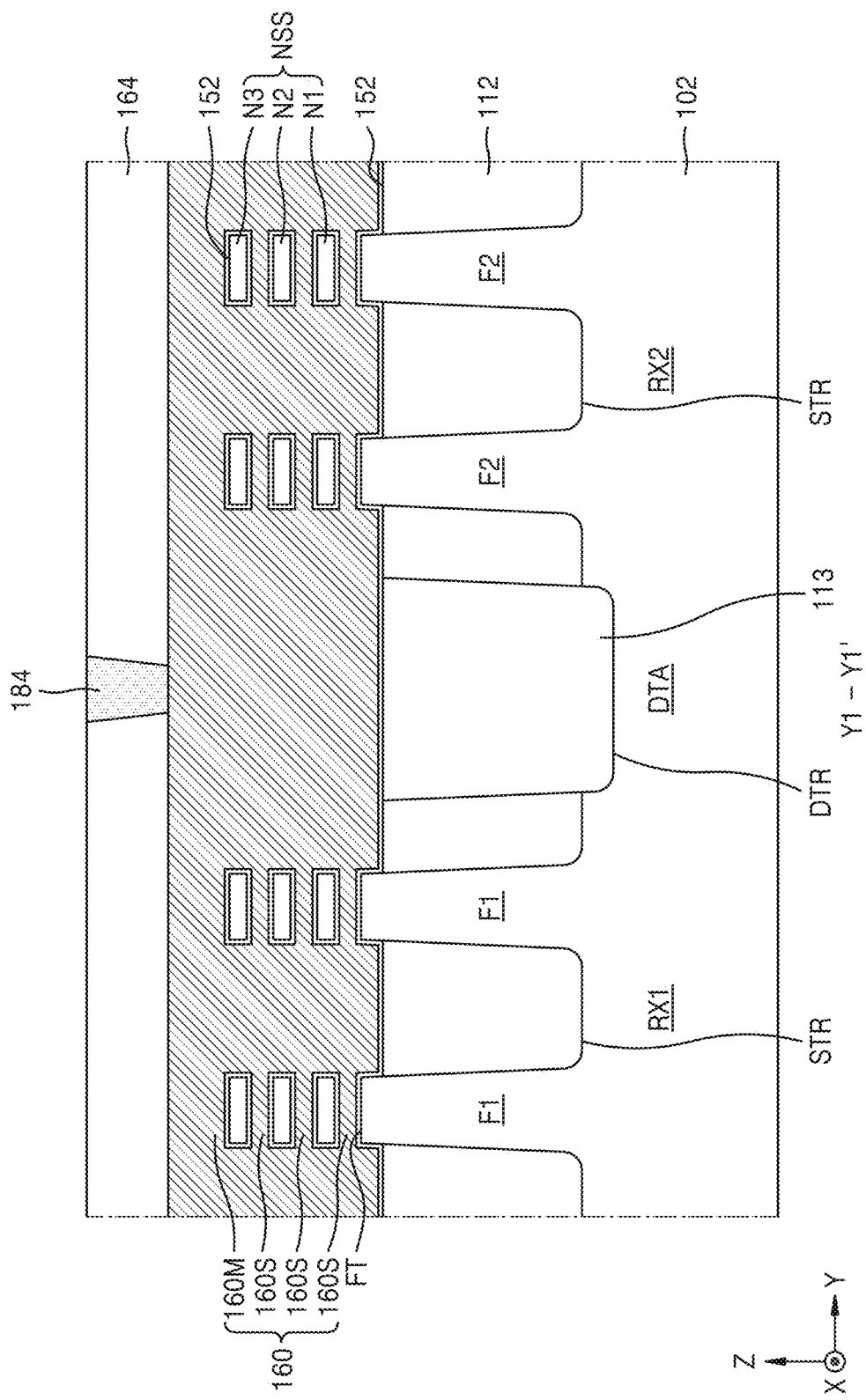

Referring to FIGS. 17A to 17C, in each of the first device area RX1 and the second device area RX2, after forming a plurality of source/drain contact holes 174H exposing the plurality of first and second source/drain regions SD1 and SD2 by penetrating the inter-gate insulating film 144 and the insulating liner 142 in the vertical direction (Z direction), a plurality of metal silicide films 172 covering the first and second source/drain regions SD1 and SD2 under the plurality of source/drain contact holes 174H and a plurality of source/drain contacts 174 filling the plurality of source/drain contact holes 174H may be formed. Further, a gate contact 184 connected to the gate line 160 may be formed by penetrating the capping insulating pattern 164 in a vertical direction (Z direction). The plurality of source/drain contacts 174 in the first device area RX1 and the second device area RX2 may be formed to face the gate line 160 in a first horizontal direction (X direction).

Referring to FIGS. 18A to 18D, the air spacer AS1 may be formed by selectively removing the sacrificial liner 118B from the results of FIGS. 17A to 17C. An isotropic dry etching process may be used to selectively remove the sacrificial liner 118B, but is not limited thereto.

Figure 18A:
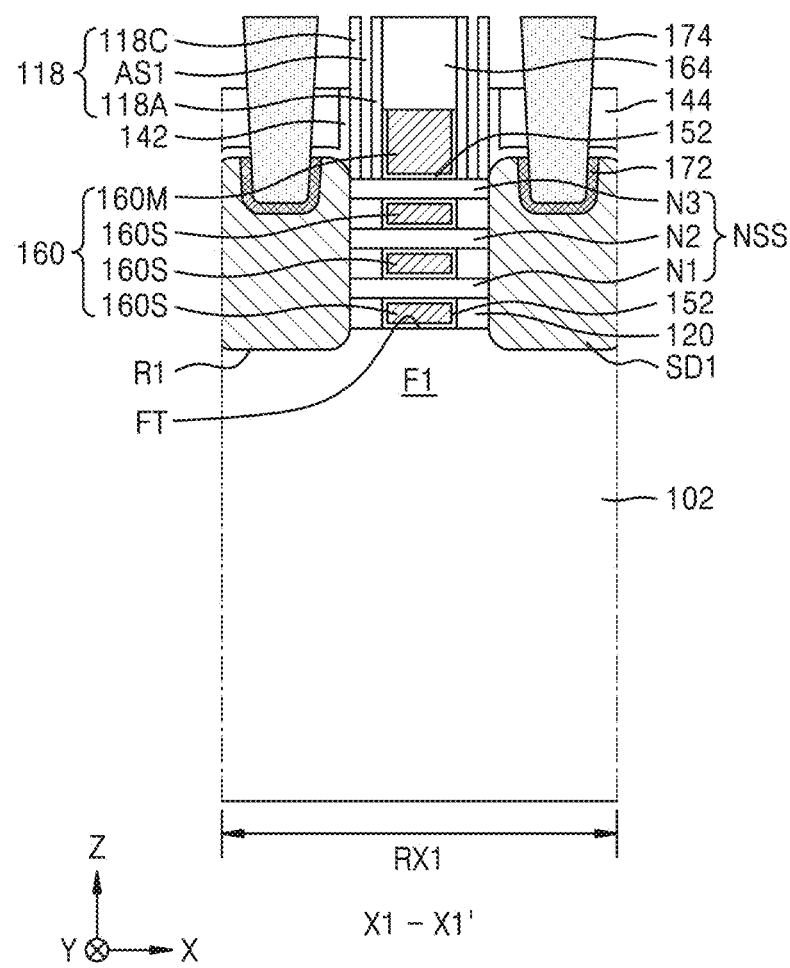
Figure 18B:
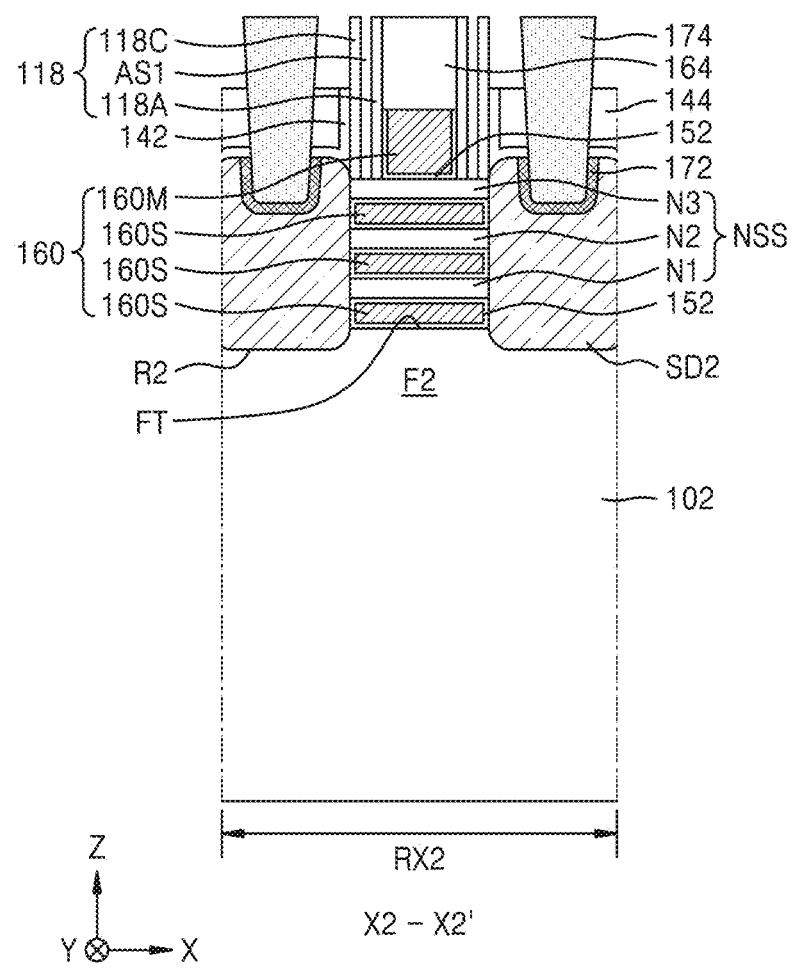
Figure 18C:
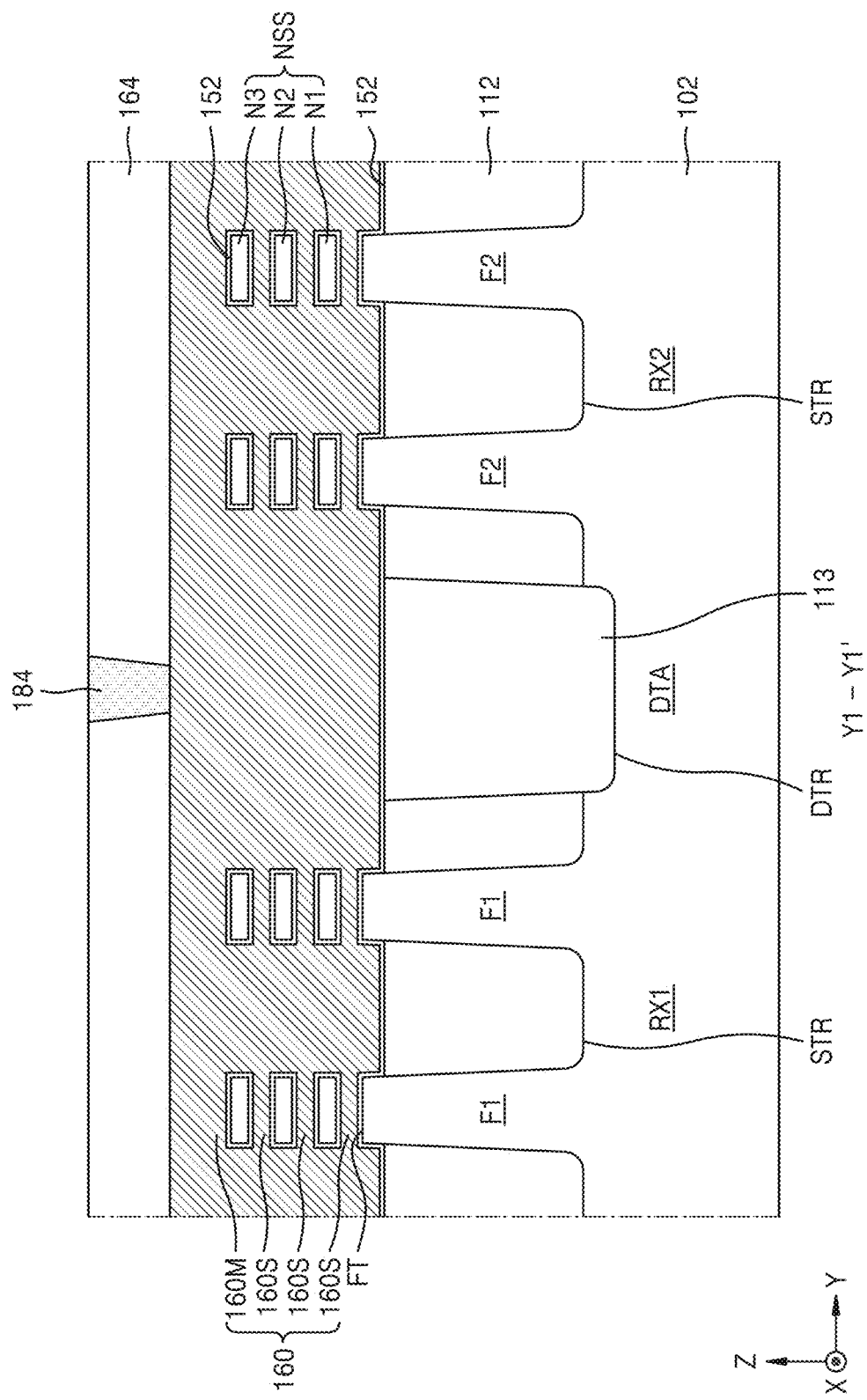
Figure 18D:
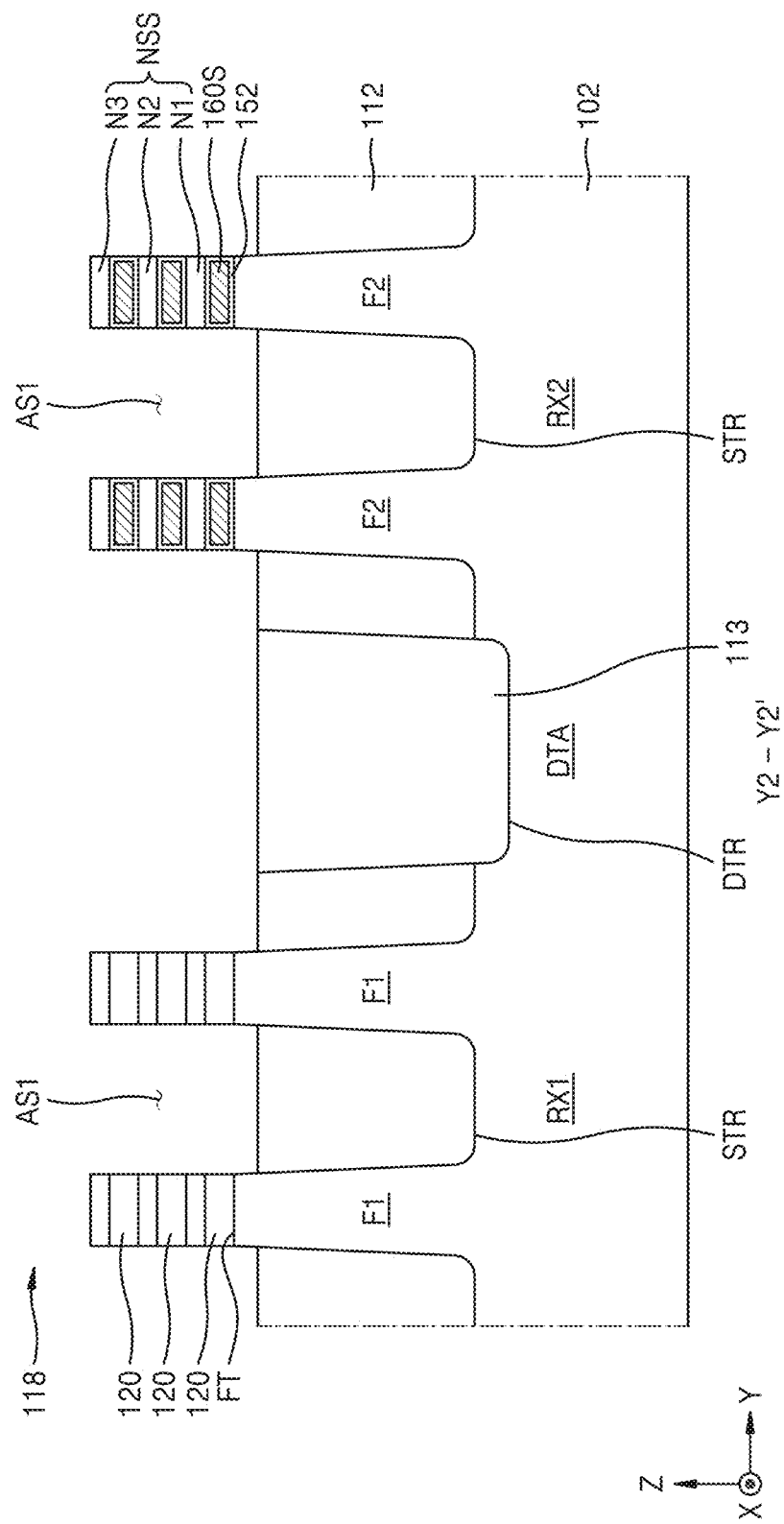
Figure 19A:
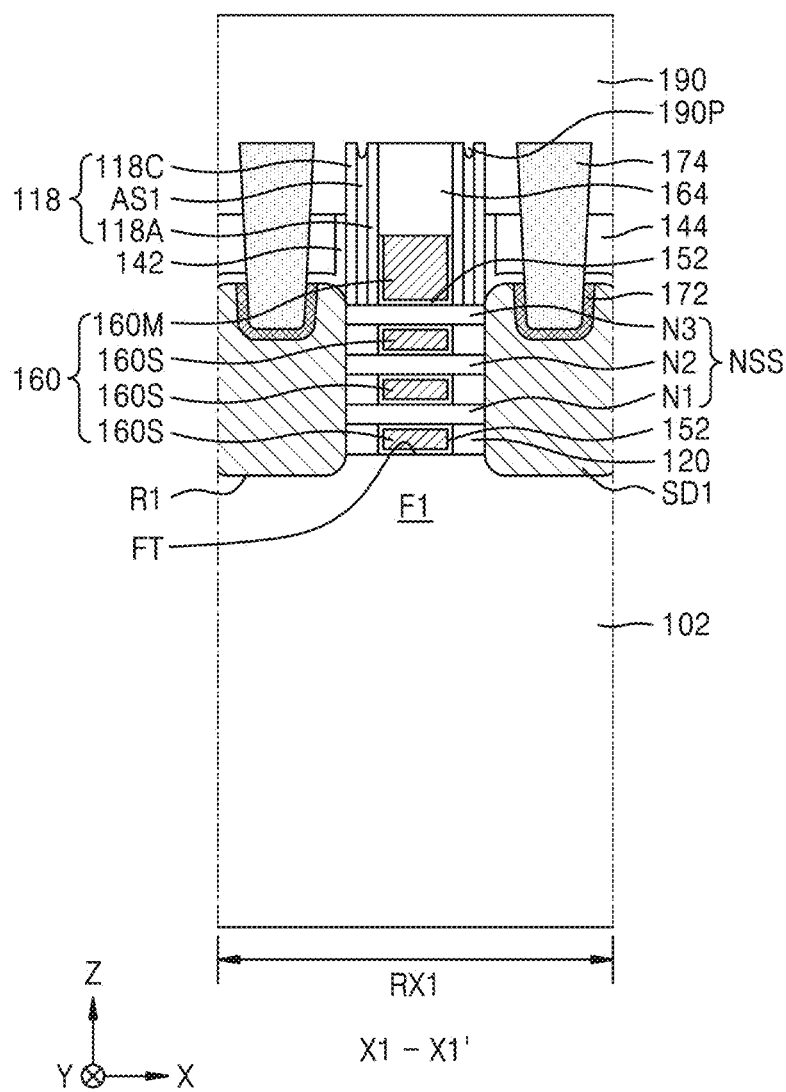
Figure 19B:
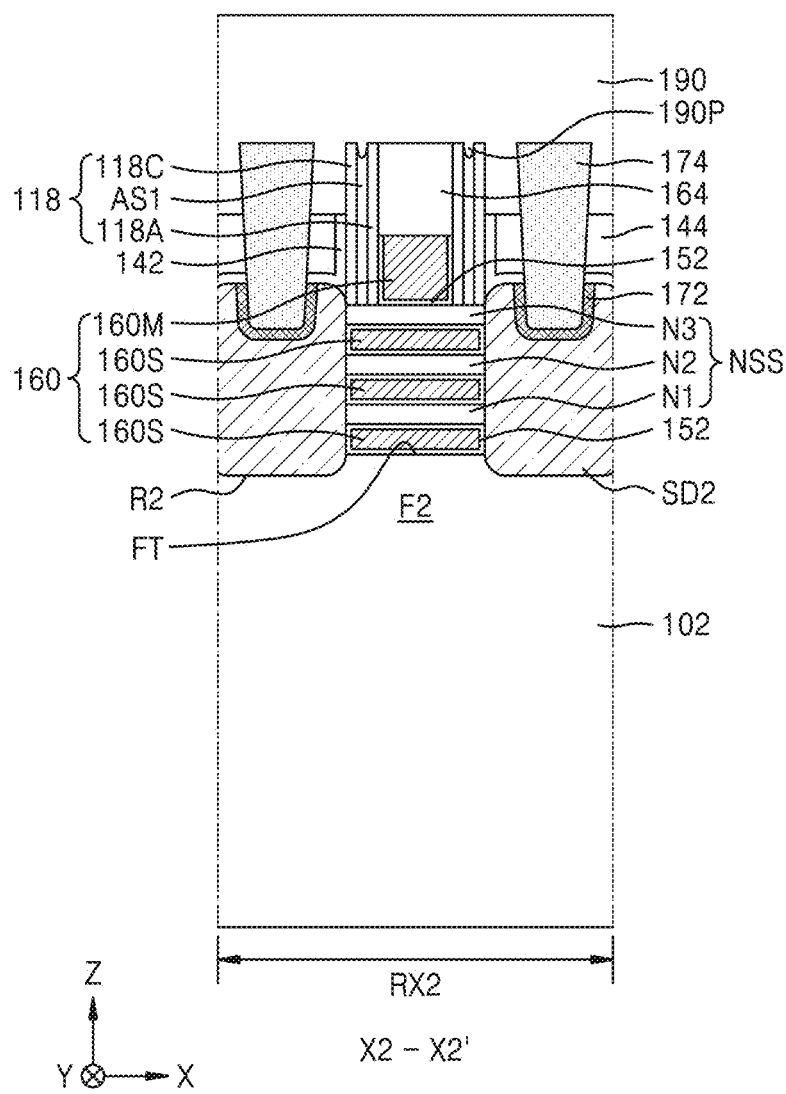
Figure 19C:
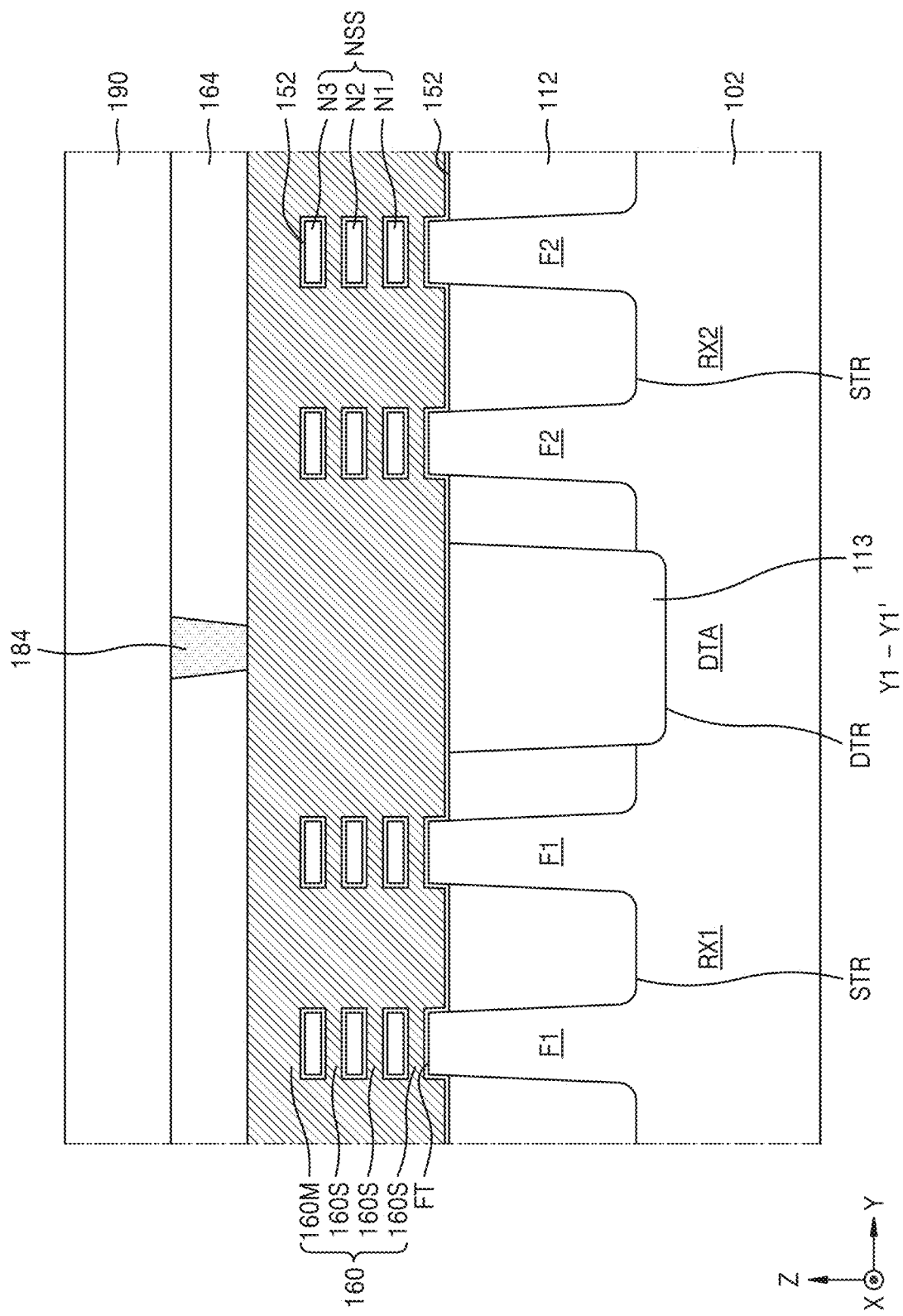
Figure 19D:
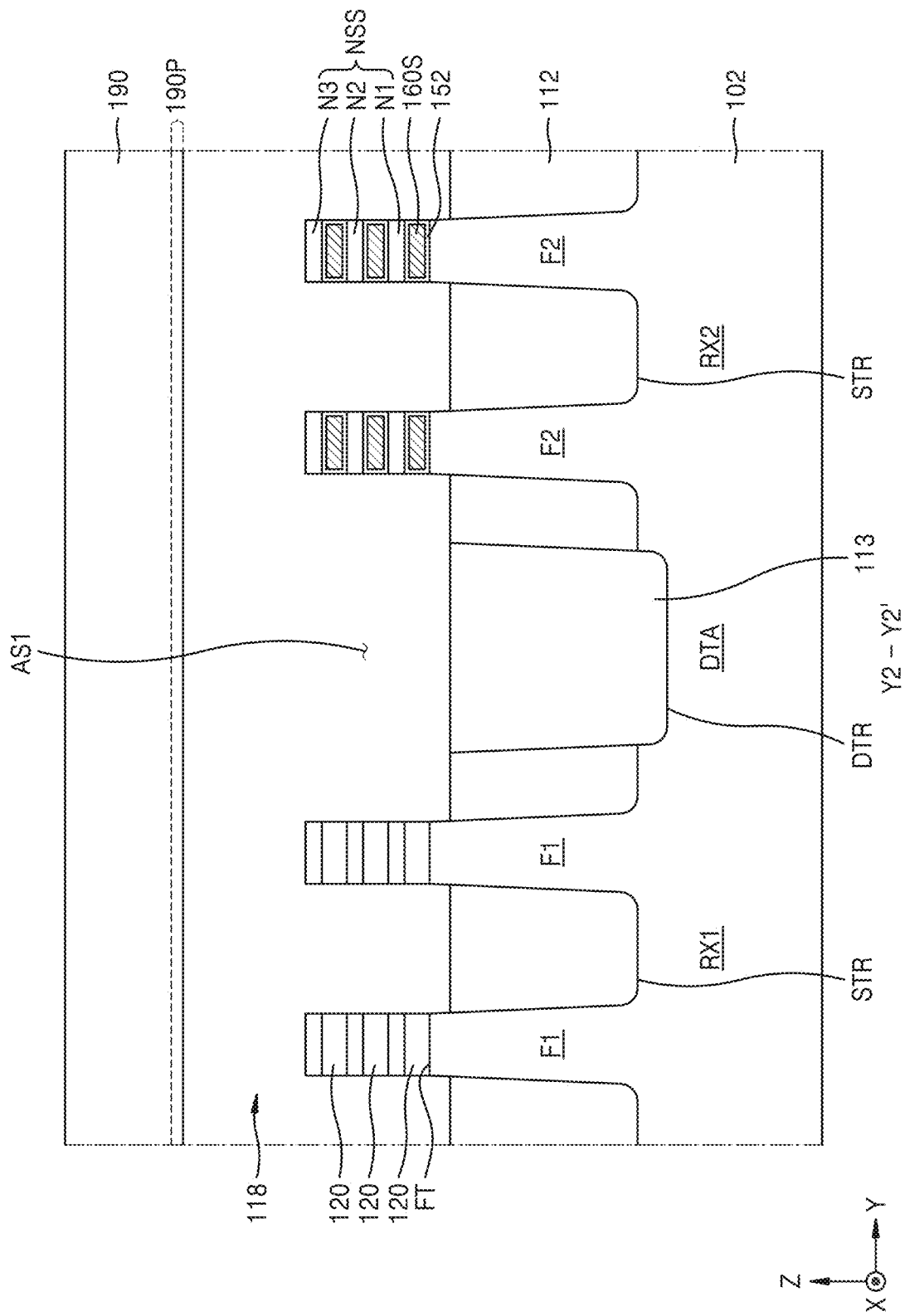

As illustrated in FIG. 18D, the air spacer AS1 may be formed to extend continuously over the first device area RX1, the inter-device isolation area DTA, and the second device area RX2.

In some example embodiments, when the insulating liner 142 and the inter-gate insulating film 144 are made of the same material as the constituent material of the sacrificial liner 118B or a material having a similar etch selectivity, while selectively removing sacrificial liner 118B, as illustrated in FIGS. 8A and 18B, a portion of the upper side of each of the insulating liner 142 and the inter-gate insulating film 144 may be removed together with the sacrificial liner 118B.

In some other example embodiments, the insulating liner 142 may be formed of a material different from the material of the sacrificial liner 118B or a material having a different etch selectivity. For example, the sacrificial liner 118B and the inter-gate insulating film 144 may include a silicon oxide film, and the insulating liner 142 may be made of a silicon nitride film. In this case, while selectively removing the sacrificial liner 118B, unlike those illustrated in FIGS. 18A and 18B, the insulating liner 142 is hardly removed and the shape illustrated in FIGS. 17A and 17B may be maintained.

In the first device area RX1, the air spacer AS1 may include a portion interposed between the gate line 160 and the first source/drain region SD1, and a portion exposing the plurality of nanosheets N1, N2, and N3 and the plurality of inner insulating spacers 120 on the device isolation film 112. In the second device area RX2, the air spacer AS1 may include a portion interposed between the gate line 160 and the second source/drain region SD2, and a portion exposing the plurality of nanosheets N1, N2, and N3 and the gate dielectric film 152 on the device isolation film 112.

As illustrated in FIGS. 18A and 18B, after the air spacer AS1 is formed, upper sidewalls of each of the plurality of source/drain contacts 174 may be exposed. As illustrated in FIG. 18D, after the air spacer AS1 is formed, some areas of upper surfaces of each of the device isolation film 112 and the inter-device isolation insulating film 113 may be exposed to the air spacer AS1.

Referring to FIGS. 19A to 19D, an interlayer insulating film 190 covering the result of FIGS. 18A to 18D may be formed. A CVD process may be used to form the interlayer insulating film 190.

In some example embodiments, during the deposition process to form the interlayer insulating film 190, step coverage characteristics of the insulating materials may be controlled such that insulation materials desired for the interlayer insulating film 190 may be mitigated or prevented from being deposited in the air spacer AS1 through the space between the inner insulating liner 118A and the outer insulating liner 118C. After the interlayer insulating film 190 is formed, in relation to some of the interlayer insulating film 190, a protruding insulating portion 190P filling the upper space between the inner insulating liner 118A and the outer insulating liner 118C may remain in shape. The top level of the air spacer AS1 may be limited by the protruding insulating portion 190P.

The interlayer insulating film 190 may be formed to surround the upper sidewalls of each of the plurality of source/drain contacts 174. The interlayer insulating film 190 may include a portion interposed between the upper sidewall of each of the plurality of source/drain contacts 174 and the air spacer AS1 in the first horizontal direction (X direction).

Thereafter, as illustrated in FIGS. 2A to 2C, a plurality of source/drain via contacts 192 connected to the plurality of source/drain contacts 174 through the interlayer insulating film 190, and a gate via contact 194 connected to the gate contact 184 through the interlayer insulating film 190 may be formed.

In the above, some example manufacturing methods of the integrated circuit device 100 illustrated in FIGS. 1 and 2A to 2D have been described with reference to FIGS. 11A to 19D, but various modifications and changes are made within the scope of the inventive concepts, Thus, it will be apparent to those skilled in the art that various structures modified and changed from the integrated circuit device 200, 300, 400, 400A, 500, 600, 700, 800A, 800B, 800C described in FIGS. 3A to 10C, may be manufactured.

In some example embodiments, in order to manufacture the integrated circuit device 200 illustrated with reference to FIGS. 3A and 3B, the processes described with reference to FIGS. 11A to 19D may be performed. However, while performing the processes described with reference to FIGS. 12A to 12D, instead of forming a plurality of first and second recesses R1 and R2, first and second recesses R21 and R22 having the shape illustrated in FIGS. 3A and 3B may be formed. In order to form the first and second recesses R21 and R22 of the shape illustrated in FIGS. 3A and 3B, when selectively etching a portion of each of the plurality of sacrificial semiconductor layers 104 and the plurality of nanosheet semiconductor layers NS, etching conditions such as an etch selectivity may be appropriately controlled.

In other example embodiments, in order to manufacture the integrated circuit device 300 illustrated in FIG. 4, the processes described with reference to FIGS. 11A to 19D may be performed. However, in the process of selectively removing the sacrificial liner 118B from the results of FIGS. 17A to 17C as described with reference to FIGS. 18A to 18D, only a portion of the sacrificial liner 118B may be removed so that some areas of the sacrificial liner 118B adjacent to the device isolation film 112 and the inter-device isolation insulating film 113 remain. As a result, the remaining areas of the sacrificial liner 118B may remain in the form of the bottom insulating spacer 318R illustrated in FIG. 4.

In yet other example embodiments, in order to manufacture the integrated circuit devices 800A, 800B, and 800C illustrated in FIGS. 10A to 10C, it is possible to include steps of sequentially forming a plurality of circuit areas CCA on the device isolation film 812 formed on the substrate 102 by performing the processes described with reference to FIGS. 11A to 19D. The processes described with reference to FIGS. 11A to 19D may be repeatedly performed depending on the number of stacked circuit areas CCAs to be formed on the substrate 102.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:
a fin-type active area extending in a first horizontal direction on a substrate;
a channel area on the fin-type active area;
a gate line surrounding the channel area on the fin-type active area and extending in a second horizontal direction crossing the first horizontal direction; and
an insulating spacer structure covering gate sidewalls of the gate line and channel sidewalls of the channel area,
wherein the insulating spacer structure comprises an air spacer having a first portion facing the gate sidewalls in the first horizontal direction and a second portion facing the channel sidewalls in the second horizontal direction, and
wherein a top surface of the channel area is exposed to the air spacer.

2. The integrated circuit device of claim 1, wherein the top surface and the channel sidewalls of the channel area each comprise a portion exposed to the air spacer.

3. The integrated circuit device of claim 1, wherein the air spacer surrounds the gate line in a closed loop shape and faces the gate sidewalls in the first horizontal direction and the second horizontal direction.

4. The integrated circuit device of claim 1, further comprising:
a device isolation film between the substrate and the gate line and covering a sidewall of the fin-type active area, wherein an upper surface of the device isolation film is exposed to the air spacer.

5. The integrated circuit device of claim 1, further comprising:
a device isolation film between the substrate and the gate line and covering a sidewall of the fin-type active area, wherein the insulating spacer structure further comprises,
an inner insulating liner facing the gate sidewalls,
an outer insulating liner spaced apart from the inner insulating liner with the air spacer therebetween, and
a bottom insulating spacer between the inner insulating liner and the outer insulating liner and having a first surface in contact with the device isolation film and a second surface exposed to the air spacer.

6. The integrated circuit device of claim 1, wherein the insulating spacer structure further comprises:
an inner insulating liner in contact with the channel area;
an outer insulating liner spaced apart from the inner insulating liner with the air spacer therebetween and in contact with the channel area; and
a bottom insulating spacer between the inner insulating liner and the outer insulating liner and having a first surface exposed to the air spacer and a second surface in contact with the channel area.

7. The integrated circuit device of claim 1, wherein
the channel area comprises a nanosheet channel area including a plurality of nanosheets, the plurality of nanosheets facing a fin upper surface of the fin-type active area, the plurality of nanosheets being at positions spaced apart from the fin upper surface in a vertical direction, respectively, and the plurality of nanosheets having different vertical distances from the fin upper surface, respectively, and
at least one of the plurality of nanosheets has a sidewall exposed to the air spacer.

8. The integrated circuit device of claim 1, further comprising:
a nanosheet constituting a part of the channel area and facing a fin upper surface of the fin-type active area, the nanosheet being at a position spaced apart from the fin upper surface in a vertical direction; and
an inner insulating spacer between the fin upper surface and the nanosheet in the vertical direction,
wherein each of the nanosheet and the inner insulating spacer has a surface exposed to the air spacer.

9. The integrated circuit device of claim 1, further comprising:
a nanosheet constituting a part of the channel area and facing a fin upper surface of the fin-type active area, the nanosheet being at a position spaced apart from the fin upper surface in a vertical direction; and
a gate dielectric film including a portion between the fin upper surface and the nanosheet in the vertical direction and in contact with the gate line,
wherein each of the nanosheet and the gate dielectric film has a surface exposed to the air spacer.

10. The integrated circuit device of claim 1, wherein
the channel area comprises a fin channel area integrally connected to the fin-type active area, and
the fin channel area has a top surface and a sidewall exposed to the air spacer.

11. An integrated circuit device comprising:
a first fin-type active area extending in a first horizontal direction in a first area on a substrate, the first fin-type active area having a first fin upper surface;
a first nanosheet stack including a plurality of first nanosheets, the plurality of first nanosheets facing the first fin upper surface, the plurality of first nanosheets being at positions spaced apart from the first fin upper surface, respectively, in a vertical direction, and the plurality of first nanosheets having different vertical distances from the first fin upper surface, respectively;
a first gate line surrounding the plurality of first nanosheets on the first fin-type active area and extending in a second horizontal direction crossing the first horizontal direction in the first area; and
a first insulating spacer structure covering the first gate line and the first nanosheet stack, wherein the first insulating spacer structure comprises a first air spacer having a first portion facing a gate sidewall of the first gate line in the first horizontal direction and a second portion facing a sidewall of the first nanosheet stack in the second horizontal direction, and wherein a top surface of the first nanosheet stack and a sidewall of at least one first nanosheet among the plurality of first nanosheets are exposed to the first air spacer.

12. The integrated circuit device of claim 11, further comprising:
a second fin-type active area extending in the first horizontal direction in a second area on the substrate, the second fin-type active area having a second fin upper surface;
a second nanosheet stack including a plurality of second nanosheets, the plurality of second nanosheets facing the second fin upper surface at positions spaced apart from the second fin upper surface in the vertical direction, respectively, and the plurality of second nanosheets having different vertical distances from the second fin upper surface, respectively;
a second gate line surrounding the plurality of second nanosheets on the second fin-type active area and extending in the second horizontal direction in the second area; and
a second insulating spacer structure covering the second gate line and the second nanosheet stack,
wherein the second insulating spacer structure includes at least one silicon-containing insulating film and does not include an air spacer.

13. The integrated circuit device of claim 11, further comprising:
a second fin-type active area extending in the first horizontal direction in a second area on the substrate;
a channel area on the second fin-type active area and integrally connected to the second fin-type active area;
a second gate line covering the channel area on the second fin-type active area and extending in the second horizontal direction in the second area; and
a second insulating spacer structure covering the second gate line and the channel area,
wherein the second insulating spacer structure comprises a second air spacer having a third portion facing a sidewall of the second gate line in the first horizontal direction and a fourth portion facing a sidewall of the channel area in the second horizontal direction.

14. The integrated circuit device of claim 11, further comprising:
a device isolation film between the substrate and the first gate line and covering a sidewall of the first fin-type active area,
wherein an upper surface of the device isolation film is exposed to the first air spacer.

15. The integrated circuit device of claim 11, further comprising:
a device isolation film between the substrate and the first gate line and covering a sidewall of the first fin-type active area, wherein the first insulating spacer structure further comprises,
an inner insulating liner facing the gate sidewall,
an outer insulating liner spaced apart from the inner insulating liner with the first air spacer therebetween, and
a bottom insulating spacer between the inner insulating liner and the outer insulating liner and having a first surface in contact with the device isolation film and a second surface exposed to the first air spacer.

16. The integrated circuit device of claim 11, further comprising:
a plurality of inner insulating spacers between each of the plurality of first nanosheets in the vertical direction,
wherein each of the plurality of first nanosheets and the plurality of inner insulating spacers has a surface exposed to the first air spacer.

17. The integrated circuit device of claim 11, further comprising:
a gate dielectric film between each of the plurality of first nanosheets in the vertical direction, the gate dielectric film being in contact with the first gate line,
wherein each of the plurality of first nanosheets and the gate dielectric film has a surface exposed to the first air spacer.

18. An integrated circuit device comprising:
a plurality of circuit areas stacked to overlap each other in a vertical direction on a substrate, each of the plurality of circuit areas including,
a fin-type active area extending in a first horizontal direction and having a fin upper surface,
a nanosheet stack including a plurality of nanosheets, the plurality of nanosheets facing the fin upper surface, the plurality of nanosheets being at positions spaced apart from the fin upper surface in the vertical direction, respectively,
a gate line surrounding the plurality of nanosheets on the fin-type active area and extending in a second horizontal direction crossing the first horizontal direction,
an insulating spacer structure covering the gate line and the nanosheet stack, and
the insulating spacer structure comprising an air spacer having a first portion facing a gate sidewall of the gate line in the first horizontal direction and a second portion facing a sidewall of the nanosheet stack in the second horizontal direction,
wherein a top surface of the nanosheet stack and a sidewall of at least one nanosheet among the plurality of nanosheets are exposed to the air spacer.

19. The integrated circuit device of claim 18, wherein the gate line included in a first circuit area from among the plurality of circuit areas and the gate line included in a second circuit area from among the plurality of circuit areas that is adjacent to the first circuit area in the vertical direction are spaced apart from each other in the vertical direction with an insulating structure therebetween.

* * * * *